(12) United States Patent
Kato et al.

(10) Patent No.: US 10,319,912 B2
(45) Date of Patent: Jun. 11, 2019

(54) CHARGE-TRANSPORTING MATERIAL AND ORGANIC LIGHT-EMITTING DEVICE INCLUDING THE SAME

(71) Applicant: Samsung Electronics Co., Ltd., Suwon-si, Gyeonggi-do (KR)

(72) Inventors: Fumiaki Kato, Kanagawa (JP); Satoshi Inayama, Kanagawa (JP); Masaki Numata, Kanagawa (JP)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 501 days.

(21) Appl. No.: 15/008,623

(22) Filed: Jan. 28, 2016

(65) Prior Publication Data

US 2016/0225998 A1    Aug. 4, 2016

(30) Foreign Application Priority Data

Jan. 29, 2015  (JP) .................................. 2015-016007
Jan. 29, 2015  (JP) .................................. 2015-016012
Nov. 19, 2015  (KR) ........................ 10-2015-0162842

(51) Int. Cl.
*H01L 51/00*      (2006.01)
*C08F 12/22*      (2006.01)
(Continued)

(52) U.S. Cl.
CPC .......... *H01L 51/0043* (2013.01); *C08F 12/22* (2013.01); *C08F 12/26* (2013.01);
(Continued)

(58) Field of Classification Search
None
See application file for complete search history.

(56) References Cited

U.S. PATENT DOCUMENTS 5,747,204 A    5/1998   Anzai et al.
8,562,870 B2   10/2013  McCulloch et al.
(Continued)

FOREIGN PATENT DOCUMENTS

JP       8-269183 A    10/1996
JP    2000-150169 A     5/2000
(Continued)

OTHER PUBLICATIONS

Linnberg et al., RSC Adv., 2015, 5, 83122. (Year: 2015).*
(Continued)

*Primary Examiner* — Eli S Mekhlin
(74) *Attorney, Agent, or Firm* — Cantor Colburn LLP

(57) ABSTRACT

A charge-transporting material including Structural Unit (1) represented by one of Formulae 1 and 2; and Structural Unit (2) represented by one of Formulae 3 and 4:

Formula 1

(Continued)

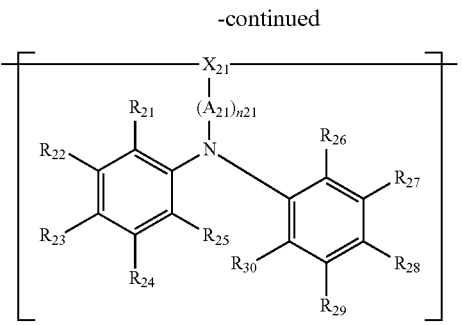

Formula 2

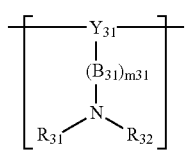

Formula 3

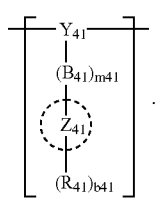

Formula 4 wherein, in Formulae 1 to 4, groups and variables are the same as described in the specification.

12 Claims, 3 Drawing Sheets

(51) Int. Cl.
*C08F 12/26* (2006.01)
*C08F 12/32* (2006.01)
*C09D 125/18* (2006.01)
*H01L 51/50* (2006.01)

(52) U.S. Cl.
CPC ............ *C08F 12/32* (2013.01); *C09D 125/18* (2013.01); *H01L 51/004* (2013.01); *C08G 2261/51* (2013.01); *H01L 51/5056* (2013.01)

(56) References Cited

U.S. PATENT DOCUMENTS

| | | | |
|---|---|---|---|
| 8,795,852 | B2 | 8/2014 | Asari et al. |
| 8,945,726 | B2 | 2/2015 | Tanaka et al. |
| 2003/0030059 | A1* | 2/2003 | Shi .............. C07D 209/86 257/79 |
| 2006/0151782 | A1 | 7/2006 | Homes et al. |
| 2007/0155928 | A1 | 7/2007 | Koyama et al. |
| 2010/0264813 | A1 | 10/2010 | Takahashi |

FOREIGN PATENT DOCUMENTS

| | | |
|---|---|---|
| JP | 2002-056982 A | 2/2002 |
| JP | 3296042 B2 | 4/2002 |
| JP | 2005-097589 A | 4/2005 |
| JP | 2010-225653 A | 10/2010 |
| JP | 2011-119308 A | 6/2011 |
| JP | 2012-146811 A | 8/2012 |
| JP | 2008-091894 A | 11/2012 |
| WO | 2010-098246 A1 | 9/2010 |

OTHER PUBLICATIONS

Neil B. McKeown et al. "The synthesis of robust, polymeric hole-transport materials from oligoarylamine substituted styrenes", J. Mater. Chem, 2007, 17, 2088-2094.

Office Action issued by the Japanese Patent Office dated Sep. 11, 2018, in the examination of the Japanese Patent Application No. 2015-016012.

* cited by examiner

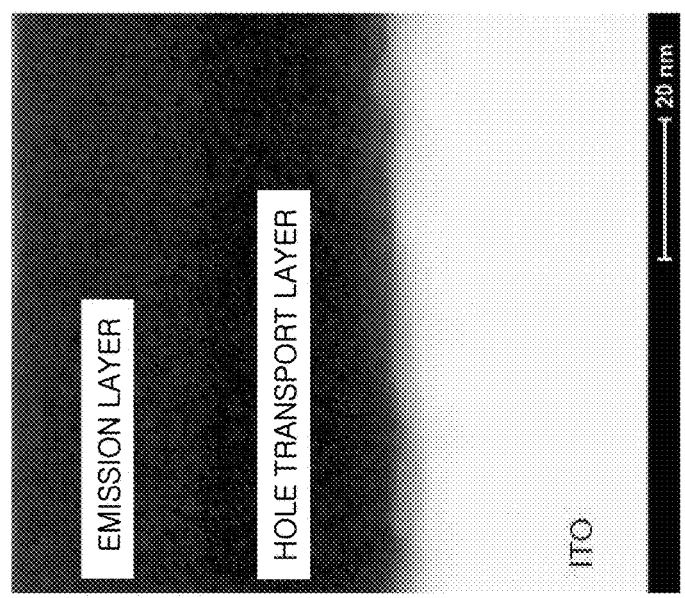

CHARGE-TRANSPORTING MATERIAL AND ORGANIC LIGHT-EMITTING DEVICE INCLUDING THE SAME

CROSS-REFERENCE TO RELATED APPLICATIONS

This application claims priority to and the benefit of Japanese Patent Application No. 2015-016007, filed on Jan. 29, 2015 in the Japan Patent Office, Japanese Patent Application No. 2015-016012, filed on Jan. 29, 2015 in the Japan Patent Office, and Korean Patent Application No. 10-2015-0162842, filed on Nov. 19, 2015 in the Korean Intellectual Property Office, the contents of which are incorporated herein in their entirety by reference.

BACKGROUND

1. Field

The present disclosure relates to charge-transporting materials and organic light-emitting devices including the charge-transporting materials.

2. Description of the Related Art

Organic light-emitting devices (OLEDs) are self-emission devices, which have a wide viewing angle, a high contrast ratio, a high response speed. In addition, OLEDs have excellent luminance, driving voltage and response speed characteristics, and embody full-color images.

A typical organic light-emitting device includes an anode, a cathode, and an organic layer between the anode and the cathode, wherein the organic layer includes an emission layer. A hole transport region may be positioned between the anode and the emission layer, and an electron transport region may be positioned between the emission layer and a cathode. Holes provided from the anode move toward the emission layer through the hole transport region, and electrons provided from the cathode move toward the emission layer through the electron transport region. The holes and the electrons, which are carriers, recombine in the emission layer to produce excitons. The excitons transition from an excited state to a ground state, thereby generating light.

Different types of organic light emitting devices are known. However, there still remains a need in OLEDs having low driving voltage, high efficiency, high brightness, and long lifespan.

SUMMARY

Provided are charge-transporting materials and organic light-emitting devices including charge-transporting materials, wherein the charge-transporting materials include a triphenyl amine unit in their side chains.

Additional aspects will be set forth in part in the description which follows and, in part, will be apparent from the description, or may be learned by practice of the presented exemplary embodiments.

According to an aspect of an exemplary embodiment, a charge-transporting material includes Structural Unit (1) represented by one of Formulae 1 and 2; and Structural Unit (2) represented by one of Formulae 3 and 4:

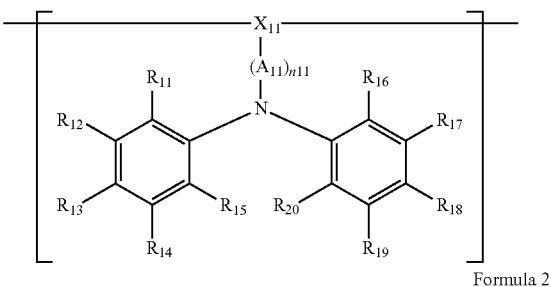

Formula 1

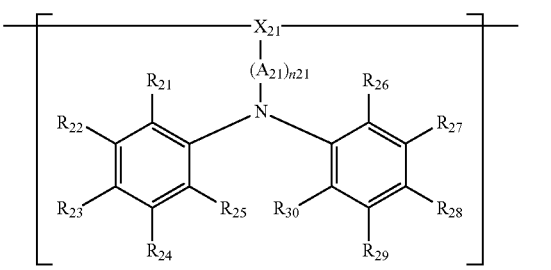

Formula 2

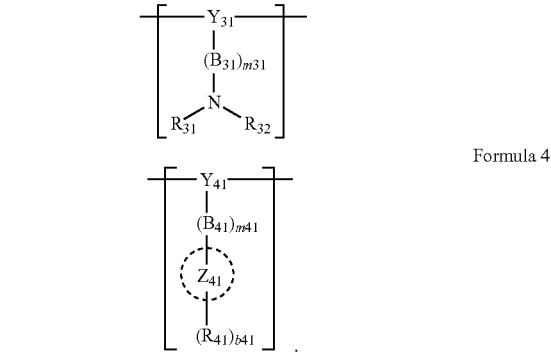

Formula 3

Formula 4

In Formulae 1 to 4, $X_{11}$, $X_{21}$, $Y_{31}$, and $Y_{41}$ are each independently a linking group included in a main chain of the charge-transporting material;

$A_{11}$, $A_{21}$, and $B_{41}$ are each independently selected from a single bond; a carbazolylene group, a fluorenylene group, an arylene group, and a divalent heterocyclic group; and a carbazolylene group, a fluorenylene group, an arylene group, and a divalent heterocyclic group, each substituted with at least one selected from a halogen atom, a cyano group, an alkyl group, an aryl group, an amino group, an alkoxy group, a carbazolyl group, a fluorenyl group, a heterocyclic group, and a silyl group;

$B_{31}$ is selected from a single bond; a carbazolylene group, a fluorenylene group, an arylene group, and a divalent heterocyclic group;

a carbazolylene group, a fluorenylene group, an arylene group, and a divalent heterocyclic group, each substituted with at least one selected from a halogen atom, a cyano group, an alkyl group, an aryl group, an amino group, an alkoxy group, a carbazolyl group, a fluorenyl group, a heterocyclic group, and a silyl group; and an amino group represented by $-N(Q_{11})(Q_{12})-$;

n11, n21, m31, and m41 are each independently selected from 1 and 2;

$Z_{41}$ is selected from a carbazolyl group, a fluorenyl group, an aryl group, and a heterocyclic group;

$R_{11}$, $R_{12}$, $R_{14}$ to $R_{17}$, $R_{19}$, and $R_{20}$ are each independently selected from a hydrogen atom, a halogen atom, a cyano group, an alkyl group, an aryl group, an amino group, an alkoxy group, a carbazolyl group, a fluorenyl group, a heterocyclic group, and a silyl group, i) $R_{13}$ and $R_{18}$ are each independently selected from a hydrogen atom, an aryl group, a tert-butyl group, a carbazolyl group, a fluorenyl group, a heterocyclic group, and an amino group represented by —N($Q_{13}$)($Q_{14}$)-, provided that at least one of $R_{13}$ and $R_{18}$ is selected from an aryl group, a tert-butyl group, a carbazolyl group, a fluorenyl group, a heterocyclic group, and an amino group represented by —N($Q_{13}$)($Q_{14}$)-, and $Q_{14}$ is connected to $R_{12}$, $R_{14}$, $R_{17}$, or $R_{19}$ to form a ring; or ii) $R_{13}$ and $R_{18}$ are each independently selected from a hydrogen atom, an aryl group, a tert-butyl group, a carbazolyl group, a fluorenyl group, a heterocyclic group, and an amino group represented by —N($Q_{15}$)($Q_{16}$), provided that at least one of $R_{13}$ and $R_{18}$ is selected from an aryl group, a tert-butyl group, a carbazolyl group, a fluorenyl group, a heterocyclic group, and an amino group represented by —N($Q_{15}$)($Q_{16}$), $R_{15}$, and $R_{20}$ are bound to each other to form a carbazole ring including $R_{11}$ to $R_{20}$;

$R_{21}$ to $R_{30}$ are each independently selected from a hydrogen atom, a halogen atom, a cyano group, an alkyl group, an aryl group, an amino group, an alkoxy group, a carbazolyl group, and a silyl group;

$R_{31}$ and $R_{32}$ are each independently selected from an aryl group; and an aryl group, substituted with at least one selected from a cross-linking group, a halogen atom, a cyano group, an alkyl group, an aryl group, an amino group, an alkoxy group, a carbazolyl group, a fluorenyl group, a heterocyclic group, and a silyl group, provided that at least one of $R_{31}$ and $R_{32}$ is an aryl group substituted with a cross-linking group;

$R_{41}$ is selected from a hydrogen atom, a halogen atom, a cyano group, an alkyl group, an aryl group, an amino group, an alkoxy group, a carbazolyl group, a fluorenyl group, a heterocyclic group, and a silyl group; and an aryl group, substituted with at least one selected from cross-linking group, a halogen atom, a cyano group, an alkyl group, an aryl group, an amino group, an alkoxy group, a carbazolyl group, a fluorenyl group, a heterocyclic group, and a silyl group, provided that at least one of $R_{41}$(s) is an aryl group substituted with a cross-linking group;

b41 is selected from 1, 2, and 3;

$Q_{11}$, $Q_{13}$, $Q_{15}$, and $Q_{16}$ are each independently selected from an aryl group and a heterocyclic group; and an aryl group and a heterocyclic group, each substituted with at least one selected from a halogen atom, a cyano group, an alkyl group, an aryl group, an amino group, an alkoxy group, a carbazolyl group, a fluorenyl group, a heterocyclic group, and a silyl group;

$Q_{12}$ and $Q_{14}$ are each independently selected from an arylene group and a divalent heterocyclic group; and an arylene group and a divalent heterocyclic group, each substituted with at least one selected from a halogen atom, a cyano group, an alkyl group, an aryl group, an amino group, an alkoxy group, a carbazolyl group, a fluorenyl group, a heterocyclic group, and a silyl group.

Another aspect provides an organic light-emitting device including:

a first electrode;

a second electrode; and an organic layer disposed between the first electrode and the second electrode, wherein the organic layer includes the charge-transporting material.

BRIEF DESCRIPTION OF THE DRAWINGS

These and/or other aspects will become apparent and more readily appreciated from the following description of the exemplary embodiments, taken in conjunction with the accompanying drawings in which:

FIG. 2A is a transmission electron microscope (TEM) cross-sectional image of an organic light-emitting device (1-5) manufactured according to Device Example 5;

FIG. 2B is a graph of intensity (arbitrary units) versus distance (nanometers, nm) illustrating a contrast of the image of FIG. 2A with respect to a distance (a thickness of layer);

DETAILED DESCRIPTION

Figure 1:
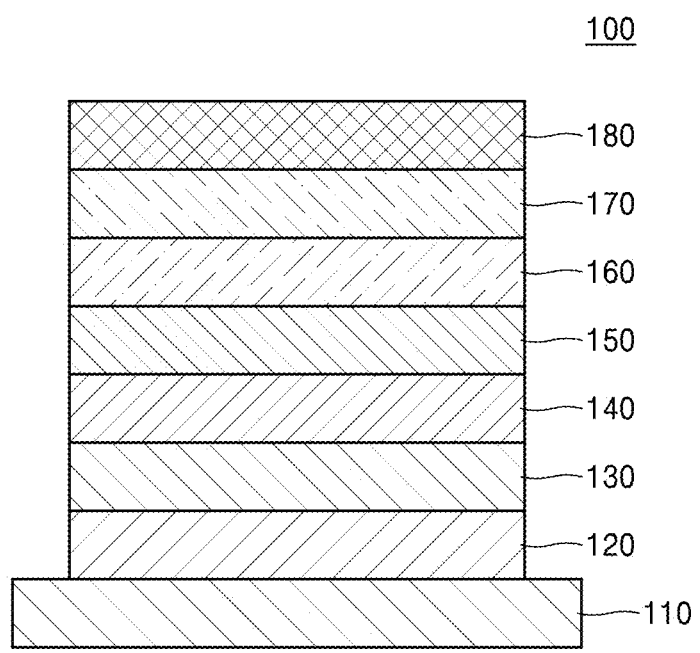
FIG. 1 is a schematic cross-sectional view of an organic light-emitting device according to an embodiment.

Reference will now be made in detail to exemplary embodiments, examples of which are illustrated in the accompanying drawings, wherein like reference numerals refer to like elements throughout. In this regard, the present exemplary embodiments may have different forms and should not be construed as being limited to the descriptions set forth herein. Accordingly, the exemplary embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "on" another element, it can be directly in contact with the other element or intervening elements may be present therebetween. In contrast, when an element is referred to as being "directly on" another element, there are no intervening elements present.

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present embodiments.

The terminology used herein is for the purpose of describing particular embodiments only and is not intended to be limiting. As used herein, the singular forms "a," "an," and "the" are intended to include the plural forms as well, unless the context clearly indicates otherwise.

The term "or" means "and/or." It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this general inventive concept belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Organic light-emitting devices may use various charge-transporting materials including a hole-transporting material. A charge-transporting material may transport charges toward an emission layer, and also, may prevent permeation of an exciton, which is formed in the emission layer by recombining a hole and an electron, into a hole transport region and/or an electron transport region. The hole-transporting material has high charge mobility and high triplet energy, and due to these characteristics, the hole-transporting material may provide green and blue organic light-emitting devices having high efficiency.

For example, Japanese Patent Publication No. 2008-91894 discloses a polymer including a triphenyl amine unit in its side chain, wherein the triphenyl amine unit acts as a hole-transporting material.

The hole-transporting material disclosed in Japanese Patent Publication No. 2008-91894 has a charge transport performance. However, when one layer is formed on another layer including the hole-transporting material to form a stack structure, the other layer including the hole-transporting material may be dissolved in a solvent that is used to form the layer, thereby losing its charge transport capability. Accordingly, the solvent that is used to form the layer should be selected from materials that do not dissolve the other layer constituting the hole-transporting material. However, when solubility of the solvent is taken into consideration, only a limited range of materials are available for the layer.

Meanwhile, a hole-transporting material that further includes, in addition to the unit disclosed in Japanese Patent Publication No. 2008-91894, a separate unit that provides a resistance against a solvent may be used in a hole transport layer and a hole injection layer. In this embodiment, however, a ratio of a charge-transporting unit per unit density may be reduced, and charge transport performance deteriorates.

The hole-transporting material of Japanese Patent Publication No. 2008-91894 has a low charge resistance, and accordingly, an organic light-emitting device including a hole transport layer and a hole injection layer each including the hole-transporting material has a short lifespan (that is, its durability may be reduced). Meanwhile, a hole-transporting material that includes, in addition to the unit disclosed in Japanese Patent Publication No. 2008-91894, a separate unit to provide charge resistance may be used in a hole transport layer and a hole injection layer. In this embodiment, however, a ratio of a charge-transporting unit per unit density may be reduced, and charge transport performance deteriorates.

Charge-transporting materials are classified into a main chain-type charge-transporting material including a charge-transporting unit in its main chain and a side chain-type charge-transporting material including a charge-transporting unit in its side chain. The side chain-type charge-transporting material may have lower charge mobility than the main chain-type charge-transporting material.

The inventors of the present disclosure searched for an explanation of low charge mobility displayed by the side chain-type charge-transporting material, and assumed that in the embodiment including the side chain-type transporting material, its main chain skeleton does not involve in charge-transport, and accordingly, a charge transport performance per volume is low. Accordingly, by taking into consideration the structure of a high density (ratio) of a charge-transporting unit, it was found that the low charge transport performance can be improved by using a triphenyl amine unit to which a particular substituent is introduced.

Hereinafter, embodiments will be described below, but they are not limited thereto.

Herein, Structural Unit (1) represented by one of Formulae 1 and 2 will be referred to as "Structural Unit (1)", and Structural Unit (2) represented by one of Formulae 3 and 4 will be referred to as "Structural Unit (2)".

The expression indicating a range, "x to y", as used herein means "a range of x or more and y or less."

Unless defined otherwise, manipulating and measuring properties are considered as being performed at a temperature of 20 to 25° C. and at a humidity of 40 to 50%.

The term "a cross-linking group" as used herein refers to a group that reacts (cross-links) with identical or different structural units around the cross-linking group by heating or radiating active energy rays to form a new bond. When the cross-linking group is a cyclobutane, the cross-linking reactivity, cross-linking stability, and electrochemical stability of the charge-transporting material may be improved. When the cross-linking group is an epoxy group, an oxetane group, a cyclic ether group, or a vinyl ether group, cross-linking reactivity of the charge-transporting material may be improved.

The term "aryl group" as used herein refers to a monovalent group derived from arene, and the term "arylene group" as used herein refers to a divalent group derived from arene. The arene may be any cyclic group that consists of a carbon atom and a hydrogen atom only.

For example, the "arylene group" may be derived from a benzene ring (a phenylene group), a biphenyl ring (a biphenylenyl group), a naphthalene ring (a naphthalenylene group), an anthracene ring (an anthracenylene group), or a fluorene ring (a fluorenylene group). For example, the arylene group may be a benzene-derived cyclic group (a phenylene group). The aryl group may be understood by descriptions of the divalent arylene group, except that the aryl group is a monovalent group.

For example, the "aryl group" may be a $C_6$ to $C_{20}$ aryl group. Examples of the aryl group are a phenyl group, a benzyl group, a phenethyl group, an o-, m- or p-tolyl group, a 2,3- or 2,4-xylyl group, a mesityl group, a naphthyl group, an anthryl group, a phenanthryl group, a biphenyl group, a benzhydryl group, a trityl group, and a pyrenyl group. For example, the aryl group may be a phenyl group.

The term "heterocyclic group" as used herein refers to a monovalent group derived from a heterocycle, and a "divalent heterocyclic group" refers to a divalent group derived from a heterocycle. The heterocycle may be any cyclic group that further includes, in addition to a carbon atom and a hydrogen atom, at least one heteroatom selected from a nitrogen atom, an oxygen atom, and a sulfur atom. For example, the heterocycle may be derived from a thiophene ring, a dithienothiophene ring, a cyclopentadithiophene ring, phenyl-thiophene ring, a diphenyl-thiophene ring, an imidazole ring, an oxazole ring, an iso-oxazole ring, a thiazole ring, a pyrrole ring, a furan ring, a benzofuran ring, an iso-benzofuran ring, a cumarin ring (for example, 3,4-dihydrocumarin), a benzimidazole ring, a benzoxazole ring, a rhodanine ring, a dirhodanine ring, a pyrazolone ring, an imidazolone ring, a pyran ring, a pyridine ring, a pyrazine ring, a pyrazole ring, a pyrimidine ring, a pyridazine ring, a triazine ring, a fluorene ring, a benzothiophene ring, a benzo[c]thiophene ring, a benzimidazole ring, a benzoxazole ring, a benzoisoxazole ring, a benzothiazole ring, an indole ring, a phthalazine ring, a cinnoline ring, a quinazoline ring, a carbazole ring, a carboline ring, a diazacarboline ring (a carboline having at least one carbon atom that is substituted with a nitrogen atom), a 1,10-phenanthroline ring, a quinone ring, a thiohydantoin ring, a pyrazolone ring, or a pyrazoline ring. Two or more of these heterocycles may be used in a combination with one another. For example, the heterocycle may be derived from a phenyl-pyridine (for example, a 4-phenylpyridine), a styrylthiophene (for example, 2-styrylthiophene), a 2-(9H-fluorene-2-yl)thiophene, a 2-phenylbenzo[b]thiophene, phenylthiophene ring, a (1,1-diphenyl-4-phenyl)-1,3-butadiene, 1,4-diphenyl-1,3-dibutadiene, a 4-(phenylmethylene)-2,5-cyclohexadiene, or a phenyldithenothiophene ring. The heterocyclic group is a monovalent form of these heterocycles, and a divalent heterocyclic group is a divalent form of these heterocycles.

The term "a halogen atom" as used herein refers to a fluorine atom, a chlorine atom, bromine) atom, and an iodine atom.

The term "alkyl group" as used herein refers to a linear or branched $C_1$ to $C_{24}$ alkyl group. For example, the alkyl group may be selected from a methyl group, an ethyl group, an n-propyl group, an iso-propyl group, an n-butyl group, an iso-butyl group, a sec-butyl group, a tert-butyl group, an n-pentyl group, an isopentyl group, a tert-pentyl group, a neo-pentyl group, a 1,2-dimethylpropyl group, an n-hexyl group, an iso-hexyl group, a 1,3-dimethylbutyl group, a 1-iso-propylpropyl group, a 1,2-dimethylbutyl group, an n-heptyl group, a 1,4-dimethyl pentyl group, a 3-ethyl pentyl group, a 2-methyl-1-iso-propylpropyl group, a 1-ethyl-3-methylbutyl group, an n-octyl group, 2-ethylhexyl group, a 3-methyl-1-iso-propylbutyl group, a 2-methyl-1-iso-propyl group, a 1-t-butyl-2-methylpropyl group, an n-nonyl group, a 3,5,5-trimethylhexyl group, an n-decyl group, an iso-decyl group, an n-undecyl group, a 1-methyldecyl group, an n-lauryl group, an n-tridecyl group, an n-tetradecyl group, an n-pentadecyl group, an n-hexadecyl group, an n-heptadecyl group, an n-octadecyl group, an n-nonadecyl group, an n-eicosyl group, an n-henicosyl group, an n-docosyl group, an n-tricosyl group, and an n-tetracosyl group. For example, the alkyl group may be a linear or branched $C_1$ to $C_8$ alkyl group. The term "alkoxy group" as used herein refers to a linear or branched $C_1$ to $C_{24}$ alkoxy group. For example, the alkoxy group may be selected from a methoxy group, an ethoxy group, a propoxy group, an iso-propoxy group, a butoxy group, a pentyloxy group, a hexyloxy group, a heptyloxy group, an octyloxy group, a nonyloxy group, a decyloxy group, a undecyloxy group, a dodecyloxy group, a tridecyloxy group, a tetradecyloxy group, a pentadecyloxy group, a hexadecyloxy group, a heptadecyloxy group, an octadecyloxy group, a 2-ethylhexyloxy group, and a 3-ethylpentyloxy group. For example, the alkoxy group may be a linear or branched $C_1$ to $C_8$ alkoxy group.

The term "a carbazole group" as used herein may be represented by one of Formulae 5-1 to 5-3:

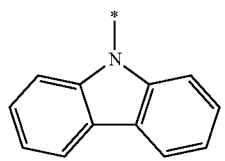

5-1

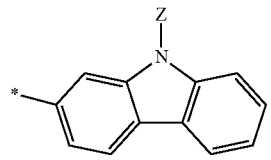

5-2

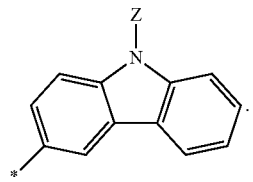

5-3

In Formulae 5-1 to 5-3,

Z is selected from a hydrogen atom, an alkyl group, an alkoxy group, and an aryl group; and

* indicates a binding site to a neighboring atom.

The alkyl group, the alkoxy group, and the aryl group are not limited thereto, and are the same as described above.

The term "a carbazolylene group" as used herein may be represented by one of Formulae 5-4 to 5-7:

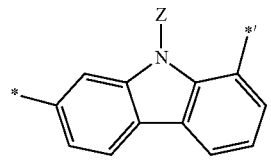

5-4

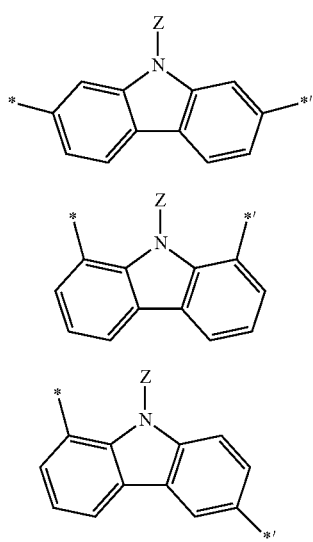

5-5

5-6

5-7

In Formulae 5-4 to 5-7,

Z is selected from a hydrogen atom, an alkyl group, an alkoxy group, and an aryl group; and

* and *' each indicate a binding site to a neighboring atom.

The alkyl group, the alkoxy group, and the aryl group are not limited thereto, and are the same as described above.

The term "a fluorenyl group" as used herein may be represented by one of Formulae 5-8 to 5-10:

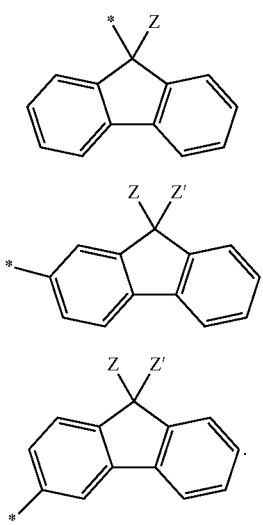

5-8

5-9

5-10

In Formulae 5-8 to 5-10,

Z and Z' may each independently be selected from a hydrogen atom, an alkyl group, an alkoxy group, and an aryl group; and

* indicates a binding site to a neighboring atom.

The alkyl group, the alkoxy group, and the aryl group are not limited, and are the same as described above.

The term "a fluorenylene group" as used herein may be represented by one of Formulae 5-11 to 5-14:

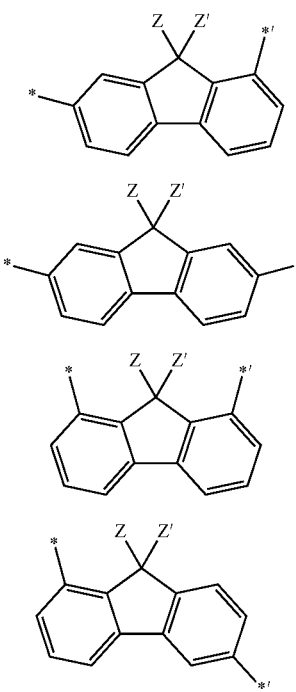

5-11

5-12

5-13

5-14

In Formulae 5-11 to 5-14,

Z and Z' are each independently selected from a hydrogen atom, an alkyl group, an alkoxy group, and an aryl group; and

* and *' each indicate a binding site to a neighboring atom.

The alkyl group, the alkoxy group, and the aryl group are not limited thereto, and are the same as described above.

The term "silyl group" may be represented by $—Si(Z_1)(Z_2)(Z_3)$. Herein, $Z_1$ to $Z_3$ may each independently be selected from an alkyl group, an alkoxy group, and an aryl group. The alkyl group, the alkoxy group, and the aryl group are not limited thereto, and are the same as described above.

Charge-Transporting Material

A charge-transporting material according to an embodiment is a copolymer including Structural Unit (1) represented by one of Formulae 1 and 2; and Structural Unit (2) represented by one of Formulae 3 and 4.

The expression that a charge-transporting material according to an embodiment includes "Structural Unit (1) represented by one of Formulae 1 and 2; and Structural Unit (2) represented by one of Formulae 3 and 4" may include an embodiment in which: i) the charge-transporting material includes Structural Unit (1) represented by Formula 1 and Structural Unit (2) represented by Formula 3, and an embodiment in which ii) the charge-transporting material includes Structural Unit (1) represented by Formula 1, Structural Unit (2) represented by Formula 3, and Structural Unit (2) represented by Formula 4.

Structural Unit (2) is a triphenyl amine unit having a cross-linking group. Accordingly, Structural Unit (2) may act as a unit having a cross-linking group and a charge-transporting unit. Thus, a charge-transporting material including Structural Unit (2) may provide a higher ratio of a charge-transporting unit (while obtaining high charge transport performance), and high cross-linking properties. Since Structural Unit (2) includes a cross-linking group, cross-linking may occur by heating and/or radiating active energy rays. Due to the cross-linking reaction, a layer that is not dissolved in a solvent and has high durability may be formed. Accordingly, an organic light-emitting device including a charge-transporting material including Structural Unit (2) may have high durability.

Also, for example, even when one layer is coated on another layer including the charge-transporting material, the other layer including the charge-transporting material may not be completely, or may be barely, dissolved in a solvent that is used to form the layer for the coating.

The charge-transporting material is readily synthesized, and is suitable for production in great quantities.

$X_{11}$, $X_{21}$, $Y_{31}$, and $Y_{41}$ in Formulae 1 to 4 may each independently be a linking group included in a main chain of the charge-transporting material. The linking group included in a main chain of the charge-transporting material may have any structure that is able to constitute the main chains of Structural Units (1) and (2).

For example, $X_{11}$, $X_{21}$, $Y_{31}$, and $Y_{41}$ in Formulae 1 to 4 may each independently be a group represented by one of Formulae 6-1 to 6-10, but are not limited thereto:

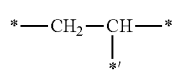

6-1

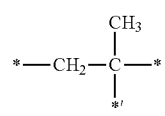

6-2

6-3

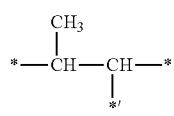

6-4

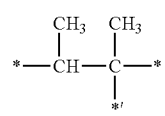

6-5

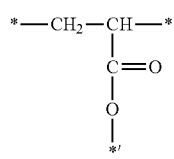

6-6

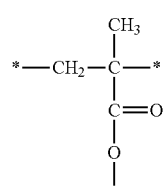

6-7

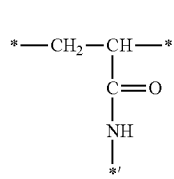

6-8

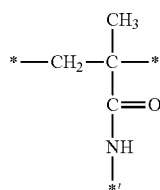

6-9

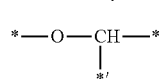

6-10

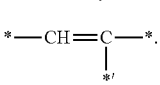

In Formulae 6-1 to 6-10,

* indicates a binding site to an atom included in the main chain of the charge-transporting material;

*' indicates a binding site to $A_{11}$, $A_{21}$, $B_{31}$, or $B_{41}$.

In some embodiments, $X_{11}$, $X_{21}$, $Y_{31}$, and $Y_{41}$ in Formulae 1 to 4 may each independently be a group represented by one of Formulae 6-1 and 6-2, but are not limited thereto.

$A_{11}$, $A_{21}$, and $B_{41}$ in Formulae 1, 2 and 4 may each independently be selected from a single bond; a carbazolylene group, a fluorenylene group, an arylene group, and a divalent heterocyclic group; and a carbazolylene group, a fluorenylene group, an arylene group, and a divalent heterocyclic group, each substituted with at least one selected from a halogen atom, a cyano group, an alkyl group, an aryl group, an amino group, an alkoxy group, a carbazolyl group, a fluorenyl group, a heterocyclic group, and a silyl group.

For example, $A_{11}$ in Formula 1 may be selected from a single bond; an arylene group; and an arylene group substituted with a heterocyclic group, but is not limited thereto.

In some embodiments, $A_{11}$ in Formula 1 may be a single bond; and an arylene group, but is not limited thereto.

For example, $A_{21}$ in Formula 2 may be selected from a single bond; and an arylene group, but is not limited thereto.

For example, $A_{21}$ in Formula 2 may be selected from a single bond; and a phenylene group, but is not limited thereto. When $A_{21}$ in Formula 2 is a phenylene group, electrochemical stability may be improved. Accordingly, an organic light-emitting device including the charge-transporting material may have a longer lifespan. When $A_{21}$ in Formula 2 is a phenylene group, reactivity of the charge-transporting material in a monomer state before polymerization may be suppressed, leading to ease of handling in the course of manufacturing.

For example, $B_{41}$ in Formula 4 may be selected from a carbazolylene group, a fluorenylene group, an arylene group, and a divalent heterocyclic group; and a carbazolylene group, a fluorenylene group, an arylene group, and a divalent heterocyclic group, each substituted with at least one selected from a halogen atom, a cyano group, an alkyl group, an aryl group, an amino group, an alkoxy group, a carbazolyl group, a fluorenyl group, a heterocyclic group, and a silyl group, but is not limited thereto.

In some embodiments, $B_{41}$ in Formula 4 may be a fluorenylene group substituted with an alkyl group, but is not limited thereto.

In some embodiments, $B_{41}$ in Formula 4 may be a fluorenylene group substituted with a linear or branched $C_1$ to $C_{12}$ alkyl group, but is not limited thereto.

In some embodiments, $B_{41}$ in Formula 4 may not be a fluorenylene group substituted with a fluorenyl group, but is not limited thereto.

n11 in Formula 1 indicates the number of groups $A_{11}$, and n11 may be selected from 1 and 2. When n11 is 2, a plurality of groups $A_{11}$ may be identical to or different from each other.

n21 in Formula 2 indicates the number of groups $A_{21}$, and n21 may be selected from 1 and 2. When n21 is 2, a plurality of groups $A_{21}$ may be identical to or different from each other.

m41 in Formula 4 indicates the number of groups $B_{41}$, m41 may be selected from 1 and 2. When m41 is 2, a plurality of groups $B_{41}$ may be identical to or different from each other.

For example, $(A_{11})_{n11}$, $(A_{21})_{n21}$, and $(B_{41})_{m41}$ in Formulae 1, 2, and 4 may each independently be a group represented by one of Formulae 9-1 to 9-6, but are not limited thereto:

9-1
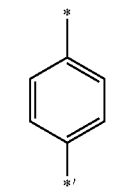

9-2
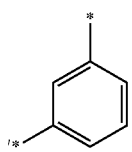

9-3
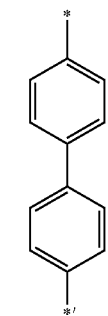

9-4
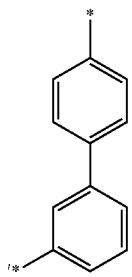

9-5
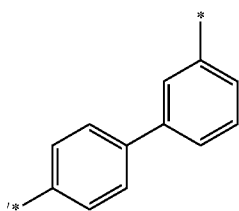

9-6
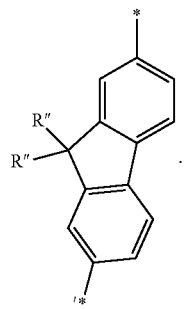

In Formulae 9-1 to 9-6,

R″ indicates an alkyl group; and

* and *' each indicate a binding site to a neighboring atom.

$B_{31}$ in Formula 3 may be selected from a single bond; a carbazolylene group, a fluorenylene group, an arylene group, and a divalent heterocyclic group;

a carbazolylene group, a fluorenylene group, an arylene group, and a divalent heterocyclic group, each substituted with at least one selected from a halogen atom, a cyano group, an alkyl group, an aryl group, an amino group, an alkoxy group, a carbazolyl group, a fluorenyl group, a heterocyclic group, and a silyl group; and an amino group represented by —N($Q_{11}$)($Q_{12}$)-; and $Q_{11}$ and $Q_{12}$ are the same as described below.

For example, $B_{31}$ in Formula 3 may be selected from a single bond; an arylene group, and an amino group represented by —N($Q_{11}$)($Q_{12}$)-, but is not limited thereto.

In some embodiments, $B_{31}$ in Formula 3 may be a single bond; a phenylene group, and an amino group represented by —N($Q_{11}$)($Q_{12}$)-, but is not limited thereto. When $B_{31}$ in Formula 3 is a phenylene group, an electrochemical stability may be improved, and accordingly, a formed organic light-emitting device may have a longer lifespan. When $B_{31}$ in Formula 3 is a phenylene group, reactivity of the formed charge-transporting material in a monomer state before polymerization may be suppressed, leading to ease of handling in the course of manufacturing.

m31 in Formula 3 indicates the number of groups $B_{31}$, and m31 may be selected from 1 and 2. When m31 is 2, a plurality of groups $B_{31}$ may be identical to or different from each other.

For example, $(B_{31})_{m31}$ in Formula 3 may be a group represented by one of Formulae 9-1 to 9-7, but is not limited thereto:

9-1
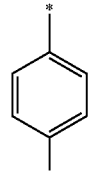

9-2
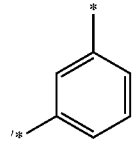

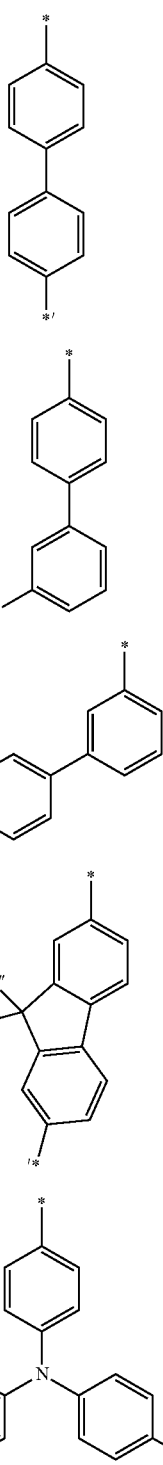

In Formulae 9-1 to 9-7,

R" is an alkyl group; and

* and *' each indicate a binding site to a neighboring atom.

$Z_{41}$ in Formula 4 may be selected from a carbazolyl group, a fluorenyl group, an aryl group, and a heterocyclic group.

$A_{11}$, $A_{21}$, $B_{31}$, and $B_{41}$ in Formulae 1 to 4 may each include a substituent. Due to the inclusion of a substituent, a quinoid structure, which occurs during charge-transport, and side reactions caused thereby may occur in a less extent, and electrochemical stability may be improved. Accordingly, an organic light-emitting device including such a charge-transporting material may have improved durability. Also, reactivity of monomers before polymerization may be suppressed, leading to ease of handling in the synthesis or manufacturing course.

For example, $Z_{41}$ in Formula 4 may be a fluorenyl group, but is not limited thereto.

$R_{11}$, $R_{12}$, $R_{14}$ to $R_{17}$, $R_{19}$, and $R_{20}$ in Formula 1 may each independently be selected from a hydrogen atom, a halogen atom, a cyano group, an alkyl group, an aryl group, an amino group, an alkoxy group, a carbazolyl group, a fluorenyl group, a heterocyclic group, and a silyl group.

For example, $R_{11}$, $R_{12}$, $R_{14}$ to $R_{17}$, $R_{19}$, and $R_{20}$ in Formula 1 may be each independently be selected from a hydrogen atom, alkyl group, an aryl group, and a heterocyclic group, but are not limited thereto.

In some embodiments, $R_{11}$, $R_{12}$, $R_{14}$ to $R_{17}$, $R_{19}$, and $R_{20}$ in Formula 1 may each independently be selected from a hydrogen atom and an aryl, but are not limited thereto.

i) $R_{13}$ and $R_{18}$ in Formula 1 may each independently be selected from a hydrogen atom, an aryl group, a tert-butyl group, a carbazolyl group, a fluorenyl group, a heterocyclic group, and an amino group represented by —N($Q_{13}$)($Q_{14}$)-, provided that at least one of $R_{13}$ and $R_{18}$ is selected from an aryl group, a tert-butyl group, a carbazolyl group, a fluorenyl group, a heterocyclic group, and an amino group represented by —N($Q_{13}$)($Q_{14}$)-, and $Q_{14}$ may be bound to $R_{12}$, $R_{14}$, $R_{17}$, or $R_{19}$ to form a ring; or ii) $R_{13}$ and $R_{18}$ may each independently be selected from a hydrogen atom, an aryl group, a tert-butyl group, a carbazolyl group, a fluorenyl group, a heterocyclic group, and an amino group represented by —N($Q_{15}$)($Q_{16}$), provided that at least one of $R_{13}$ and $R_{18}$ is selected from an aryl group, a tert-butyl group, a carbazolyl group, a fluorenyl group, a heterocyclic group, and an amino group represented by —N($Q_{15}$)($Q_{16}$), and $R_{15}$ and $R_{20}$ are bound to each other to form a carbazole ring including $R_{11}$ to $R_{20}$; and $Q_{13}$ to $Q_{16}$ will be described below.

$R_{13}$ and $R_{18}$ may provide charge-resistance to the triphenyl amine unit of the Structural Unit (1). Accordingly, Structural Unit (1) may have a high charge transport performance and a high charge resistance. Thus, an organic light-emitting device including a charge-transporting material according to an embodiment may have a long lifespan, high efficiency, and a low driving voltage.

For example, in Formula 1, $R_{13}$ may be a hydrogen atom, and $R_{18}$ may be an aryl group, but they are not limited thereto.

In some embodiments, $R_{13}$ and $R_{18}$ in Formula 1 may each independently be an aryl group, but they are not limited thereto.

In some embodiments, $R_{13}$ may be a hydrogen atom, and $R_{18}$ may be a carbazolyl group, but they are not limited thereto.

In some embodiments, $R_{13}$ may be a hydrogen atom, and $R_{18}$ may be a fluorenyl group, but they are not limited thereto.

In some embodiments, $R_{13}$ may be a hydrogen atom, and $R_{18}$ may be an amino group represented by —N($Q_{13}$)($Q_{14}$)-, but they are not limited thereto.

In some embodiments, $R_{13}$ may be a hydrogen atom, $R_{18}$ is an amino group represented by —N($Q_{15}$)($Q_{16}$); and $R_{15}$ and $R_{20}$ may be bound to each other to form a carbazole ring including $R_{11}$ to $R_{20}$, but they are not limited thereto.

$R_{21}$ to $R_{30}$ in Formula 2 may each independently be selected from a hydrogen atom, a halogen atom, a cyano group, an alkyl group, an aryl group, an amino group, an alkoxy group, a carbazolyl group, and a silyl group.

For example, $R_{21}$, $R_{22}$, $R_{24}$ to $R_{27}$, $R_{29}$, and $R_{30}$ in Formula 2 may each independently be selected from a hydrogen atom, an alkyl group, and an aryl group, but they are not limited thereto.

In some embodiments, $R_{21}$, $R_{22}$, $R_{24}$ to $R_{27}$, $R_{29}$, and $R_{30}$ in Formula 2 may each independently be selected from a hydrogen atom, and a phenyl group, but they are not limited thereto.

For example, $R_{23}$ and $R_{28}$ in Formula 2 may each independently be selected from a hydrogen atom, a halogen atom, a cyano group, an amino group, an alkoxy group, and a silyl group, but they are not limited thereto.

In some embodiments, $R_{23}$ and $R_{28}$ in Formula 2 may each independently be a hydrogen atom, but they are not limited thereto.

$R_{31}$ and $R_{32}$ in Formula 3 may each independently be selected from an aryl group; and an aryl group, substituted with at least one selected from a cross-linking group, a halogen atom, a cyano group, an alkyl group, an aryl group, an amino group, an alkoxy group, a carbazolyl group, a fluorenyl group, a heterocyclic group, and a silyl group, provided that at least one of $R_{31}$ and $R_{32}$ is an aryl group substituted with a cross-linking group.

For example, $R_{31}$ and $R_{32}$ in Formula 3 may each independently be selected from a phenyl group and a biphenyl group; and a phenyl group and a biphenyl group, each substituted with at least one selected from a cross-linking group, a halogen atom, a cyano group, an alkyl group, an aryl group, an amino group, an alkoxy group, a carbazolyl group, a fluorenyl group, a heterocyclic group, and a silyl group, provided that at least one of $R_{31}$ and $R_{32}$ may be selected from a phenyl group and a biphenyl group, each substituted with a cross-linking group, but they are not limited thereto.

In some embodiments, in Formula 3, $R_{31}$ may be selected from a phenyl group and a biphenyl group, and $R_{32}$ may be selected from a phenyl group and a biphenyl group, each substituted with a cross-linking group, but they are not limited thereto.

In some embodiments, $R_{31}$ and $R_{32}$ in Formula 3 may each independently be selected from a phenyl group and a biphenyl group, each substituted with a cross-linking group, but is not limited thereto.

$R_{41}$ in Formula 4 may be selected from a hydrogen atom, a halogen atom, a cyano group, an alkyl group, an aryl group, an amino group, an alkoxy group, a carbazolyl group, a fluorenyl group, a heterocyclic group, and a silyl group; and an aryl group, substituted with at least one selected from a cross-linking group, a halogen atom, a cyano group, an alkyl group, an aryl group, an amino group, an alkoxy group, a carbazolyl group, a fluorenyl group, a heterocyclic group, and a silyl group, provided that at least one of groups $R_{41}$ may be an aryl group substituted with a cross-linking group.

For example, $R_{41}$ in Formula 4 may be selected from a hydrogen atom and a phenyl group substituted with a cross-linking group, provided that at least one of groups $R_{41}$ may be a phenyl group substituted with a cross-linking group, but is not limited thereto.

In some embodiments, b41 in Formula 4 may be selected from 1 and 2;

$R_{41}$ may be a phenyl group substituted with a cross-linking group, but is not limited thereto.

For example, at least one of $R_{31}$ and $R_{32}$ in Formulae 3 and 4 may be a group represented by one of Formulae 7-1 to 7-10, and at least one of groups $R_{41}$ may be a group represented by one of Formulae 7-1 to 7-7, 7-9, and 7-10, but they are not limited thereto:

-continued 7-10
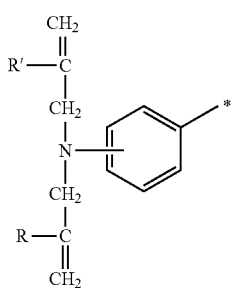

In Formulae 7-1 to 7-10,

R and R' may each independently be selected from a hydrogen atom and an alkyl group;

Ar may be selected from an aryl group and a heterocyclic group; and an aryl group and a heterocyclic group, each substituted with at least one selected from a halogen atom, a cyano group, an alkyl group, an aryl group, an amino group, an alkoxy group, a carbazolyl group, a fluorenyl group, a heterocyclic group, and a silyl group; and

* indicates a binding site to a neighboring atom.

For example, Formulae 7-1 to 7-10 represent a phenyl group or a biphenyl group, each substituted with a cross-linking group. —C(R)=CH$_2$ in Formula 7-1 represents a "cross-linking group" used herein.

In some embodiments, in Formulae 3 and 4, at least one of $R_{31}$ and $R_{32}$ may be a group represented by one of Formulae 8-1 to 8-10, and at least one of groups $R_{41}$ may be a group represented by one of Formulae 8-1 to 8-7, 8-9, and 8-10, but they are not limited thereto:

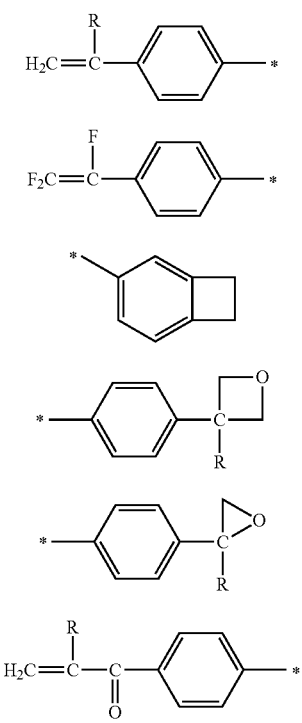

-continued

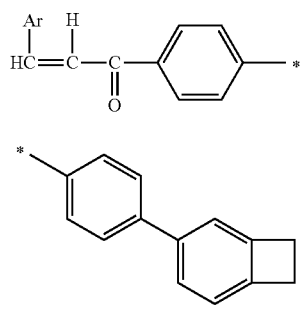

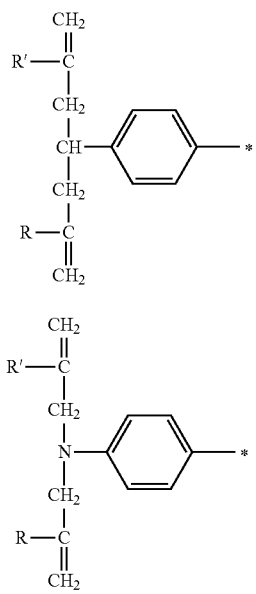

In Formulae 8-1 to 8-10,

R and R' may each independently be selected from a hydrogen atom and an alkyl group;

Ar is selected from an aryl group and a heterocyclic group; and an aryl group and a heterocyclic group, each substituted with at least one selected from a halogen atom, a cyano group, an alkyl group, an aryl group, an amino group, an alkoxy group, a carbazolyl group, a fluorenyl group, a heterocyclic group, and a silyl group; and

* indicates a binding site to a neighboring atom.

In some embodiments, in Formulae 3 and 4, at least one of $R_{31}$ and $R_{32}$ and at least one of $R_{41}$(s) may be a group represented by Formula 8-3, but they are not limited thereto.

In Formulae 3 and 4, when a cross-linking group is introduced as a substituent, the cross-linking group may be introduced directly, or through a different divalent linking group (for example, —O—, —C(=O)—, —CH$_2$—, a C$_2$ to C$_{10}$ alkylene group, such as —CH$_2$CH$_2$—, or arylene group, such as a phenylene group).

b41 in Formula 4 indicates the number of groups $R_{41}$, and b41 may be selected from 1, 2, and 3. When b41 is 2 or more, a plurality of groups $R_{41}$ may be identical to or different from each other.

For example, b41 in Formula 4 may be 2, but is not limited thereto.

$Q_{11}$, $Q_{13}$, $Q_{15}$, and $Q_{16}$ in Formulae 1 and 3 may each independently selected from an aryl group and a heterocyclic group; and an aryl group and a heterocyclic group, each substituted with at least one selected from a halogen atom, a cyano group, an alkyl group, an aryl group, an amino group, an alkoxy group, a carbazolyl group, a fluorenyl group, a heterocyclic group, and a silyl group.

For example, $Q_{11}$, $Q_{13}$, $Q_{15}$, and $Q_{16}$ in Formulae 1 and 3 may each independently be selected from an aryl group; and an aryl group, substituted with at least one selected from an aryl group, a carbazolyl group, a fluorenyl group, and a heterocyclic group, but they are not limited thereto.

In some embodiments, $Q_{11}$, $Q_{13}$, $Q_{15}$, and $Q_{16}$ in Formulae 1 and 3 may each be independently be selected from a phenyl group and a biphenyl group; and a phenyl group and a biphenyl group, each substituted with at least one selected from an aryl group, a carbazolyl group, a fluorenyl group, and a heterocyclic group, but they are not limited thereto.

$Q_{12}$ and $Q_{14}$ in Formulae 1 and 3 may each independently be selected from an arylene group and a divalent heterocyclic group; and an arylene group and a divalent heterocyclic group, each substituted with at least one selected from a halogen atom, a cyano group, an alkyl group, an aryl group, an amino group, an alkoxy group, a carbazolyl group, a fluorenyl group, a heterocyclic group, and a silyl group.

For example, $Q_{12}$ and $Q_{14}$ in Formulae 1 and 3 may each independently be selected from an arylene group; and an arylene group, substituted with at least one selected from an aryl group, a carbazolyl group, a fluorenyl group, and a heterocyclic group, but is not limited thereto.

In some embodiments, $Q_{12}$ and $Q_{14}$ in Formulae 1 and 3 may each independently selected from a 1,2-phenylene group, a 1,3-phenylene group, and a 1,4-phenylene group, but they are not limited thereto.

In Formula 1, from among binding sites of $Q_{14}$, one binding site may be used to bind to a nitrogen atom, and another binding site may be used to bind to $R_{12}$, $R_{14}$, $R_{17}$, or $R_{19}$.

In Formula 3, all binding sites of $Q_{12}$ may be used to bind to a neighboring nitrogen atom.

For example, when Structural Unit (2) is represented by Formula 3, the Structural Unit (2) may be a structural unit represented by one of Formulae 3-1 to 3-4, but is not limited thereto:

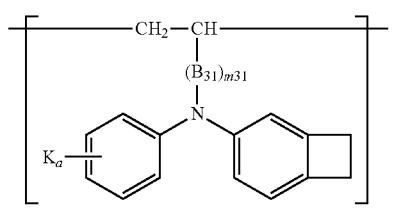

3-1

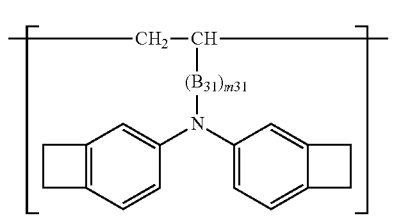

3-2

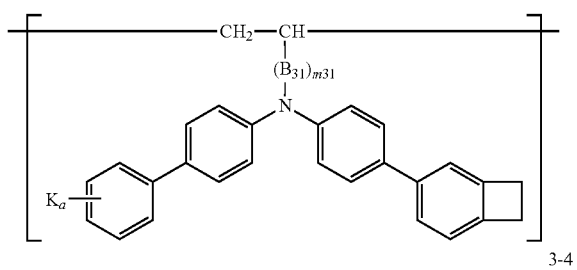

3-3

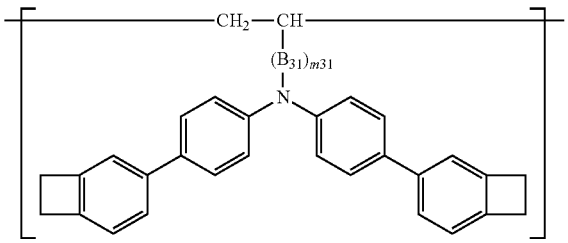

3-4

In Formulae 3-1 to 3-4, $B_{31}$ and m31 are the same as defined in connection with Formula 3;

$K_a$ is selected from a hydrogen atom, a cross-linking group, a halogen atom, a cyano group, an alkyl group, an aryl group, an amino group, an alkoxy group, a carbazolyl group, a fluorenyl group, a heterocyclic group, and a silyl group.

For example, when Structural Unit (2) is represented by Formula 4, the Structural Unit (2) may be a structural unit represented by one of Formulae 4-1 and 4-2, but is not limited thereto:

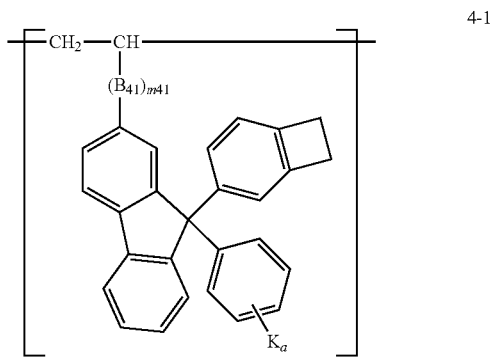

4-1

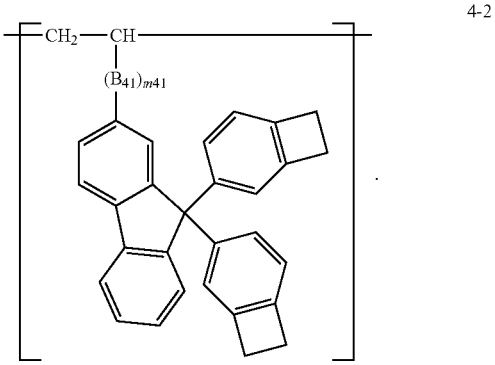

4-2

In Formulae 4-1 and 4-2

$B_{41}$ and m41 are the same as described in connection with Formula 4;

$K_a$ is selected from a hydrogen atom, a cross-linking group, a halogen atom, a cyano group, an alkyl group, an aryl group, an amino group, an alkoxy group, a carbazolyl group, a fluorenyl group, a heterocyclic group, and a silyl group.

For example, when Structural Unit (1) is represented by Formula 1, the Structural Unit (1) may be selected from Structures A101 to A121, but is not limited thereto:

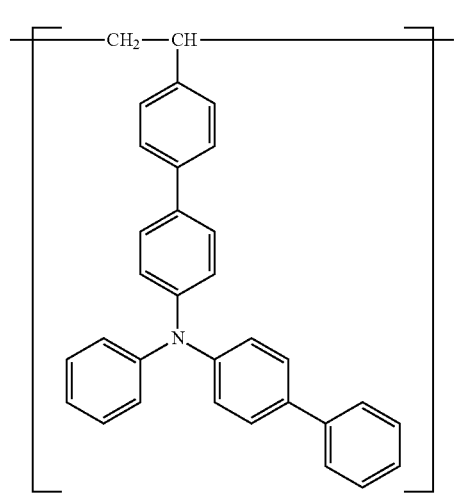

A101

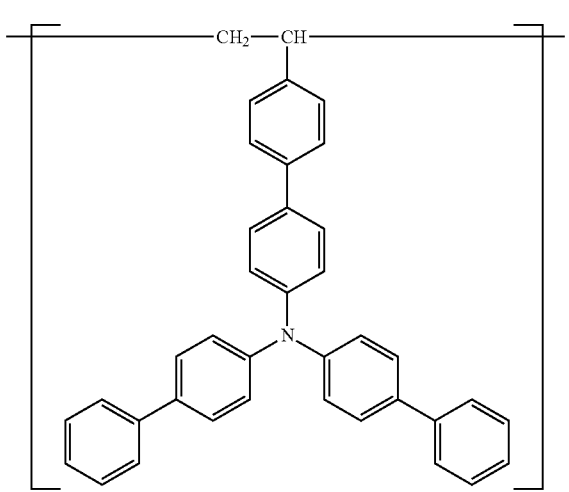

A102

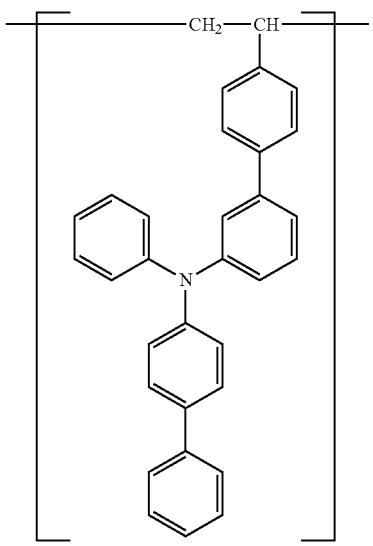

A103

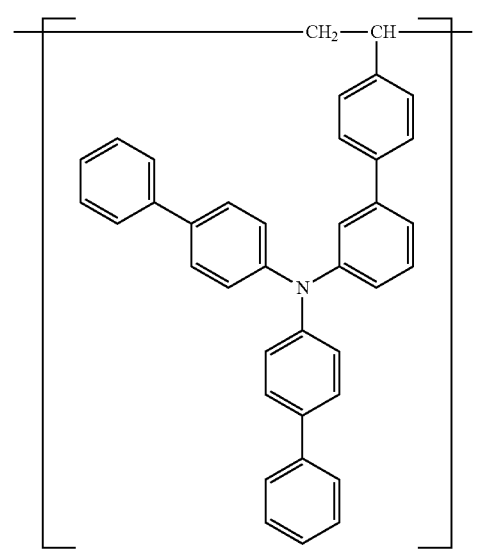

A104

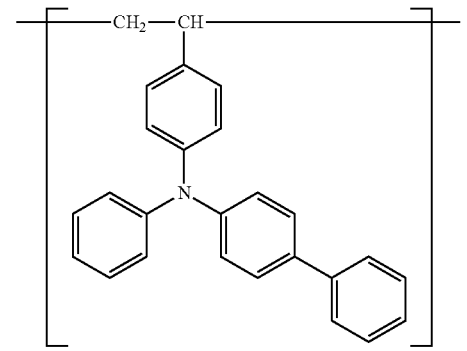

A105

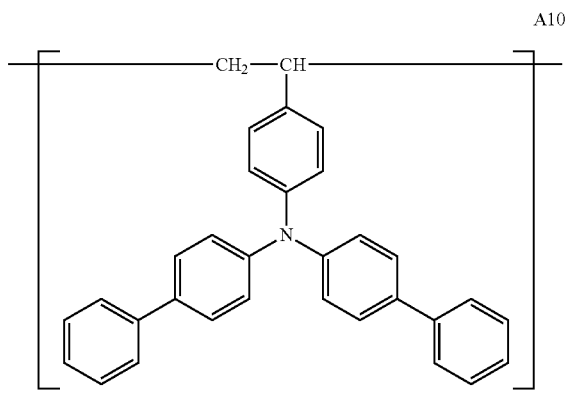
A106
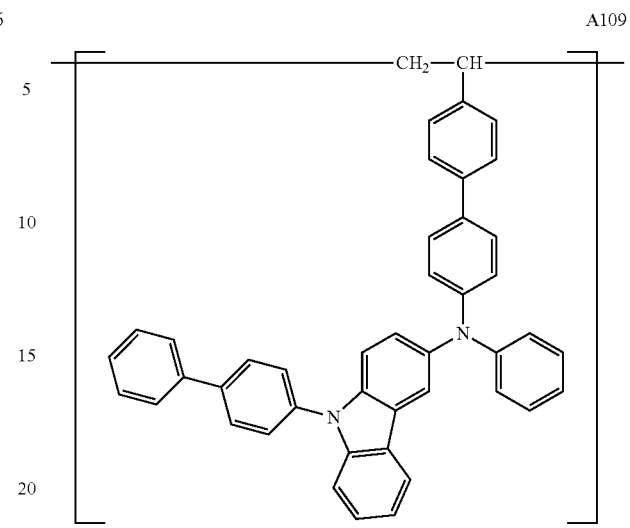
A109
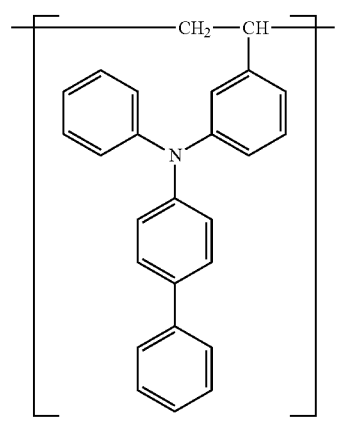
A107
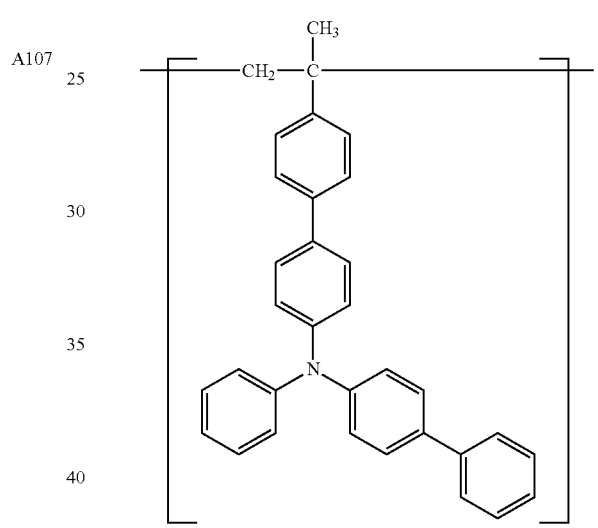
A110
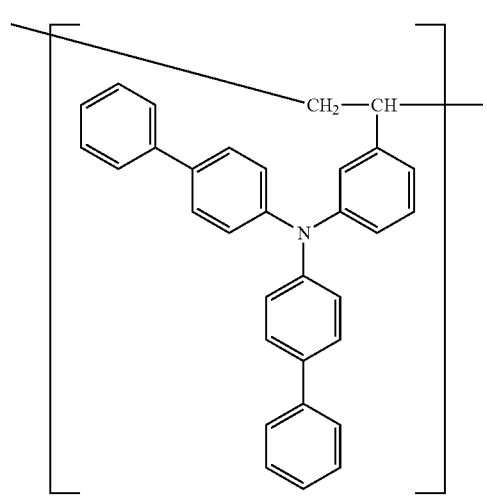
A108
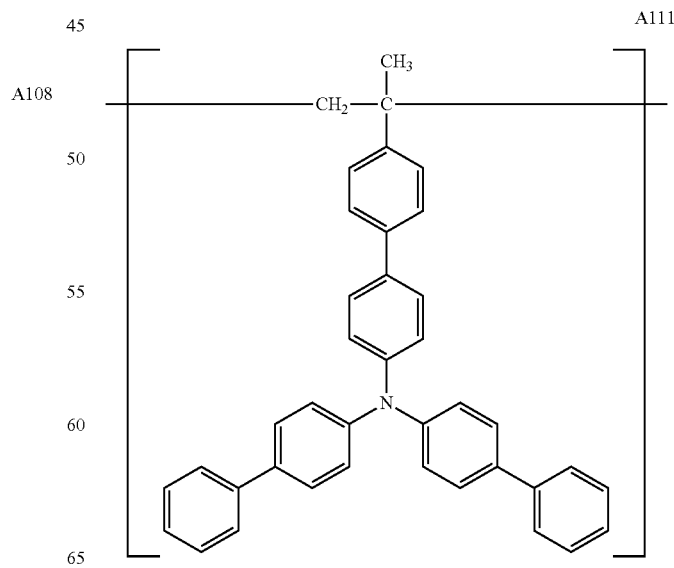
A111

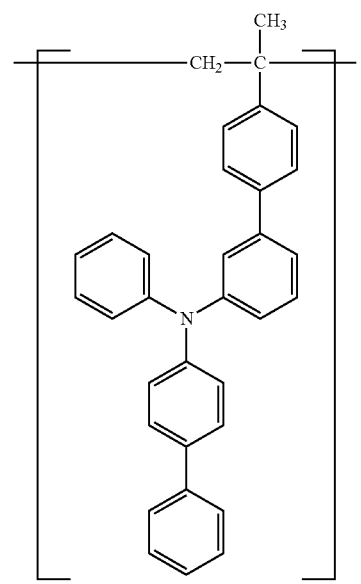
A112
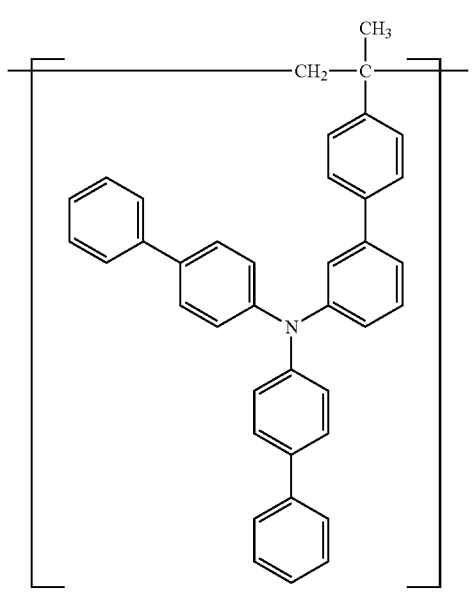
A113
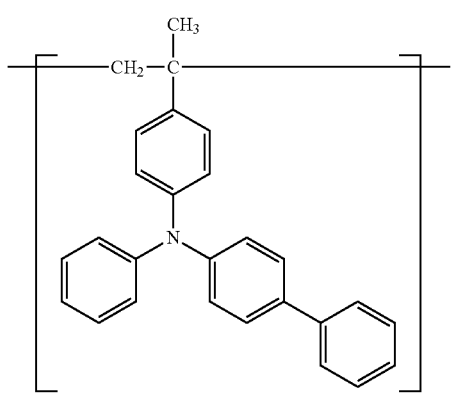
A114
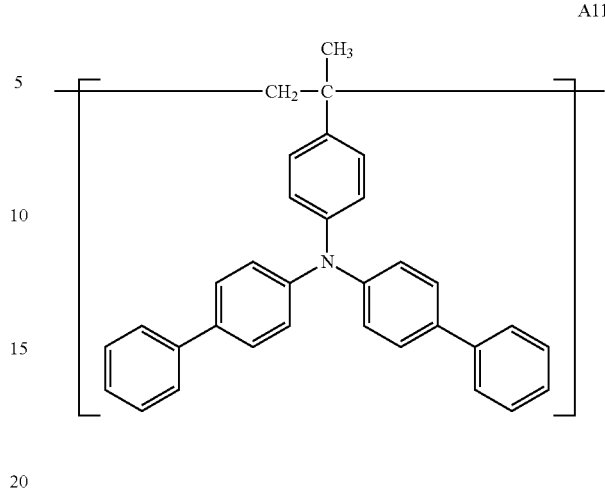
A115
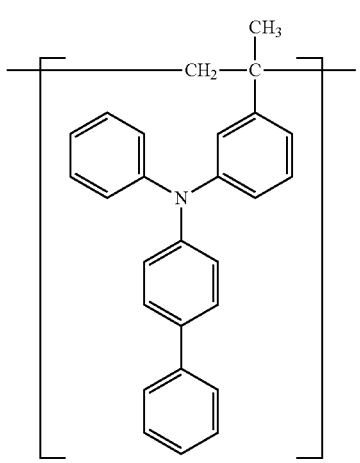
A116
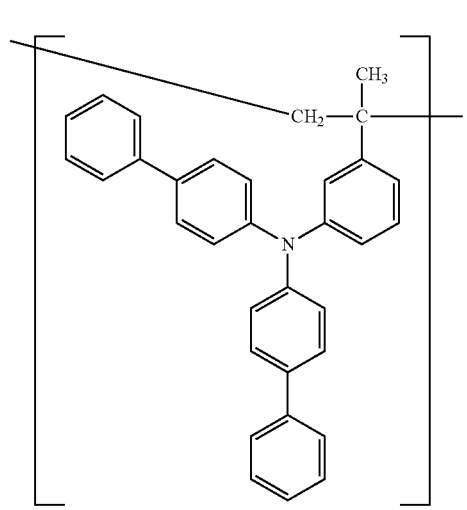
A117

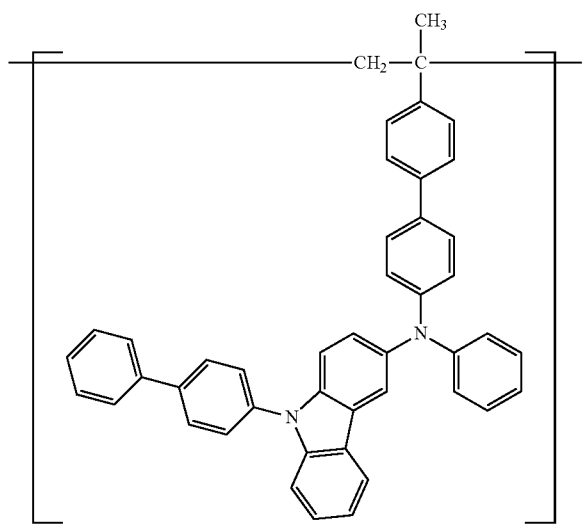
A118
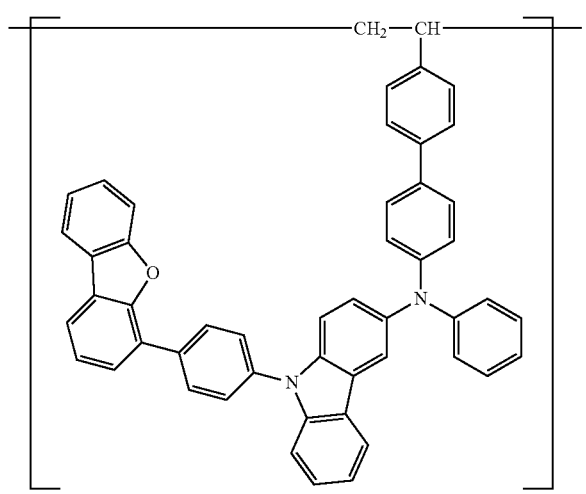
A119
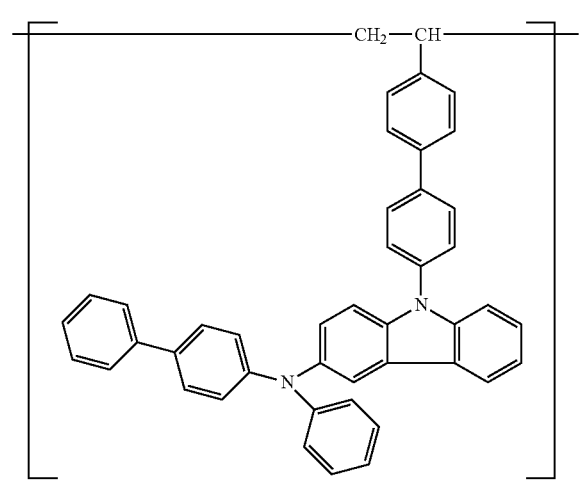
A120
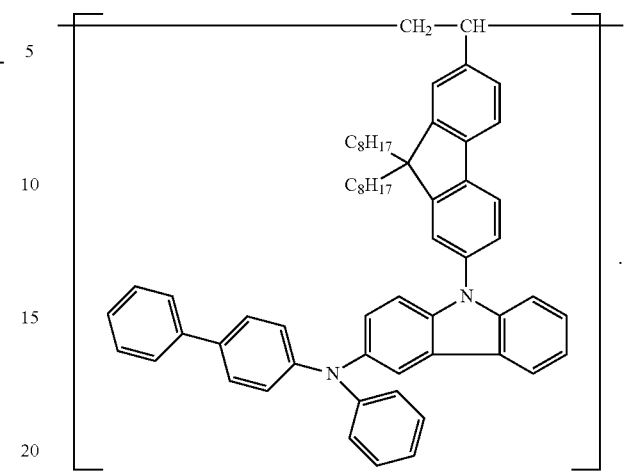
A121
In some embodiments, Structural Unit (1) represented by Formula 1 may be selected from Structures A101, A108, A109, and A119 to A121, but is not limited thereto.
For example, Structural Unit (1) represented by Formula 2 may be selected from Structures A201 to A212, but is not limited thereto:
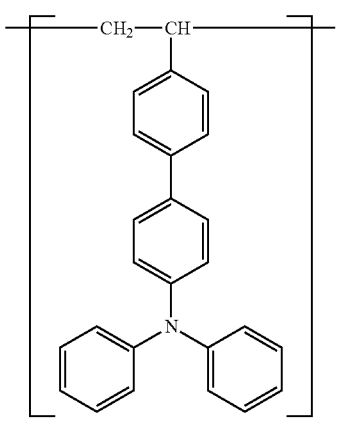
A201
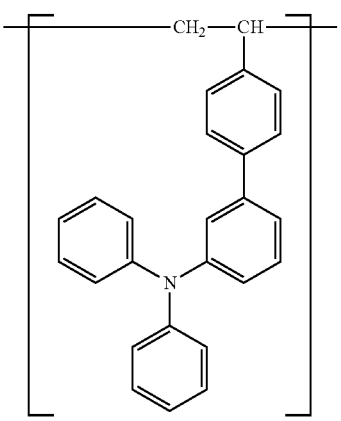
A202

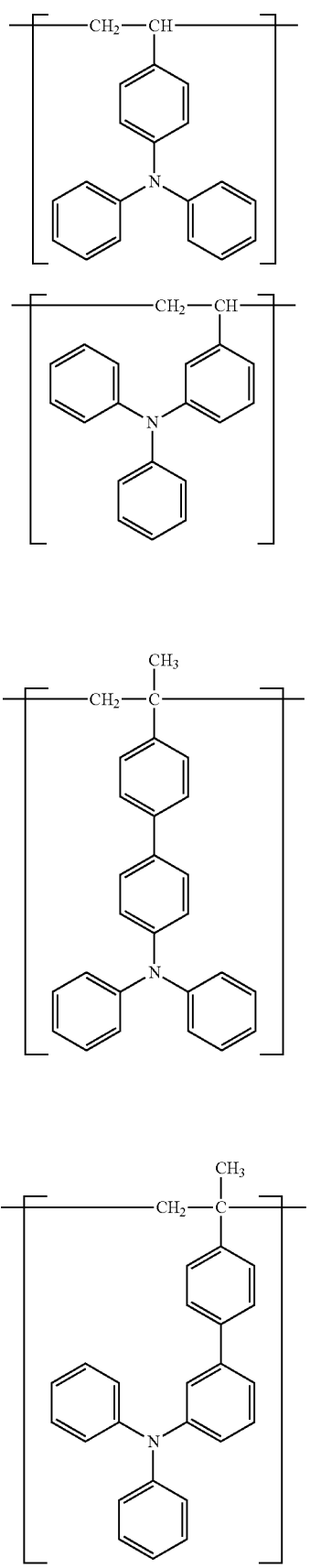
A203
A204
A205
A206
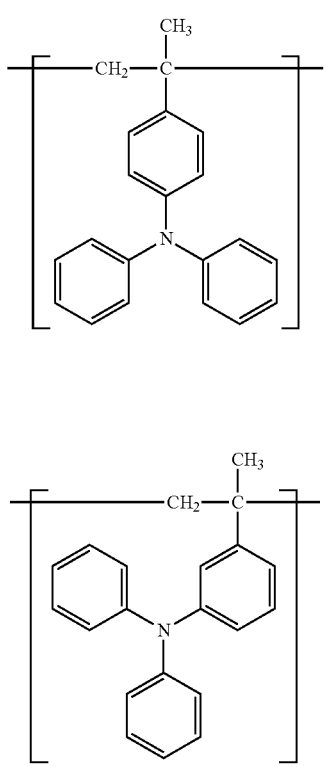
A207
A208
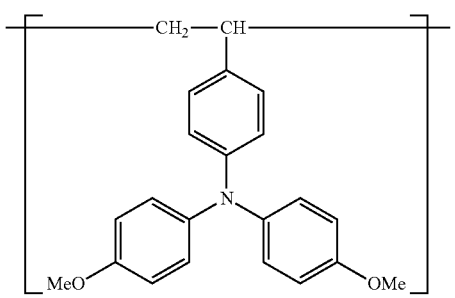
A209
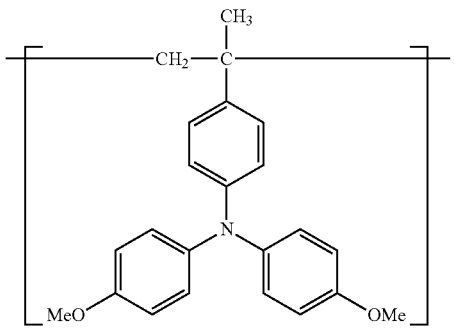
A210

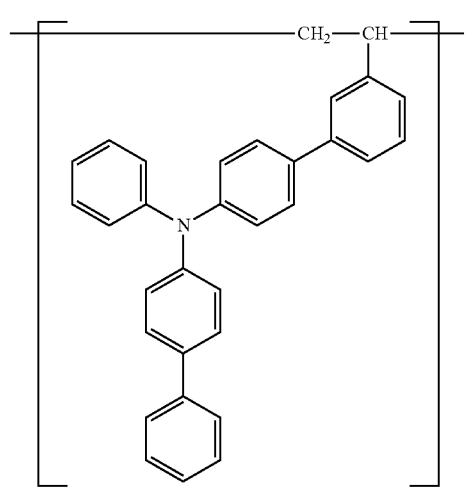
A211
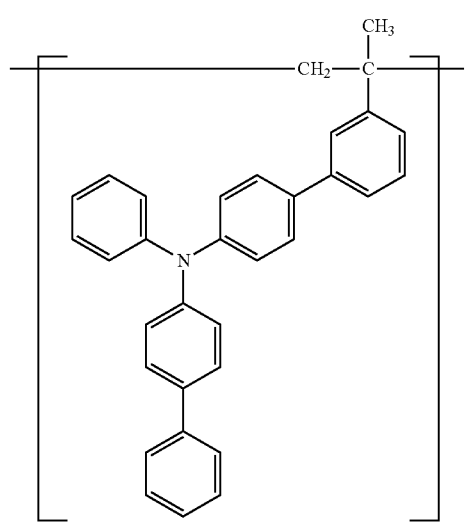
A212
In some embodiments, when Structural Unit (1) is represented by Formula 2, the Structural Unit (1) may be selected from Structures A201 and A202, but is not limited thereto.
For example, Structural Unit (2) represented by one of Formulae 3 and 4 may be selected from Structures B101 to B118, but is not limited thereto:
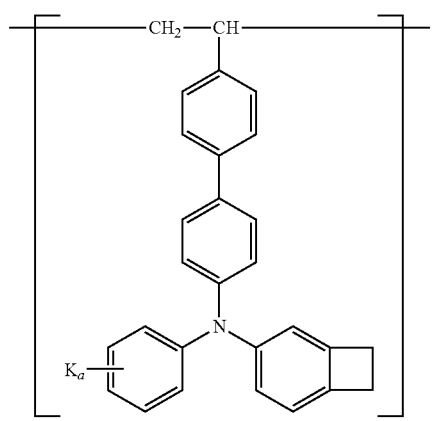
B101
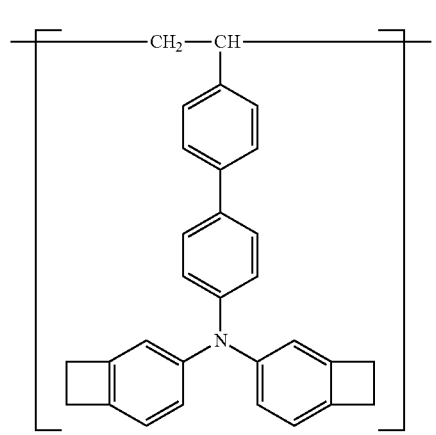
B102
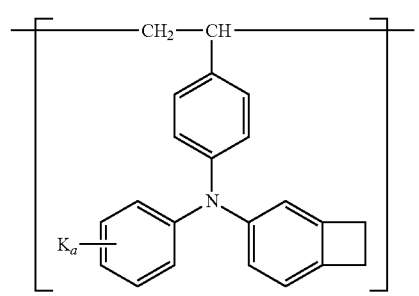
B103
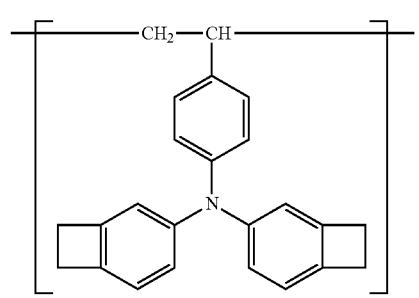
B104
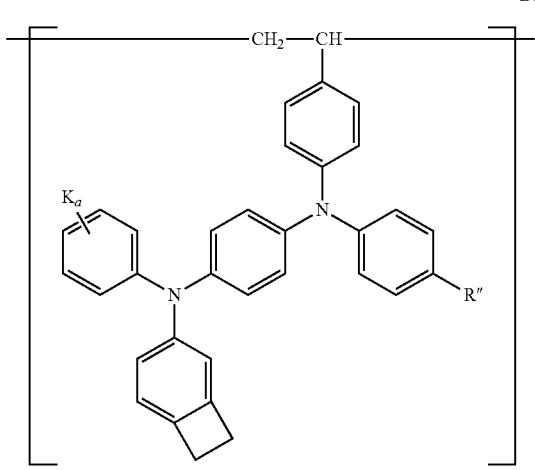
B105

B106
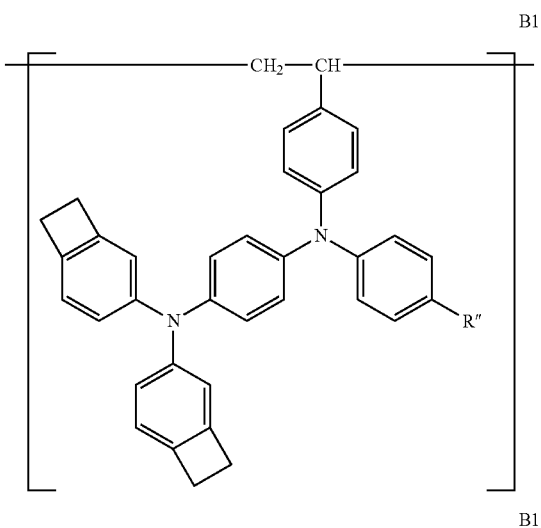
B107
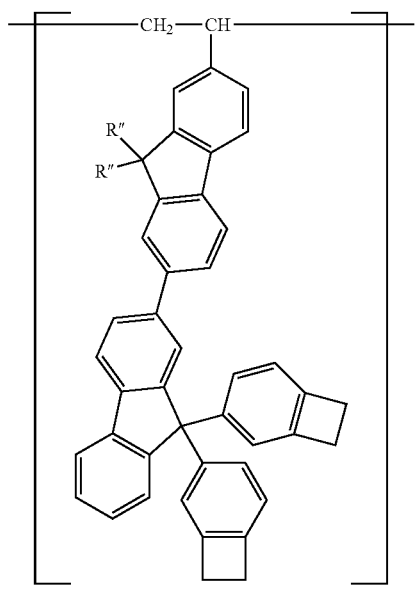
B108
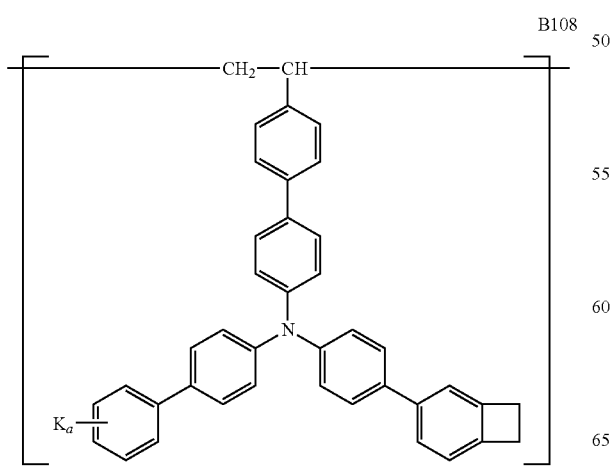
B109
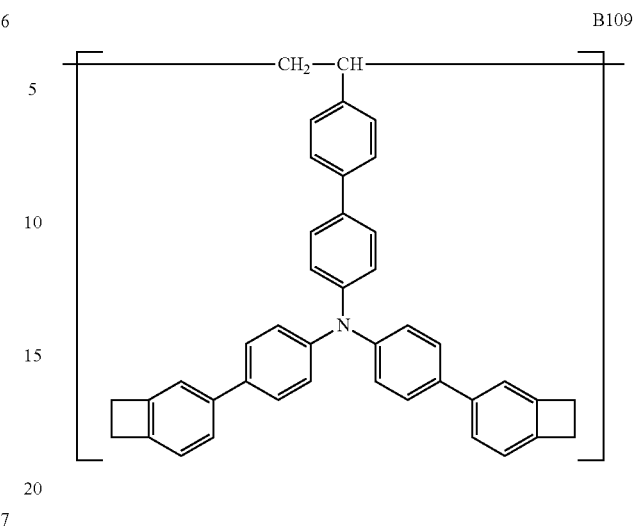
B110
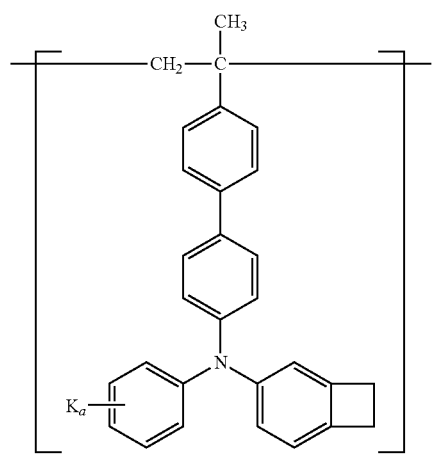
B111
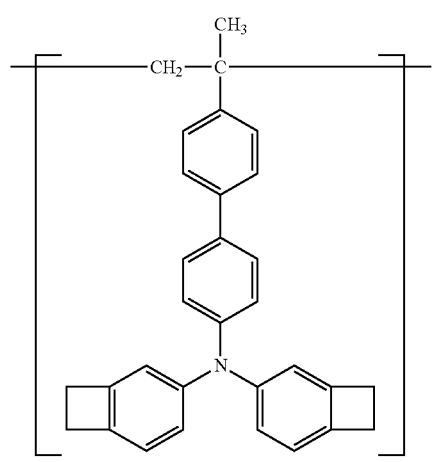

B112 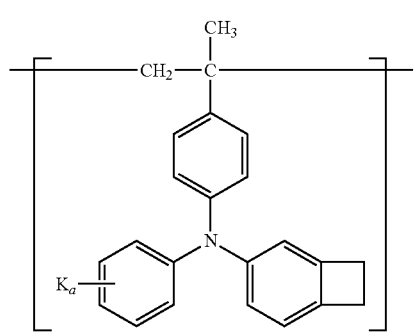
B113 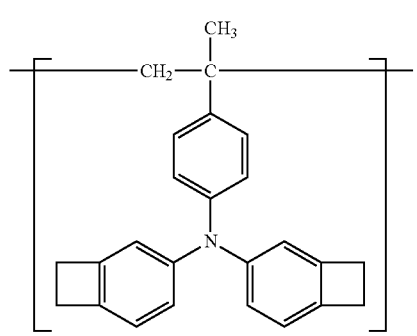
B114 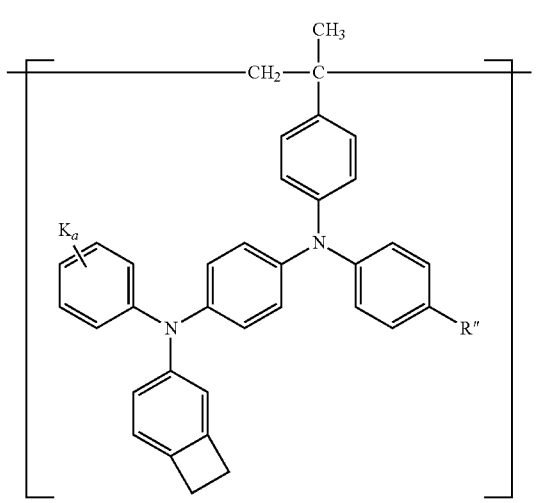
B115 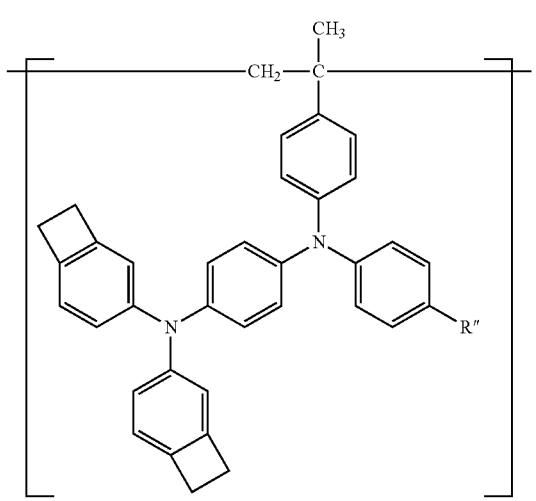
B116 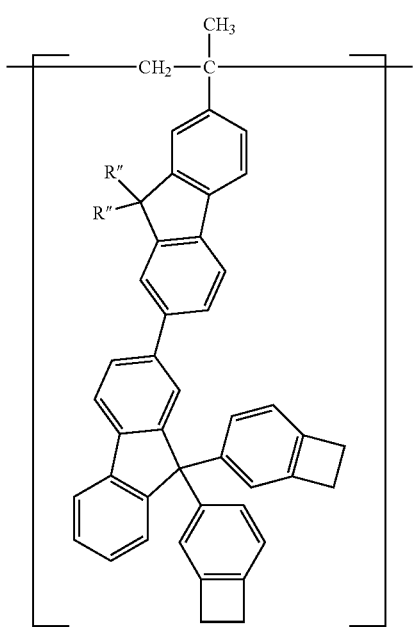
B117 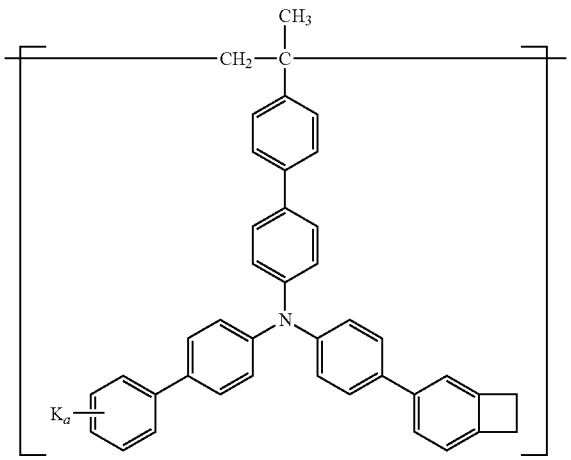
B118 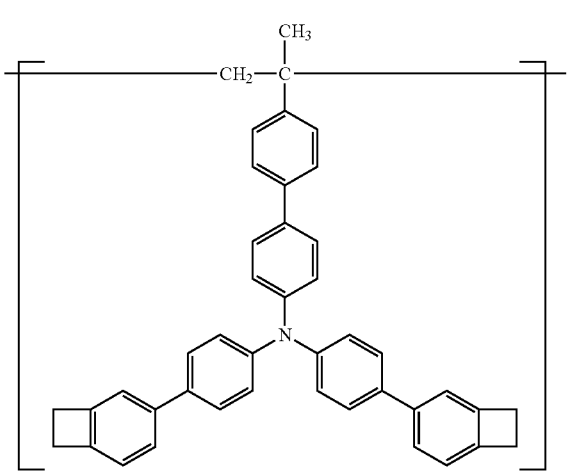

In Structures B101 to B118,

R" is an alkyl group; and $K_a$ is selected from a hydrogen atom, a cross-linking group, a halogen atom, a cyano group, an alkyl group, an aryl group, an amino group, an alkoxy group, a carbazolyl group, a fluorenyl group, a heterocyclic group, and a silyl group.

In some embodiments, Structural Unit (2) represented by one of Formulae 3 and 4 may be selected from structures B101, B102, B106, B110, B111, and B115, but is not limited thereto.

The structure of the charge-transporting material is not limited. For example, the charge-transporting material may be one of a random copolymer, an alternating copolymer, a periodic copolymer, and a block copolymer, but is not limited thereto.

In some embodiments, the charge-transporting material may include

Structural Unit (1) represented by Formula 1; and

Structural Unit (2) represented by one of Formulae 3 and 4.

In these embodiments, the structure and electron state of a triphenyl amine unit included in Structural Unit (1) may be similar to the structure and electron state of a triphenyl amine unit included in Structural Unit (2). Structural unit (1) and Structural Unit (2) all have excellent charge transport performance, and have a small energy barrier therebetween. Accordingly, charges may be readily transported between Structural Unit (1) and Structural Unit (2). Thus, such a charge-transporting material may have excellent charge transport performance, and an organic light-emitting device including the charge-transporting material has a low driving voltage and high current efficiency.

In these embodiments, the charge-transporting material has excellent charge resistance. Accordingly, when the charge-transporting material is used as a hole-transporting material, damages caused by electrons may be reduced, leading to an improvement in the lifespan of an organic light-emitting device. Thus, an organic light-emitting device including the charge-transporting material has excellent durability.

In some embodiments, a molar ratio of Structural Unit (1) to Structural Unit (2) may be in a range of about 99:1 to about 80:20, but is not limited thereto.

In some embodiments, a molar ratio of Structural Unit (1) to Structural Unit (2) may be in a range of about 95:5 to about 85:15, but is not limited thereto.

In some embodiments, the sum of amounts of Structural Unit (1) and Structural Unit (2) may be 100%. While not wishing to be bound by theory, it is understood that a charge-transporting material having these molar ratios may retain a sufficient resistance (insolubility) to a solvent during cross-linking. Accordingly, even when one layer is formed on another layer including the charge-transporting material, the other layer including the charge-transporting material may not be completely, or may be barely, dissolved in a solvent.

In some embodiments, the charge-transporting material may include

Structural Unit (1) represented by Formula 2; and

Structural Unit (2) represented by Formula 3.

In these embodiments, Structural Unit (2) has the same structure as Structural Unit (1), except that a cross-linking group is not included. In this charge-transporting material, a triphenyl amine unit included in Structural Unit (1) may be very similar to a triphenyl amine unit included in Structural Unit (2) in terms of structure and/electron state. Structural Unit (1) and Structural Unit (2) all have excellent charge transport performance, and have a small energy barrier therebetween. Accordingly, charges may be readily transported between Structural Unit (1) and Structural Unit (2). Thus, such a charge-transporting material may have excellent charge transport performance, and an organic light-emitting device including the charge-transporting material has a low driving voltage and high current efficiency.

In some embodiments, a molar ratio of Structural Unit (1) to Structural Unit (2) may be in a range of about 99:1 to about 50:50, but is not limited thereto.

In some embodiments, a molar ratio of Structural Unit (1) to Structural Unit (2) may be in a range of about 95:5 to about 70:30, but is not limited thereto.

In some embodiments, the sum of amounts of Structural Unit (1) and Structural Unit (2) may be 100%. While not wishing to be bound by theory, it is understood that charge-transporting material having these molar ratios may retain a sufficient resistance (insolubility) to a solvent during cross-linking. Accordingly, even when one layer is formed on another layer including the charge-transporting material, the other layer including the charge-transporting material may not be completely, or may be barely, dissolved in the solvent.

A weight average molecular weight (Mw) of the charge-transporting material is not limited, and may be in a range of about 5,000 Daltons (Da) to about 500,000 Da. For example, a weight average molecular weight of the charge-transporting material may be in a range of about 10,000 Da to about 200,000 Da, but is not limited thereto. While not wishing to be bound by theory, it is understood that within these ranges, the viscosity of a coating material for forming the layer including the charge-transporting material (for example, a hole injection layer and/or a hole transport layer) may be appropriately controlled and the formed layer may have a uniform thickness. A method of measuring the weight average molecular weight (Mw) is not limited, and the weight average molecular weight (Mw) may be measured and calculated by using known methods. For the weight average molecular weight (Mw) used herein, the values obtained in the following examples were used.

A charge-transporting material including Structural Unit (1) represented by one of Formulae 1 and 2; and Structural Unit (2) represented by one of Formulae 3 and 4 may be prepared by co-polymerizing Monomer (1) represented by one of Formulae 1' and 2' and Monomer (2) represented by one of Formulae 3' and 4', but is not limited thereto:

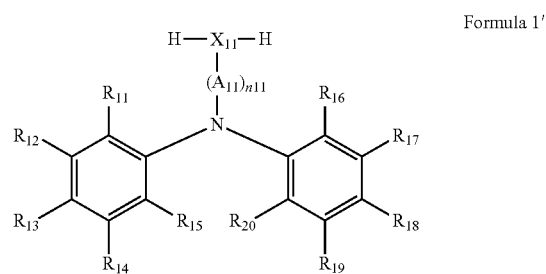

Formula 1'

-continued

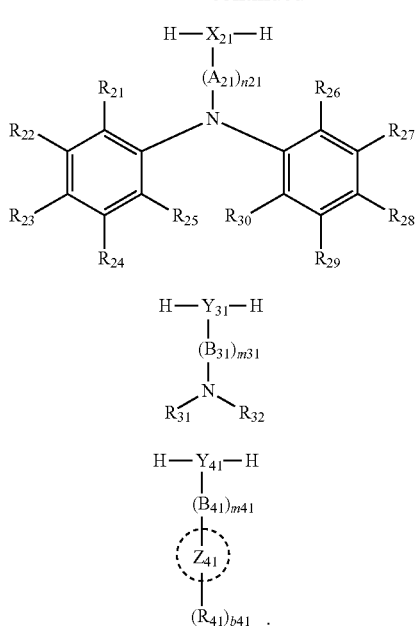

Formula 2'

Formula 3'

Formula 4'

In Formulae 1', 2', 3', and 4', $X_{11}$, $X_{21}$, $Y_{31}$, $Y_{41}$, $A_{11}$, $A_{21}$, $B_{31}$, $B_{41}$, n11, n21, m31, m41, $Z_{41}$, $R_{11}$ to $R_{20}$, $R_{21}$ to $R_{32}$, $R_{41}$, and b41 are the same as described in connection with Formulae 1 to 4.

Monomers used to prepare the charge-transporting material are synthesized by using known synthetic methods, and structures thereof are identifiable by NMR and LC-MS.

A polymerization method for the charge-transporting material is not limited, and for example, may be selected from known polymerization methods including a radical polymerization, an anionic polymerization, and a cationic polymerization. In some embodiments, the polymerization method for the charge-transporting material may be a radical polymerization, but is not limited thereto.

A solvent used in the polymerization method for the charge-transporting material may be, for example, selected from toluene, xylene, diethyl ether, chloroform, ethyl acetate, dichloromethane, tetrahydrofuran, acetone, acetonitrile, N,N-dimethylformamide, dimethylsulfoxide, anisole, and hexamethyl triamide phosphate. In some embodiments, the solvent may be selected from toluene and tetrahydrofuran. These solvents may be used alone or in combination. Monomers used for polymerizing to prepare a charge-transporting material according to an embodiment may have high solubility with respect to the solvent.

A concentration of a monomer in the solvent (in the embodiment including a plurality of monomers, a total of monomers) may be in a range of 5 to 90 percent by weight (wt %) based on the entire reaction solution. For example, a concentration of a monomer in the solvent may be in a range of 10 to 80 wt %, but is not limited thereto.

A polymerization temperature may be controlled in a range of 40 to 100° C. in consideration of a molecular amount, but is not limited thereto.

A polymerization reaction may be performed for 30 minutes to 24 hours, but is not limited thereto.

When the monomer is added to the solvent, the resultant solvent may be subjected to deaeration before a polymerization initiator is added. For example, the deaeration may be performed by freeze deaeration, using inert gas, such as nitrogen gas, but is not limited thereto.

The polymerization initiator may be any known material, and may be, for example, selected from benzophenone, benzoyl peroxide, acetyl peroxide, lauroyl peroxide, and azobisisobutyronitrile, but is not limited thereto. An amount of the polymerization initiator added herein may be in a range of, for example, 0.0001 moles (mol) to 1 mol based on 1 mol of all monomers used in preparing the charge-transporting material, but is not limited thereto.

A main chain terminal of the charge-transporting material may be appropriately defined according to a material used, and may be, for example, a hydrogen atom, but is not limited thereto.

A synthetic method for the charge-transporting material may be easily understood by one of ordinary skill in the art by referring to Synthesis Examples.

Organic Light-Emitting Device

The charge-transporting material may be used in an organic light-emitting device. Accordingly, an aspect of embodiments provides an organic light-emitting device including:

a first electrode;
a second electrode; and
an organic layer disposed between the first electrode and the second electrode,
wherein the organic layer includes the charge-transporting material. To produce an organic light-emitting device having a long lifespan and high efficiency, the charge-transporting material may be included in a hole injection layer and/or a hole transport layer.

The charge-transporting material may be appropriate for use in an organic light-emitting device that is manufactured by using a wet process.

FIG. 1 illustrates a cross-sectional view of an organic light-emitting device 100 according to an embodiment.

The organic light-emitting device 100 of FIG. 1 has a structure of first electrode 120/hole injection layer 130/hole transport layer 140/emission layer 150/electron transport layer 160/electron injection layer 170/second electrode 180. However, the structure of the organic light-emitting device is not limited thereto. In some embodiments, the organic light-emitting device 100 may have a structure of first electrode/single layer having hole injection capability and hole transport capability/emission layer/electron transport layer/second electrode or a structure of first electrode/single layer having hole injection capability and hole transport capability/emission layer/electron transport layer/electron injection layer/second electrode.

The organic light-emitting device 100 may be a top-emission type organic light-emitting device or a bottom-emission type organic light-emitting device.

Hereinafter, the organic light-emitting device 100 according to the present embodiment will be described by referring to FIG. 1.

The organic light-emitting device 100 may include a substrate 110, a first electrode 120 disposed on the substrate 110, a hole injection layer 130 disposed on the first electrode 120, a hole transport layer 140 disposed on the hole injection layer 130, an emission layer 150 disposed on the hole transport layer 140, an electron transport layer 160 disposed on the emission layer 150, an electron injection layer 170 disposed on the electron transport layer 160, and a second electrode 180 disposed on the electron injection layer 170.

The substrate 110 may be any substrate that is used in an organic light-emitting device. For example, the substrate 110 may be a glass substrate, a semiconductor substrate, or a transparent plastic substrate.

The first electrode 120 may be, for example, an anode, and may be formed on the substrate 110 by, for example, deposition or sputtering. For example, the first electrode 120 may be formed as a transmissible electrode including a metal, alloy, or conductive compound, each having a high work function. The first electrode 120 may be formed by using, for example, a material that is transparent and highly conductive, and such a material may be indium tin oxide (ITO), indium zinc oxide (IZO), tin oxide ($SnO_2$), or zinc oxide (ZnO). The first electrode 120 may be formed as a reflective electrode including magnesium (Mg), aluminum (Al), or the like.

The hole injection layer 130 is a layer that facilitates injection of holes from the first electrode 120, and may be formed on the first electrode 120 by, for example, vacuum deposition, spin coating, or ink jetting. A charge-transporting material according to an embodiment has high solubility to an organic solvent, and accordingly, may be used when a hole injection layer is formed by using a wet process, for example, spin coating, casting, printing, or Langmuir-Blodgett (LB). When these methods are used, the solvent is not limited as long as the solvent dissolves a material for forming a hole injection layer.

The hole injection layer 130 may have, for example, a thickness (dry thickness) of about 10 nanometers (nm) to about 500 nm, or a thickness of about 10 nm to about 100 nm.

To form the hole injection layer 130, any known material may be used instead of the charge-transporting materials described above. For example, N,N'-diphenyl-N,N'-bis-[4-(phenyl-m-tolyl-amino)-phenyl]-biphenyl4,4'-diamine (DNTPD), a phthalocyanine compound, such as a copper phthalocyanine, 4,4',4"-tris(3-methyl phenyl phenyl amino) triphenyl amine (m-MTDATA), N,N'-di(1-naphthyl)-N,N'-diphenylbenzidine (NPB), 4,4',4"-tris{N,N-diphenylamino group}triphenyl amine (TDATA), 4,4',4"-tris(N,N-2-naphthylphenylamino)triphenyl amine (2-TNATA), polyaniline/dodecylbenzenesulfonic acid (PANI/DBSA), poly(3,4-ethylenedioxythiophene/poly(4-styrenesulfonate) (PEDOT/PSS), polyaniline/camphor sulfonic acid (PANI/CSA), or polyaniline/poly(4-styrenesulfonate) (PANI/PSS) may be used.

When the charge-transporting material is used in a wet process, an amount of the charge-transporting material may be in a range of 0.1 to 20 wt %, for example 0.1 to 10 wt %, based on a total of a coating material.

When the charge transport material is used in a hole injection layer, an amount of the charge transport material may be in a range of 50 to 100 wt % (dry weight), for example, 80 to 100 wt % (dry weight), based on the entire hole injection layer.

The hole transport layer 140 is a layer including a hole-transporting material that transports holes, and may be formed on the hole injection layer 130 by vacuum deposition, spin coating, or ink jetting. The charge-transporting material according to an embodiment may have high solubility to an organic solvent, and accordingly, may be used when the hole transport layer is formed by using a wet process, for example, spin coating, casting, printing, or LB. When these methods are used, the solvent is not limited as long as the solvent dissolves a material for forming a hole transport layer.

The hole transport layer 140 may have, for example, a thickness (dry thickness) of about 5 nm to about 500 nm, or a thickness (dry thickness) of about 10 nm to about 100 nm. To form the hole transport layer 140, any known material may be used instead of the charge-transporting materials described above. For example, a carbazole derivative, such as N-phenylcarbazole, polyvinylcarbazole, N,N'-bis(3-methylphenyl)-N,N'-diphenyl-[1,1-biphenyl]-4,4'-diamine (TPD), 4,4',4"-tris(N-carbazolyl)triphenylamine (TCTA), or N N'-bis(naphthalen-2-yl)-N,N'-bis(phenyl)-benzidine (NPB) may be used.

When the charge-transporting material is used in a hole injection layer, an amount of the charge-transporting material may be in a range of 50 to 100 wt % (dry weight), for example, 80 to 100 wt % (dry weight), based on the entire hole injection layer.

The emission layer 150 may be a layer that emits phosphorescent light or fluorescent light, and may be formed on the hole transport layer 140 by vacuum deposition, spin coating, or ink jetting. The emission layer 150 may include a host material and a dopant material, and optionally, the charge-transporting material described above. A charge-transporting material according to an embodiment has high solubility in an organic solvent, and accordingly, the charge-transporting material may be used in forming an emission layer when the emission layer is formed by using a wet process, for example, spin coating, casting, printing, or LB. When these methods are used, the solvent is not limited as long as the solvent dissolves a material for forming an emission layer.

The emission layer 150 may have, for example, a thickness (dry thickness) of about 10 nm to about 100 nm, or a thickness (dry thickness) of about 20 nm to about 60 nm.

In some embodiments, the emission layer 150 may instead include other host materials, including 1,3-bis(carbazole)benzene (mCP), tris(8-quinolinolate)aluminum ($Alq_3$), 4,4'-N,N'-dicarbazole-biphenyl (CBP), poly(n-vinylcarbazole) (PVK), 9,10-di(naphthalene-2-yl)anthracene (ADN), TCTA, 1,3,5-tris(N-phenylbenzimidazole-2-yl)benzene (TPBI), 3-tert-butyl-9,10-di(naphth-2-yl)anthracene (TBADN), distyrylarylene (DSA), 4.4'-bis(9-carbazole)-2,2'-dimethylbiphenyl (dmCBP), and 2,4,6-tris(diphenylamino)-1,3,5-triazine.

The emission layer 150 may be formed as an emission layer that emits a particular color of light. For example, the emission layer 150 may be formed as a red emission layer, a green emission layer, or a blue emission layer.

When the emission layer 150 is a blue emission layer, any known blue dopant material may be used. For example, a perilene and a derivative thereof, or an iridium (Ir) complex, such as bis[2-(4,6-difluorophenyl)pyridinate]picolinate iridium (III) (Flrpic), may be used.

When the emission layer 150 is a red emission layer, any known red dopant material may be used. For example, rubrene and a derivative thereof, 4-(dicyanomethylene)-2-methyl-6-[p-(dimethylamino)styryl]-4H-pyran (DCM) and a derivative thereof, an iridium complex, such as $Ir(piq)_2$ (acac)(bis(1-phenylisoquinoline)(acetylacetonate)iridium (III)), an osmium (Os) complex, or a platinum complex may be used.

When the emission layer 150 is a green emission layer, any known green dopant material may be used. For example, coumarin, a derivative thereof, an iridium complex, such as tris(2-phenylpyridine)iridium (III) ($Ir(ppy)_3$), tris(2-(3-p-xylyl)phenyl)pyridine iridium (III) (TEG), or tris(acetylacetonato)iridium (III) ($Ir(acac)_3$), or the like may be used.

When the charge-transporting material is used in an emission layer, an amount of the charge-transporting material may be in a range of 10 to 100 wt % (dry weight), for example 50 to 100 wt % (dry weight) based on the entire emission layer.

The electron transport layer 160 may be a layer including an electron transport material that transports electrons. The electron transport layer 160 may be formed on the emission layer 150 by vacuum deposition, spin coating, ink jetting, or the like.

The electron transport layer 160 may have, for example, a thickness of about 10 nm to about 100 nm, or a thickness of about 15 nm to about 70 nm.

The electron transport layer 160 may be formed by using any known electron transport material, for example, a Li complex, such as lithium quinolate (LiQ), a quinoline derivative, such as tris(8-quinolinato)aluminum ($Alq_3$), 1,2,4-triazole derivative (TAZ), bis(2-methyl-8-quinolinato)-(p-phenylphenolate)-aluminum (BAlq), or beryllium bis(benzoquinoline 10-olate) ($BeBq_2$). These materials for forming an electron transport layer may be commercially available products or synthetic products. Examples of such commercially available products are KLET-01, KLET-02, KLET-03, KLET-10, and KLET-M1 (products of Chemipro Kasei Company). These materials for forming an electron transport layer may be used alone or in combination of two of these.

When the charge-transporting material is used in an electron transport layer, an amount of the charge-transporting material may be in a range of 50 to 100 wt % (dry weight), or, for example, 90 to 100 wt % (dry weight), based on the entire electron transport layer.

The electron injection layer 170 is a layer that facilitates injection of electrons from the second electrode 180, and may be formed on the electron transport layer 160 by, for example, vacuum deposition.

The electron injection layer 170 may have, for example, a thickness of about 0.1 nm to about 10 nm, or a thickness of about 0.3 nm to about 9 nm.

The electron injection layer 170 may be formed by using a known electron injection material, and may be formed by using, for example, lithium fluoride (LiF), sodium chloride (NaCl), cesium sulfide (CsF), lithium oxide ($Li_2O$), barium oxide (BaO), or the like.

When the charge-transporting material is used as an electron injection layer, an amount of the charge-transporting material may be in a range of 50 to 100 wt % (dry weight), or, for example, 90 to 100 wt % (dry weight).

The second electrode 180 may be, for example, a cathode, and may be formed on the electron injection layer 170 by depositing or sputtering. For example, the second electrode 180 may be formed as a reflective electrode including a metal, alloy, or conductive compound, each having a small work function. The second electrode 180 may include, for example, lithium (Li), magnesium (Mg), aluminum (Al), aluminum-lithium (Al—Li), calcium (Ca), magnesium-indium (Mg—In), or magnesium-silver (Mg—Ag). The second electrode 180 may be formed as a transmissible electrode including indium tin oxide (ITO), or indium zinc oxide (IZO).

Hereinbefore, an example of the organic light-emitting device 100 has been described. However, the structure of the organic light-emitting device 100 according to an embodiment is not limited to the embodiments described above. The organic light-emitting device 100 may have various other known structures for an organic light-emitting device. For example, the organic light-emitting device 100 may have at most one layer selected from the hole injection layer 130, the hole transport layer 140, the electron transport layer 160, and the electron injection layer 170. Layers constituting the organic light-emitting device 100 may each have a single- or multiple-layered structure.

The organic light-emitting device 100 may include a hole blocking layer disposed between the hole transport layer 140 and the emission layer 150 to prevent diffusion of triplet excitons or holes into the electron transport layer 160. The hole blocking layer may be formed by using, for example, an oxadiazole derivative, a triazole derivative, or a phenanthroline derivative.

Hereinafter, a charge-transporting material according to embodiments and an organic light-emitting device according to embodiments will be described by referring to Synthesis Examples and Examples. However, embodiments are not limited to the following Synthesis Examples and Examples.

EXAMPLE

Analysis was carried out based on the method described in Synthesis Examples.

(1) Measurement of Number Average Molecular Weight, Weight Average Molecular Weight, and Dispersity A number average molecular weight (Mn), a weight average molecular weight (Mw), and a dispersity (Mw/Mn) were measured using permeation chromatography (GPC) using polystyrene as a reference sample under the following condition.

Analysis Equipment: LC-20AD (available from Shimadzu)

Column: Polymer PLgel MIXED-B (available from Polymer Laboratories, Inc.)

Column temperature: 40° C.

Flow rate: 1.0 mL/minutes

Injection amount: 20 μL

Solvent: tetrahydrofuran (THF) (at concentration of about 0.05 weight %)

Detector: UV-VIS detector (available from Shimadzu, Product name: SPD-10AV)

Reference sample: polystyrene

Synthesis Example 1-1: Synthesis of Monomer A109

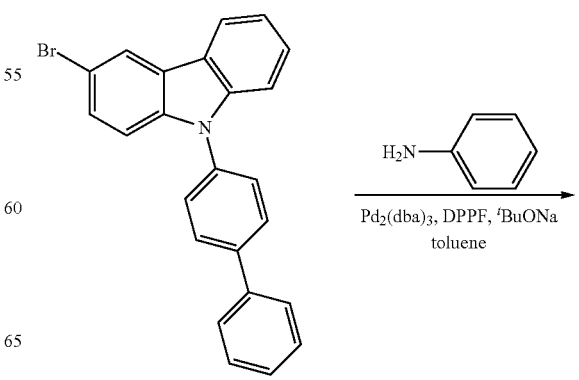

-continued

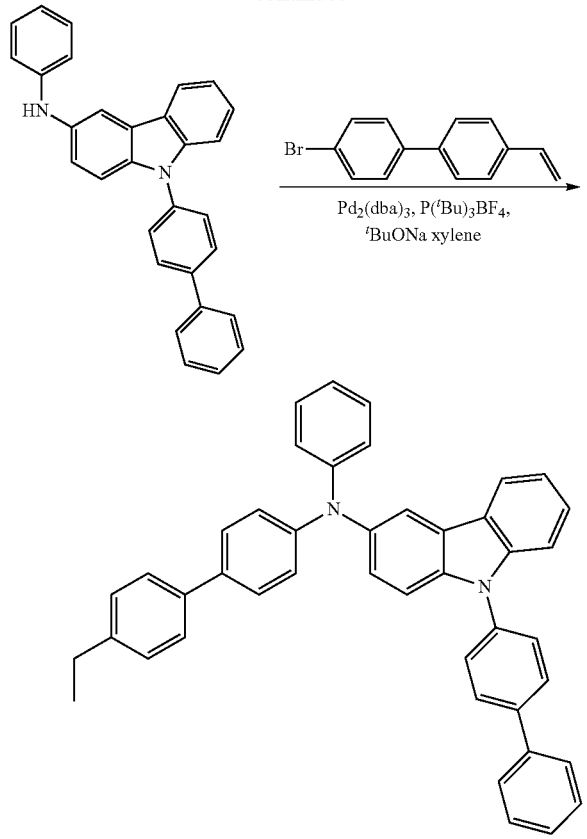

To a four-neck flask under an argon atmosphere, 10.0 grams (g) of 9-(4-biphenyl)3-bromocarbazole, 2.46 g of aniline, 0.690 g of tris(dibenzylideneacetone)dipalladium, 1.66 g of 1,1'-bis(diphenylphosphino)ferrocene, 4.82 g of sodium tert-butoxide, and 100 milliliters (mL) of toluene were added, and the reaction mixture was heated at a temperature of 110° C. for 3 hours. The mixture was cooled to room temperature (25° C.), and filtered by using a celite filter to filter out insoluble materials. The solvent in the filtrate was distilled under reduced pressure, and the residue was purified using column chromatography to obtain 5.84 g of 9-(4-biphenyl)-N-phenyl-9H-carbazole-3-amine.

To a four-neck flask under an argon atmosphere, 5.80 g of 9-(4-biphenyl)-N-phenyl-9H-carbazole-3-amine, 3.61 g of 4-bromo-4'-vinyl biphenyl, 0.648 g of tris(dibenzylideneacetone)dipalladium, 0.430 g of tri-tert-butylphosphonium tetrafluoroborate, 2.96 g of sodium tert-butoxide, and 100 mL of xylene were added, and the reaction mixture was heated at a temperature of 140° C. for 3 hours. The mixture was cooled to room temperature (25° C.), and filtered by using a celite filter to filter out insoluble materials. The solvent in the filtrate was distilled under reduced pressure, and the residue was purified using column chromatography and recrystallization to obtain 0.855 g of Monomer A109.

Synthesis Example 1-2: Synthesis of Monomer B107

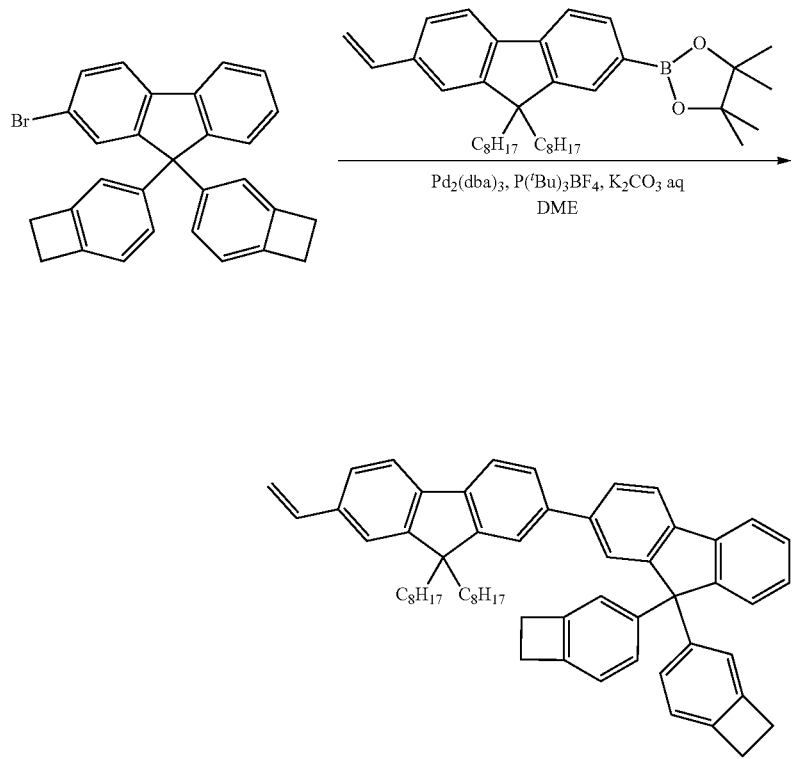

To a four-neck flask under an argon atmosphere, 1.00 g of 9-(bicyclo[4.2.0]octa-1(6),2,4-triene-3-yl)-9-(bicyclo[4.2.0]octa-1,3,5-triene-3-yl)-2-bromo-9H-fluorene, 1.21 g of 2-(9,9-dioctyl-7vinyl-9H-fluoren-2-yl)-4,4,5,5-tetramethyl-1,3,2-dioxaborolane, 0.129 g of tri-tert-butylphosphonium tetrafluoroborate, 0.10 g of tris(dibenzylideneacetone)dipalladium, 0.63 g of potassium carbonate, 9 mL of 1,2-dimethoxyethane (DME), and 4 mL of water were added, and the reaction mixture was heated at a temperature of 85° C. for 5 hours. The mixture was cooled to room temperature (25° C.), and filtered by using a celite filter to filter out insoluble materials. The solvent in the filtrate was distilled under reduced pressure, and the residue was purified using column chromatography and recrystallization to obtain 1.20 g of Monomer B107.

Synthesis Example 1-3: Synthesis of Comparative Monomer C1

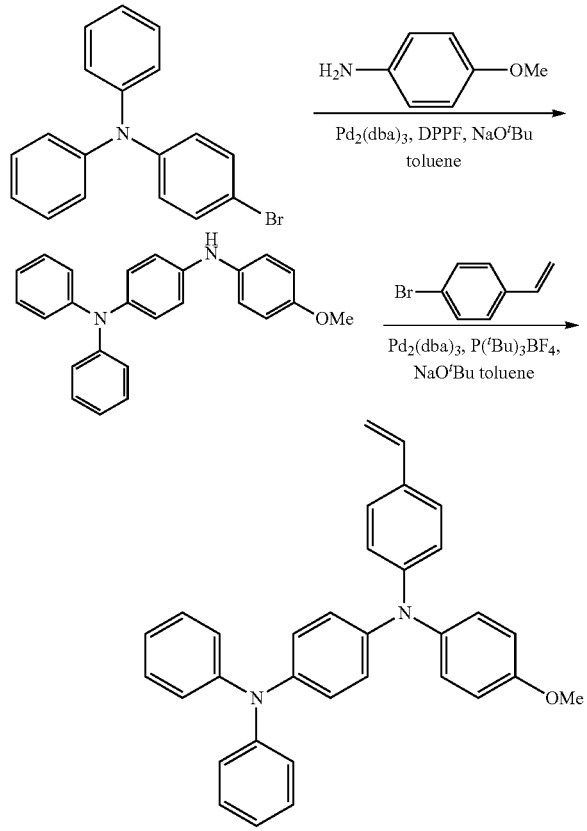

To a four-neck flask under an argon atmosphere, 5.01 g of N-4-bromophenyl-N,N-bisphenylamine, 2.16 g of 4-methoxyaniline, 0.572 g of tris(dibenzylideneacetone)dipalladium, 1.384 g of 1,1'-bis(diphenylphosphino)ferrocene, 2.97 g of sodium tert-butoxide, and 78 mL of toluene were added, and the reaction mixture was heated at a temperature of 110° C. for 6 hours. The mixture was cooled to room temperature (25° C.), and filtered by using a celite filter to filter out insoluble materials. The solvent in the filtrate was distilled under reduced pressure, and the residue was purified using column chromatography to obtain 4.57 g of N-(4-methoxyphenyl)-N',N'-diphenyl-benzene-1,4-diamine.

To a four-neck flask under an argon atmosphere, 1.11 g of N-(4-methoxyphenyl)-N',N'-diphenyl-benzene-1,4-diamine, 0.663 g of 4-bromostyrene, 0.138 g of tris(dibenzylideneacetone)dipalladium, 0.176 g of tetrabutylphosphine ferrocene, 0.588 g of sodium tert-butoxide, and 15 mL of toluene were added, and the reaction mixture was heated at a temperature of 110° C. for 6 hours. The mixture was cooled to room temperature (25° C.), and filtered by using a celite filter to filter out insoluble materials. The solvent in the filtrate was distilled under reduced pressure, and the residue was purified using column chromatography to obtain 0.604 g of Comparative Monomer C1.

Synthesis Example 1-4: Synthesis of Monomer B102

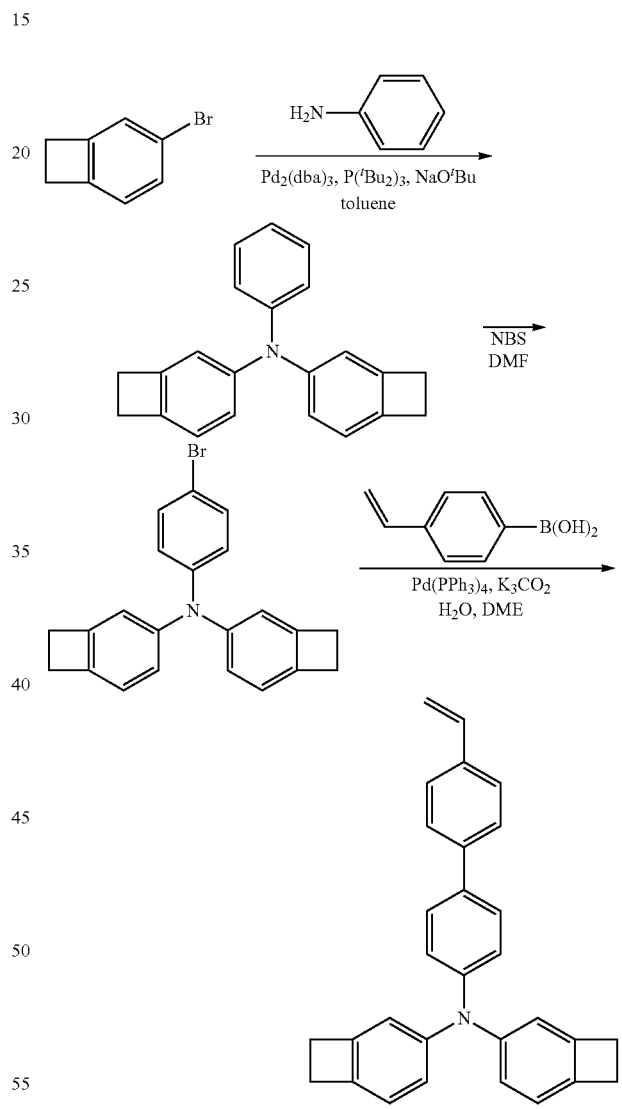

To a four-neck flask under an argon atmosphere, 2.79 g of aniline, 11.5 g of 3-bromo-bicyclo[4,2,0]octa-1(6),2,4-triene, 0.549 g of tris(dibenzylideneacetone)dipalladium, 0.696 g of tri-tert-butylphosphonium tetrafluoroborate, 8.55 g of sodium tert-butoxide, and 150 mL of toluene were added, and the reaction mixture was heated at a temperature of 110° C. for 2 hours. The mixture was cooled to room temperature (25° C.), and filtered by using a celite filter to filter out insoluble materials. The solvent in the filtrate was distilled under reduced pressure, and the residue was purified using column chromatography to obtain 9.16 g of N-(bicyclo[4.2.0]octa-1,3,5-triene-3-yl)-N-phenyl-bicyclo[4.2.0]octa-1(6),2,4-triene-3-amine.

To a four-neck flask under an argon atmosphere, 6.12 g of N-(bicyclo[4.2.0]octa-1,3,5-triene-3-yl)-N-phenyl-bicyclo[4.2.0]octa-1(6),2,4-triene-3-amine and 41.2 mL of dimethylformamide (DMF) were added, and the flask was cooled with ice water. 3.67 g of N-bromosuccinimide dissolved in 20.6 mL of DMF was added by drops thereto, and the reaction mixture was stirred for 2 hours. 150 mL of toluene was added thereto, and the resultant was washed with water and dried by using magnesium sulfate. The solvent in the filtrate was distilled under reduced pressure, and the residue was purified using column chromatography to obtain 7.08 g of N-(bicyclo[4.2.0]octa-1,3,5-triene-3-yl)-N-(4-bromophenyl)bicyclo[4.2.0]octa-1(6),2,4-triene-3-amine.

To a four-neck flask under an argon atmosphere, 6.45 g of N-(bicyclo[4.2.0]octa-1,3,5-triene-3-yl)-N-(4-bromophenyl)bicyclo[4.2.0]octa-1(6),2,4-triene-3-amine, 3.03 g of 4-vinylphenyl boronic acid, 040 g of tetrakis(triphenylphosphine)palladium, 7.73 g of potassium carbonate, 68 mL of DME, and 17 mL of water were added, and the reaction mixture was heated at a temperature of about 85° C. for 5 hours. The mixture was cooled to room temperature (25° C.), and filtered by using a celite filter to filter out insoluble materials. The solvent in the filtrate was distilled under reduced pressure, and the residue was purified using column chromatography and recrystallization to obtain 3.67 g of Monomer B102.

Synthesis Example 1-5: Synthesis of Monomer A119

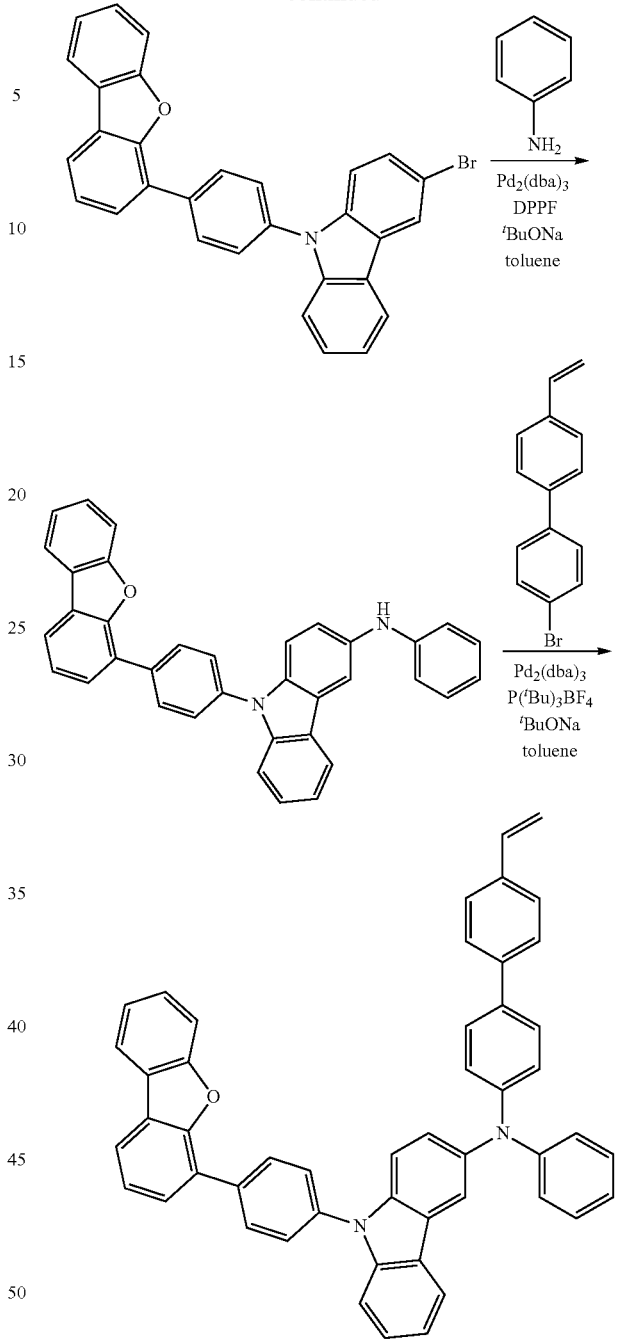

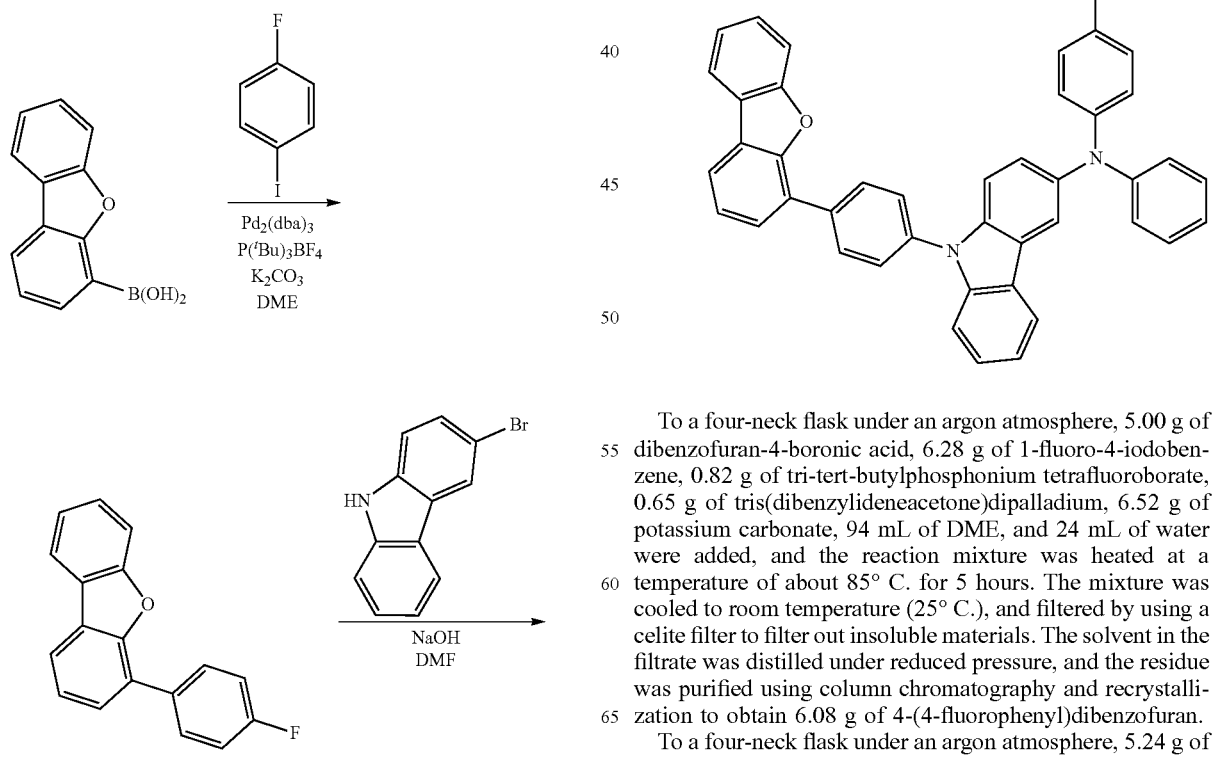

To a four-neck flask under an argon atmosphere, 5.00 g of dibenzofuran-4-boronic acid, 6.28 g of 1-fluoro-4-iodobenzene, 0.82 g of tri-tert-butylphosphonium tetrafluoroborate, 0.65 g of tris(dibenzylideneacetone)dipalladium, 6.52 g of potassium carbonate, 94 mL of DME, and 24 mL of water were added, and the reaction mixture was heated at a temperature of about 85° C. for 5 hours. The mixture was cooled to room temperature (25° C.), and filtered by using a celite filter to filter out insoluble materials. The solvent in the filtrate was distilled under reduced pressure, and the residue was purified using column chromatography and recrystallization to obtain 6.08 g of 4-(4-fluorophenyl)dibenzofuran.

To a four-neck flask under an argon atmosphere, 5.24 g of 4-(4-fluorophenyl)dibenzofuran, 4.90 g of 3-bromo-9H-carbazole, 1.00 g of sodium hydroxide, and 86 mL of N,N-dimethylformamide were added, and the reaction mixture was heated at a temperature of 140° C. for 50 hours. The mixture was cooled to room temperature (25° C.), and filtered by using a celite filter to filter out insoluble materials. The solvent in the filtrate was distilled under reduced pressure, and the residue was purified using column chromatography to obtain 6.10 g of 3-bromo-9-(4-(dibenzofuran-4-yl)phenyl)-9H-carbazole.

To a four-neck flask under an argon atmosphere, 6.10 g of 3-bromo-9-(4-(dibenzofuran-4-yl)phenyl)-9H-carbazole, 1.40 g of aniline, 0.57 g of tris(dibenzylideneacetone)dipalladium, 1.39 g of 1,1'-bis(diphenylphosphino)ferrocene, 2.40 g of sodium tert-butoxide, and 63 mL of toluene were added, and the reaction mixture was heated at a temperature of 110° C. for 3 hours. The mixture was cooled to room temperature (25° C.), and filtered by using a celite filter to filter out insoluble materials. The solvent in the filtrate was distilled under reduced pressure, and the residue was purified using column chromatography to obtain 3.27 g of 9-(4-(dibenzofuran-4-yl)phenyl)-N-phenyl-9H-carbazole-3-amine.

To a four-neck flask under an argon atmosphere, 3.25 g of 9-(4-(dibenzofuran-4-yl)phenyl)-N-phenyl-9H-a carbazole-3-amine, 1.85 g of 4-bromo-4'-vinylbiphenyl, 0.30 g of tris(dibenzylideneacetone)dipalladium, 0.19 g of tri-tert-butylphosphonium tetrafluoroborate, 1.25 g of sodium tert-butoxide, and 33 mL of toluene were added, and the reaction mixture was heated at a temperature of 120° C. for 3 hours. The mixture was cooled to room temperature (25° C.), and filtered by using a celite filter to filter out insoluble materials. The solvent in the filtrate was distilled under reduced pressure, and the residue was purified using column chromatography and recrystallization to obtain 2.21 g of Monomer A119.

Synthesis Example 1-6: Synthesis of Monomer A120

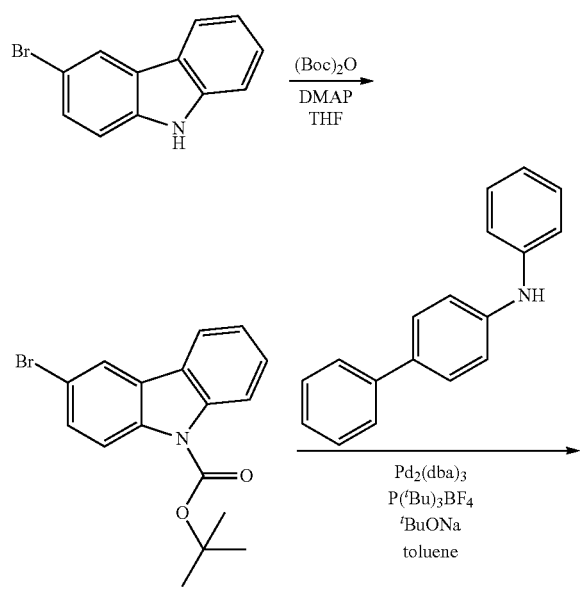

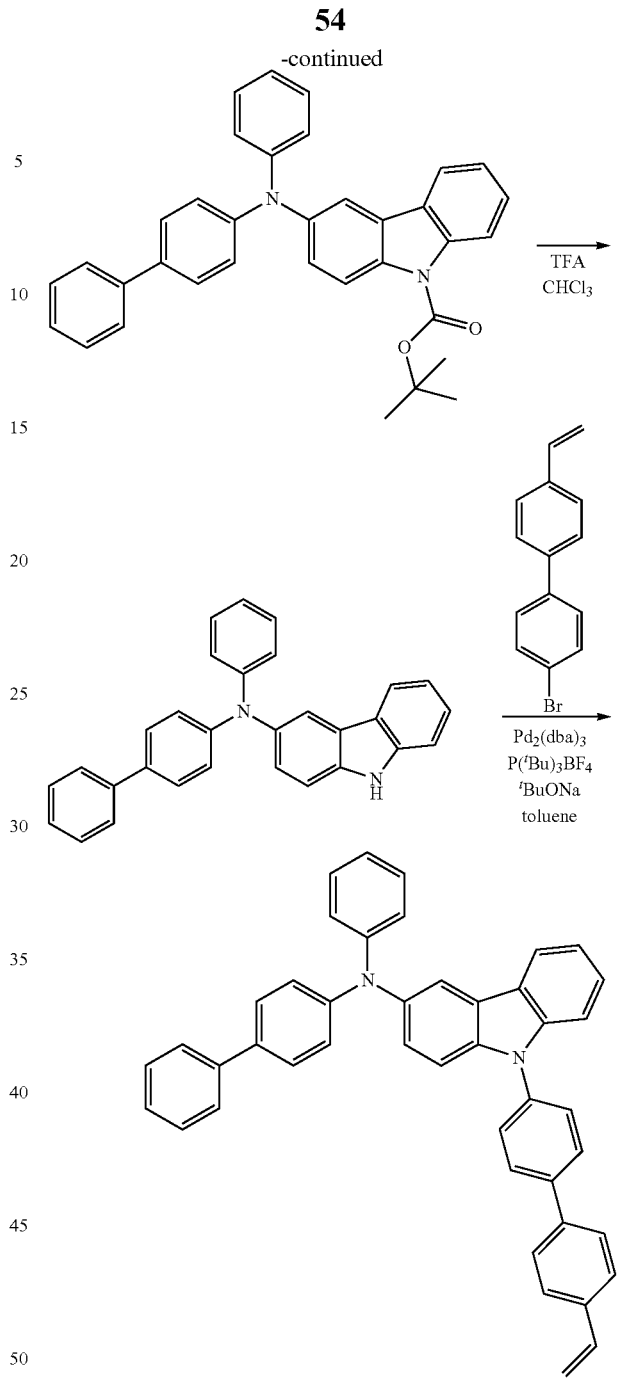

To a four-neck flask under an argon atmosphere, 20.3 g of 3-bromo-9H-carbazole, 24.8 g of di-tert-butyl dicarbonate, 0.80 g of N,N-dimethyl-4-aminopyridine, 300 mL of THF were added, and the reaction mixture was stirred for 1 hour at room temperature. The solvent in the filtrate was distilled under reduced pressure, and the residue was purified using column chromatography to obtain 28.9 g of tert-butyl-3-bromo-9H-carbazole-9-carboxylate.

To a four-neck flask under an argon atmosphere, 9.00 g of tert-butyl-3-bromo-9H-carbazole-9-carboxylate, 9.18 g of N-phenyl-(1,1'-biphenyl)-4-amine, 0.29 g of tris(dibenzylideneacetone)dipalladium, 0.75 g of tri-tert-butylphosphonium tetrafluoroborate, 2.87 g of sodium tert-butoxide, and 240 mL of toluene were added, and the reaction mixture was heated at a temperature of 110° C. for 3 hours. The mixture was cooled to room temperature (25° C.), and filtered by using a celite filter to filter out insoluble materials. The solvent in the filtrate was distilled under reduced pressure, and the residue was purified using column chromatography to obtain 9.29 g of tert-butyl-3-([1,1'-phenyl]-4-yl-(phenyl)amino)-9H-carbazole-9-carboxylate (9.29 g).

To a four-neck flask under an argon atmosphere, 9.00 g of tert-butyl-3-([1,1'-phenyl]-4-yl-(phenyl)amino)-9H-carbazole-9-carboxylate, 10 mL of hydrochloric acid, and 100 mL of 1,4-dioxane were added, and the reaction mixture was heated under reflux for 6 hours. The mixture was cooled to room temperature (25° C.), the solvent was distilled under reduced pressure, and the residue was purified using column chromatography to obtain 6.51 g of N-(1,1'-biphenyl]-4-yl)-N-phenyl-9H-carbazole-3-amine.

To a four-neck flask under an argon atmosphere, 5.00 g of N-(1,1'-biphenyl]-4-yl)-N-phenyl-9H-carbazole-3-amine, 3.47 g of 4-bromo-4'-vinylphenyl, 0.56 g of tris(dibenzylideneacetone)dipalladium, 0.71 g of tri-tert-butylphosphonium tetrafluoroborate, 4.68 g of sodium tert-butoxide, and 50 mL of toluene were added, and the reaction mixture was heated at a temperature of 120° C. for 3 hours. The mixture was cooled to room temperature (25° C.), and filtered by using a celite filter to filter out insoluble materials. The solvent in the filtrate was distilled under reduced pressure, and the residue was purified using column chromatography and recrystallization to obtain 2.59 g of Monomer A120.

Synthesis Example 1-7: Synthesis of Monomer A121

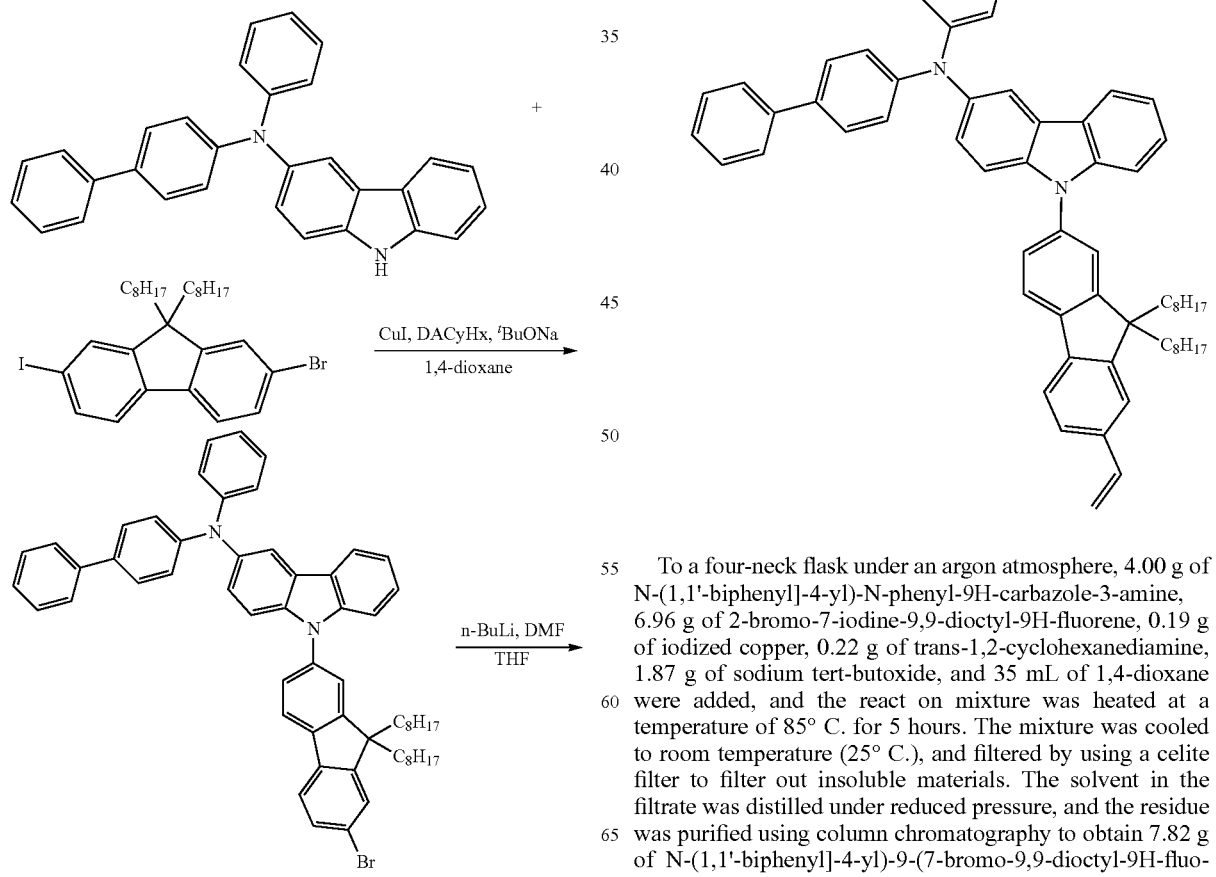

To a four-neck flask under an argon atmosphere, 4.00 g of N-(1,1'-biphenyl]-4-yl)-N-phenyl-9H-carbazole-3-amine, 6.96 g of 2-bromo-7-iodine-9,9-dioctyl-9H-fluorene, 0.19 g of iodized copper, 0.22 g of trans-1,2-cyclohexanediamine, 1.87 g of sodium tert-butoxide, and 35 mL of 1,4-dioxane were added, and the react on mixture was heated at a temperature of 85° C. for 5 hours. The mixture was cooled to room temperature (25° C.), and filtered by using a celite filter to filter out insoluble materials. The solvent in the filtrate was distilled under reduced pressure, and the residue was purified using column chromatography to obtain 7.82 g of N-(1,1'-biphenyl]-4-yl)-9-(7-bromo-9,9-dioctyl-9H-fluorene-2-yl)-N-phenyl-9H-carbazole-3-amine.

To a four-neck flask under an argon atmosphere, 7.82 g of N-(1,1'-biphenyl]-4-yl)-9-(7-bromo-9,9-dioctyl-9H-fluorene-2-yl)-N-phenyl-9H-carbazole-3-amine and 45 mL of THF were added, and the reaction mixture was cooled to a temperature of −45° C. 0.63 g of n-butyllithium was added thereto and stirred at that temperature for 2 hours. 3.43 mL of N,N-dimethylformamide was added thereto and the reaction mixture was stirred for an additional 1 hour. The temperature was raised to room temperature (25° C.), and water was added thereto to complete the reaction. Toluene was added thereto, and the organic layer was extracted therefrom. The solvent was distilled under reduced pressure, and the residue was purified using column chromatography to obtain 5.90 g of 7-(3-(1,1'-biphenyl]-4-yl(phenyl)amino)-9H-carbazole-9-yl)-9,9-dioctyl-9H-fluorene-2-carbaldehyde.

To a four-neck flask under an argon atmosphere, 3.21 g of methyltriphenylphosphonium iodide and 46 mL of THF were added, and the reaction mixture was stirred at a temperature of −2° C. maintained by using an ice bath. 0.72 g of sodium tert-butoxide was added thereto, and the reaction mixture was stirred at a temperature of −2° C. for additional 30 minutes. 4.40 g of 7-(3-(1,1'-biphenyl]-4-yl(phenyl)amino)-9H-carbazole-9-yl)-9,9-dioctyl-9H-fluorene-2-carbaldehyde dissolved in 46 mL of separate THF was added by drops thereto over 1 hour. The temperature was raised to room temperature (25° C.), and the reaction mixture was filtered by using a celite filter to filter out insoluble materials. The solvent in the filtrate was distilled under reduced pressure, and the residue was purified using column chromatography and recrystallization to obtain 1.80 g of Monomer A121.

Synthesis Example 2-1: Synthesis of Monomer B102

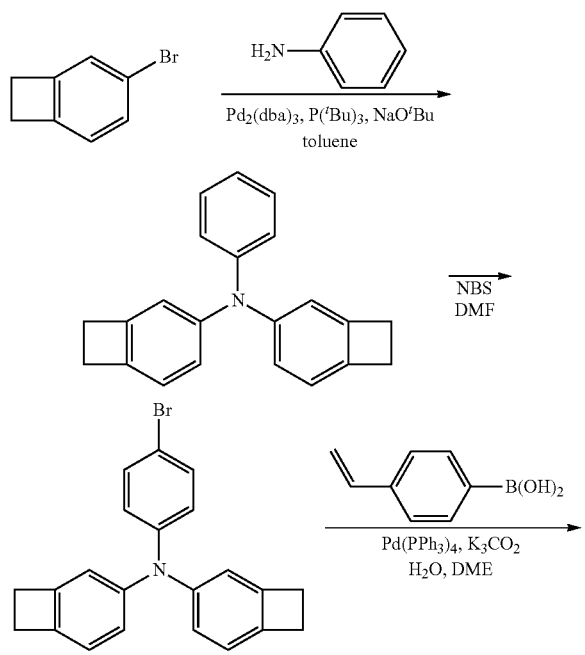

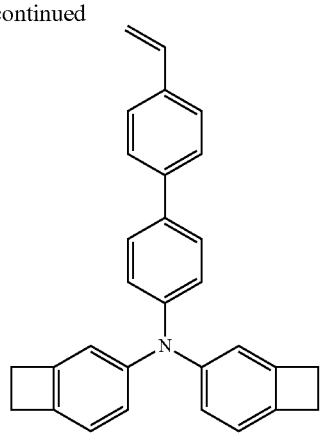

To a four-neck flask under an argon atmosphere, 2.79 g of aniline, 11.5 g of 3-bromo-bicyclo[4,2,0]octa-1(6),2,4-triene, 0.549 g of tris(dibenzylideneacetone)dipalladium, 0.696 g of tri-tert-butylphosphonium tetrafluoroborate, 8.55 g of sodium tert-butoxide, and 150 mL of toluene were added, and the reaction mixture was heated at a temperature of 110° C. for 2 hours. The mixture was cooled to room temperature (25° C.), and filtered by using a celite filter to filter out insoluble materials. The solvent in the filtrate was distilled under reduced pressure, and the residue was purified using column chromatography to obtain 9.16 g of N-(bicyclo[4.2.0]octa-1,3,5-triene-3-yl)-N-phenyl-bicyclo[4.2.0]octa-1(6),2,4-triene-3-amine.

To a four-neck flask under an argon atmosphere, 6.12 g of N-(bicyclo[4.2.0]octa-1,3,5-triene-3-yl)-N-phenyl-bicyclo[4.2.0]octa-1(6),2,4-triene-3-amine and 41.2 mL of DMF were added, and the reaction mixture was cooled with ice water. 3.67 g of N-bromosuccinimide dissolved in 20.6 mL of DMF was added by drops thereto, and the reaction mixture was stirred for 2 hours. 150 mL of toluene was added thereto. An organic layer was washed with water and dried using magnesium sulfate. The solvent in the filtrate was distilled under reduced pressure, and the residue was purified using column chromatography to obtain 7.08 g of N-(bicyclo[4.2.0]octa-1,3,5-triene-3-yl)-N-(4-bromophenyl)bicyclo[4.2.0]octa-1(6),2,4-triene-3-amine.

To a four-neck flask under an argon atmosphere, 6.45 g of N-(bicyclo[4.2.0]octa-1,3,5-triene-3-yl)-N-(4-bromophenyl)bicyclo[4.2.0]octa-1(6),2,4-triene-3-amine, 3.03 g of 4-vinylphenyl boronic acid, 0.40 g of tetrakis(triphenylphosphine)palladium, 7.73 g of potassium carbonate, 68 mL of DME, and 17 mL of water were added, and the reaction mixture was heated at a temperature of about 85° C. for 5 hours. The mixture was cooled to room temperature (25° C.), and filtered by using a celite filter to filter out insoluble materials. The solvent in the filtrate was distilled under reduced pressure, and the residue was purified using column chromatography and recrystallization to obtain 3.67 g of Monomer B102.

Synthesis Example 2-2: Synthesis of Monomer B101

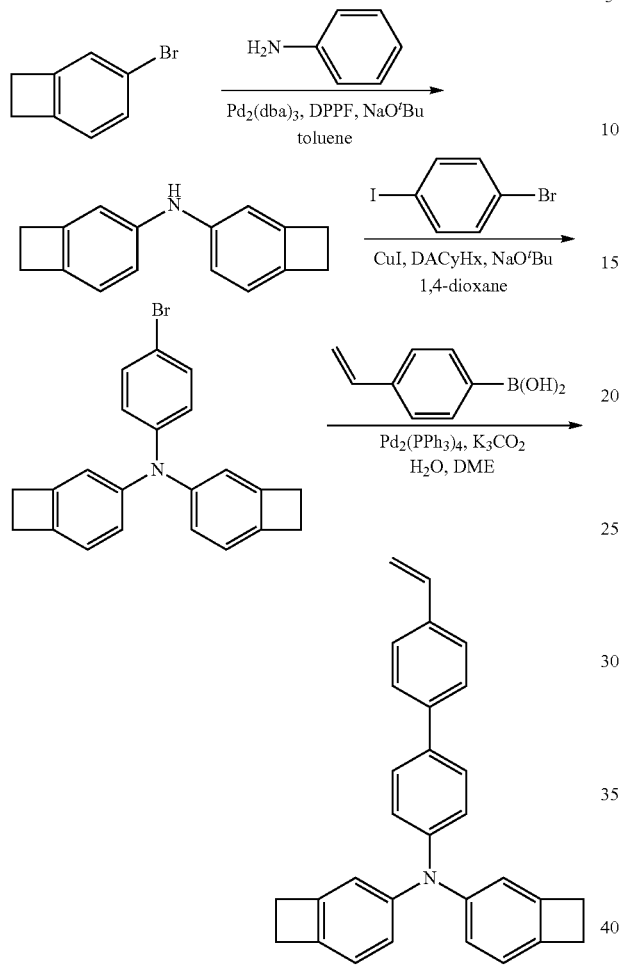

To a four-neck flask under an argon atmosphere, 2.79 g of aniline, 5.49 g of 3-bromo-bicyclo[4,2,0]octa-1(6),2,4-triene, 0.549 g of tris(dibenzylideneacetone)dipalladium, 0.665 g of 1,1'-bis(diphenylphosphino)ferrocene, 5.77 g of sodium tert-butoxide, and 150 mL of toluene were added, and the reaction mixture was heated at a temperature of 110° C. for 6 hours. The mixture was cooled to room temperature (25° C.), and filtered by using a celite filter to filter out insoluble materials. The solvent in the filtrate was distilled under reduced pressure, and the residue was purified using column chromatography to obtain 5.46 g of N-(bicyclo[4.2.0]octa-1,3,5-triene-3-yl)-N-phenylamine.

To a four-neck flask under an argon atmosphere, 3.97 g of N-(bicyclo[4.2.0]octa-1,3,5-triene-3-yl)-N-phenylamine, 6.31 g of 4-bromoiodobenzene, 0.149 g of iodized copper, 0.49 mL of cyclohexanediamine, 3.90 g of sodium tert-butoxide, and 40 mL of 1,4-dioxane were added, and the reaction mixture was allowed to stir for 14 hours. Filtration was carried out by using a celite filter to filter out insoluble materials. The solvent in the filtrate was distilled under reduced pressure, and the residue was purified using column chromatography to obtain 5.50 g of N-4-bromophenyl-N-(bicyclo[4.2.0]octa-1,3,5-triene-3-yl)-N-phenylamine.

To a four-neck flask under an argon atmosphere, 5.43 g of N-4-bromophenyl-N-(bicyclo[4.2.0]octa-1,3,5-triene-3-yl)-N-phenylamine, 2.75 g of 4-vinylphenylboronate, 0.36 g of tetrakis(triphenylphosphine)palladium, 4.28 g of potassium carbonate, 62 mL of DME, and 15.5 mL of water were added, and the reaction mixture was heated at a temperature of 85° C. for 5 hours. The mixture was cooled to room temperature (25° C.), and filtered by using a celite filter to filter out insoluble materials. The solvent in the filtrate was distilled under reduced pressure, and residue was purified using column chromatography and recrystallization to obtain 2.87 g of Monomer B101.

Synthesis Example 2-3: Synthesis of Monomer A201

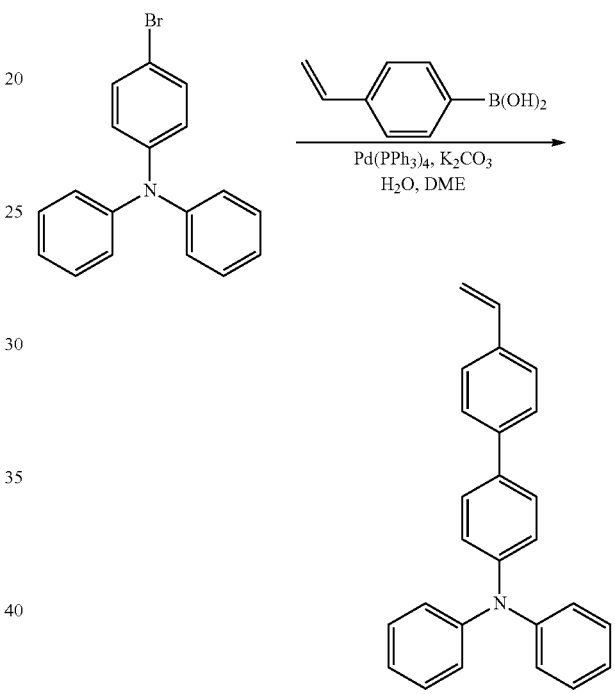

To a four-neck flask under an argon atmosphere, 45.40 g of N-4-bromophenyl-N,N-diphenylamine, 24.80 g of 4-vinyl phenylboronate, 3.23 g of tetrakis(triphenylphosphine)palladium, 38.70 g of potassium carbonate, 560 mL of DME, and 15.5 mL of water were added, and the reaction mixture was heated at a temperature of 85° C. for 5 hours. The mixture was cooled to room temperature (25° C.), and filtered by using a celite filter to filter out insoluble materials. The solvent in the filtrate was distilled under reduced pressure, and the residue was purified using column chromatography and recrystallization to obtain 8.40 g of Monomer A201.

Example 1: Synthesis of Hole-Transporting Material (1-1)

Based on the following method, Monomer A109 synthesized in Synthesis Example 1-1 and Monomer B107 synthesized in Synthesis Example 1-2 were used to synthesize Hole-transporting material (1-1) represented by the following formulae:

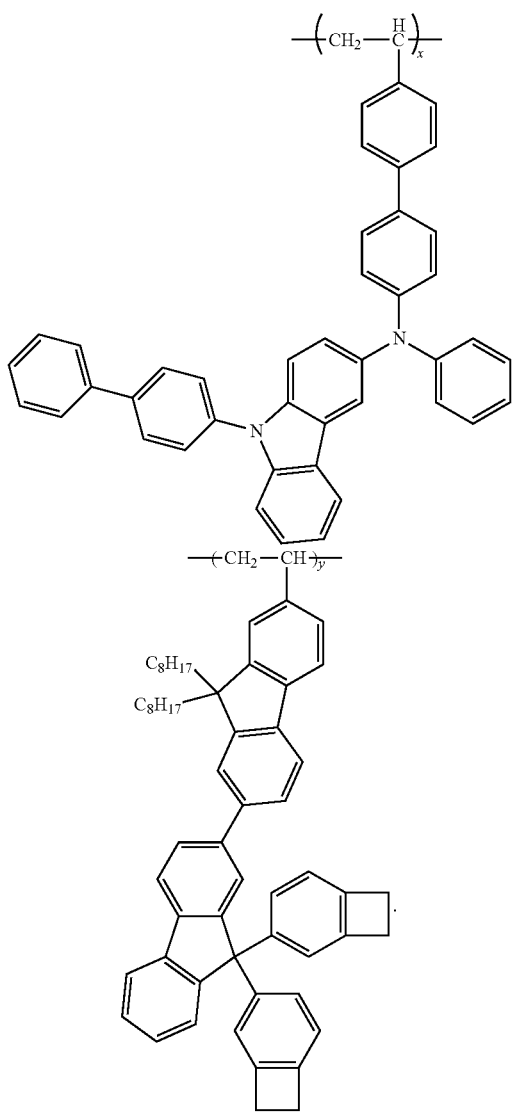

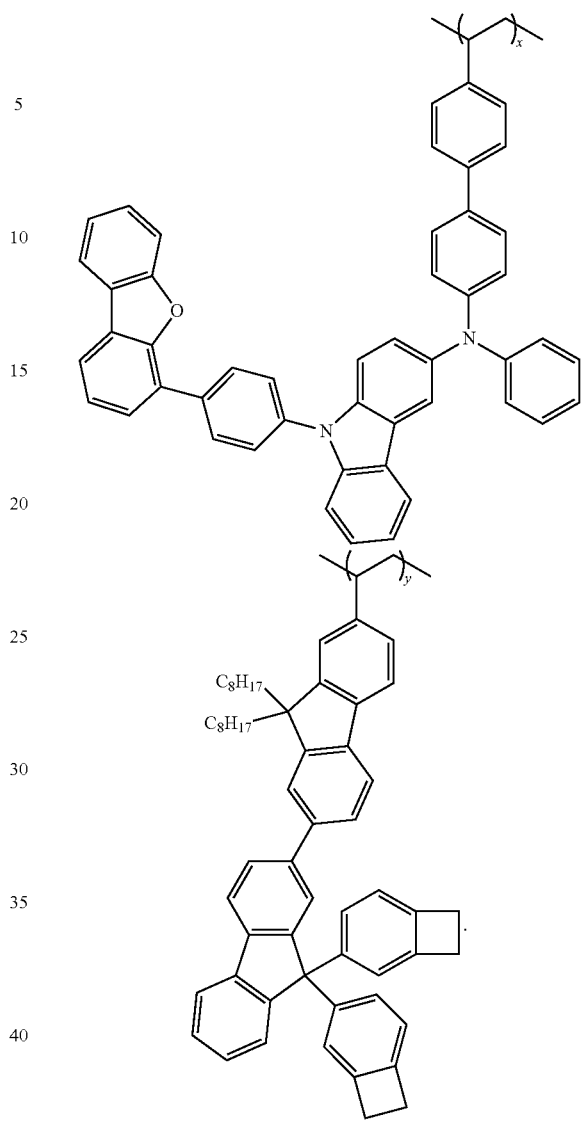

795 mg of Monomer A109, 118 mg of Monomer B107, 4.5 mg of azobisisobutyronitrile, and 9 mL of toluene were added to a Schlenk tube, and subjected to freeze deaeration. The reaction mixture was subsequently stirred under heating at a temperature of 60° C. for 6 hours. After cooling to room temperature, reprecipitation was performed 5 times using THF as a good solvent and an excess amount of methanol as a bad solvent. The material thus obtained was dried under vacuum to obtain 500 mg of a copolymer of Monomer A109 and Monomer B107 (having a molar ratio of a structural unit derived from Monomer A109:a structural unit derived from Monomer B107=90:10). The copolymer thus obtained is hereby referred to as Hole-transporting material (1-1). The weight average molecular weight (Mw) of Hole-transporting material (1-1) was measured to be 29,000 Daltons.

Example 2: Synthesis of Hole-Transporting Material (1-2)

Based on the following method, Monomer A119 synthesized in Synthesis Example 1-5 and Monomer B107 synthesized in Synthesis Example 1-2 were used to synthesize Hole-transporting material (1-2) represented by the following formulae:

828 mg of Monomer A119, 106 mg of Monomer B107, 4.1 mg of azobisisobutyronitrile, and 9 mL of toluene were added to a Schlenk tube, and subjected to freeze deaeration. The reaction mixture was subsequently stirred under heating at a temperature of 60° C. for 6 hours. After cooling to room temperature, reprecipitation was performed 5 times using THF as a good solvent and an excess amount of methanol as a bad solvent. The material thus obtained was dried under vacuum to obtain 500 mg of a copolymer of Monomer A119 and Monomer B107 (having a molar ratio of a structural unit derived from Monomer A119:a structural unit derived from Monomer B107=90:10). The copolymer thus obtained is hereby referred to as Hole-transporting material (1-2). The weight average molecular weight (Mw) of Hole-transporting material (1-2) was measured to be 30,000 Daltons.

Example 3: Synthesis of Hole-Transporting Material (1-3)

Based on the following method, Monomer A120 synthesized in Synthesis Example 1-6 and Monomer B107 synthesized in Synthesis Example 1-2 were used to synthesize Hole-transporting material (1-3) represented by the following formulae:

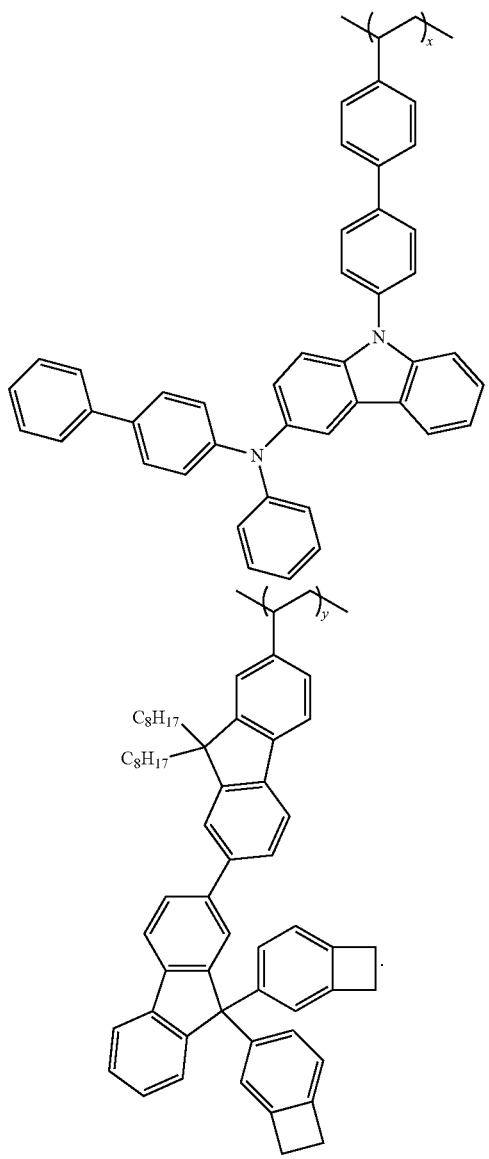

795 mg of Monomer A120, 118 mg of Monomer B107, 4.5 mg of azobisisobutyronitrile, and 9 mL of toluene were added to a Schlenk tube, and subjected to freeze deaeration. The reaction mixture was stirred under heating at a temperature of 60° C. for 6 hours. After cooling to room temperature, reprecipitation was performed 5 times using THF as a good solvent and an excess amount of methanol as a bad solvent. The material thus obtained was dried under vacuum to obtain 500 mg of a copolymer of Monomer A120 and Monomer B107 (having a molar ratio of a structural unit derived from Monomer A120:a structural unit derived from Monomer B107=90:10). The copolymer thus obtained is hereby referred to as Hole-transporting material (1-3). The weight average molecular weight (Mw) of Hole-transporting material (1-3) was measured to be 28,900 Daltons.

Example 4: Synthesis of Hole-Transporting Material (1-4)

Based on the following method, Monomer A121 synthesized in Synthesis Example 1-7 and Monomer B107 synthesized in Synthesis Example 1-2 were used to synthesize Hole-transporting material (1-4) represented by the following formulae:

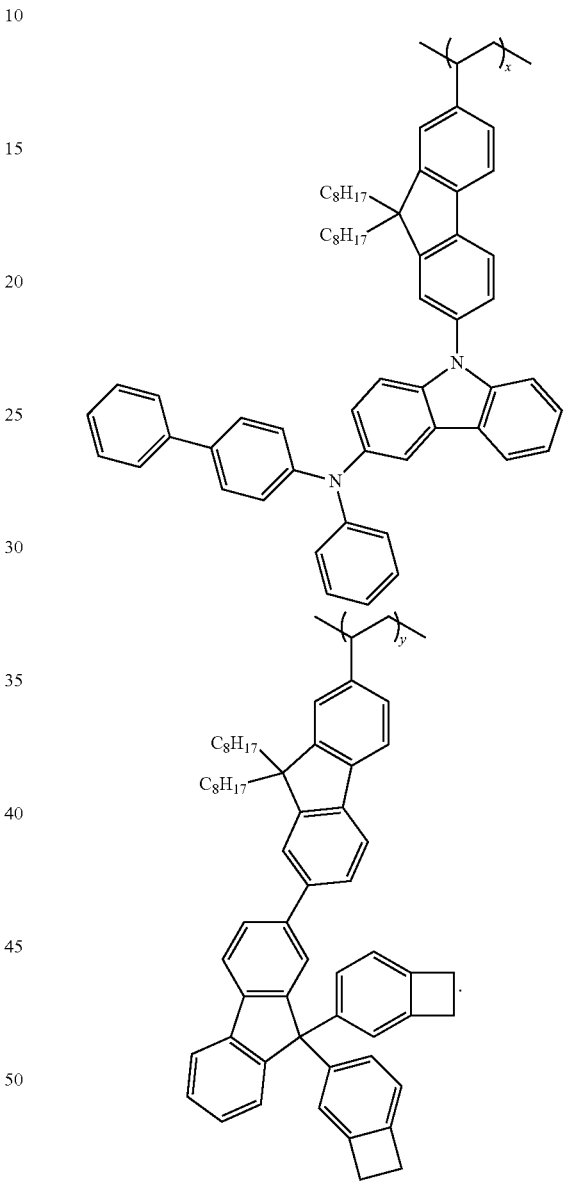

811 mg of Monomer A121, 78.5 mg of Monomer B107, 3.0 mg of azobisisobutyronitrile, and 2.5 mL of toluene were added to a Schlenk tube, and the reaction mixture was subjected to freeze deaeration. The reaction mixture was stirred under heating at a temperature of 60° C. for 6 hours. After cooling to room temperature, reprecipitation was performed 5 times using THF as a good solvent and an excess amount of methanol as a bad solvent. The material thus obtained was dried under vacuum to obtain 500 mg of a copolymer of Monomer A121 and Monomer B107 (having a molar ratio of a structural unit derived from Monomer A121:a structural unit derived from Monomer B107=90:10).

The copolymer thus obtained is hereby referred to as Hole-transporting material (1-4). The weight average molecular weight (Mw) of Hole-transporting material (1-4) was measured to be 67,900 Daltons.

Example 5: Synthesis of Hole-Transporting Material (2-1)

Based on the following method, Monomer B102 synthesized in Synthesis Example 2-1 and Monomer A201 synthesized in Synthesis Example 2-3 were used to synthesize Hole-transporting material (2-1) represented by the following formulae:

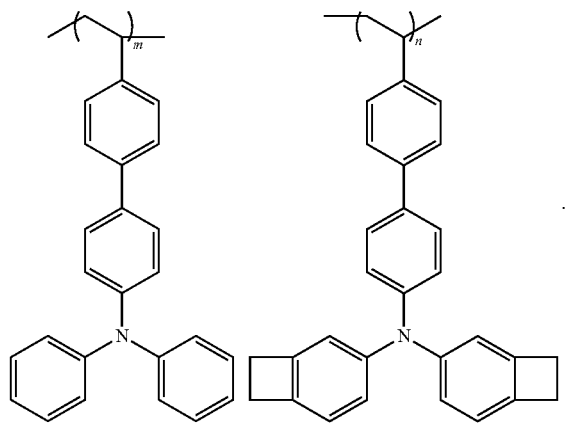

204 mg of Monomer B102, 1.6 g of Monomer A201, 10.2 mg of azobisisobutyronitrile, and 10 mL of toluene were added to a Schlenk tube, and the reaction mixture was subjected to freeze deaeration. The reaction mixture was stirred under heating at a temperature of 60° C. for 6 hours. After cooling to room temperature, reprecipitation was performed 5 times using THF as a good solvent and an excess amount of methanol as a bad solvent. The material thus obtained was dried under vacuum to obtain 1.26 g of Hole-transporting material (2-1) in copolymer of Monomer B102 and Monomer A201 (having a molar ratio of a structural unit derived from Monomer B102:a structural unit derived from Monomer A201=10:90). The number average molecular weight (Mn) and weight average molecular weight (Mw) of Hole-transporting material (2-1) were, respectively, 21,000 Daltons and 43,000 Daltons, and Mw/Mn was 2.1.

Example 6: Synthesis of Hole-Transporting Material (2-2)

Based on the following method, Monomer B101 synthesized in Synthesis Example 2-2 and Monomer A201 synthesized in Synthesis Example 2-3 were used to synthesize Hole-transporting material (2-2) represented by the following formulae:

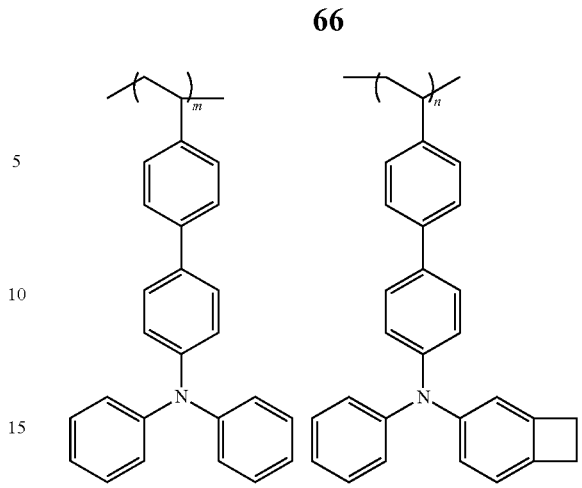

74.7 mg of Monomer B101, 0.625 g of Monomer A201, 4.0 mg of azobisisobutyronitrile, and 4 mL of toluene were added to a Schlenk tube, and the reaction mixture was subjected to freeze deaeration. The reaction mixture was stirred under heat at a temperature of 60° C. for 6 hours. After cooling to room temperature, reprecipitation was performed 5 times using THF as a good solvent and an excess amount of methanol as a bad solvent. The material thus obtained was dried under vacuum to obtain 0.75 g of Hole-transporting material (2-2) in copolymer of Monomer B101 and Monomer A201 (having a molar ratio of a structural unit derived from Monomer B101:a structural unit derived from Monomer A201=10:90). The number average molecular weight (Mn) and weight average molecular weight (Mw) of Hole-transporting material (2-2) were, respectively, 25,000 Daltons and 52,000 Daltons, and Mw/Mn was 2.1.

Comparative Example 1: Synthesis of Comparative Hole-Transporting Material (1-1)

Based on the following method, Comparative Monomer C1 synthesized in Synthesis Example 1-3 and Monomer B102 synthesized in Synthesis Example 1-4 were used to synthesize Comparative Hole-transporting material (1-1) represented by the following formulae:

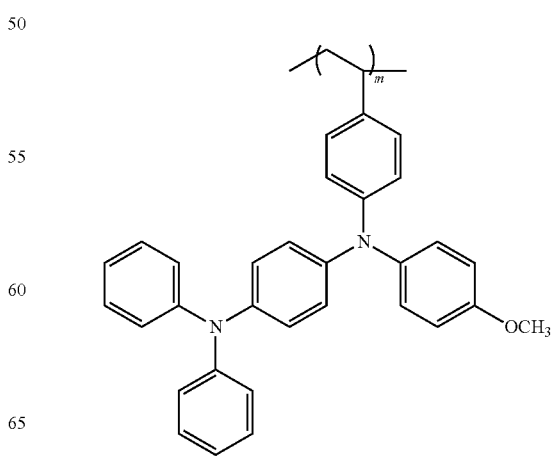

-continued

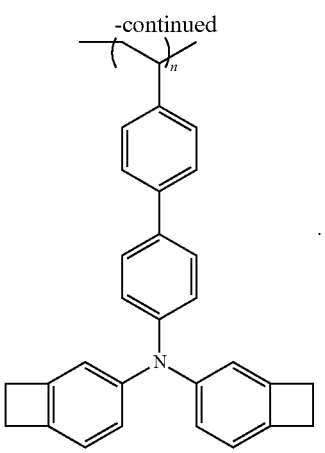

160 mg of Comparative Monomer C1, 1.69 g of Monomer B102, 8.0 mg of azobisisobutyronitrile, and 8 mL of toluene were added to a Schlenk tube, and the reaction mixture was subjected to freeze deaeration. The reaction mixture was stirred under heating for 6 hours. After cooling to room temperature, reprecipitation was performed 5 times using THF as a good solvent and an excess amount of methanol as a bad solvent. The material thus obtained was dried under vacuum to obtain 1.80 g of a copolymer of Comparative Monomer C1 and Monomer B102 (having a molar ratio of a structural unit derived from Comparative Monomer C1:a structural unit derived from Monomer B102=90:10). The copolymer thus obtained is hereby referred to as Hole Comparative Transport Material (1-1). The weight average molecular weight (Mw) of Comparative Hole-transporting material (1-1) was measured to be 25,000 Daltons.

Device Example 1: Manufacture of Organic Light-Emitting Device (1-1)

Based on the following method, an organic light-emitting device represented by FIG. 1 was manufactured.

Poly(3,4-ethylenedioxythiophene/poly(4-styrenesulfonate) (PEDOT/PSS) (available from Sigma-Aldrich) was spin-coated on an ITO glass substrate having a stripe-type ITO (thickness of 150 nanometers (nm)) thereon to form a hole injection layer having a thickness of 30 nm after drying.

Then, Hole-transporting material (1-1) (1 percent by weight (weight %), in a xylene solution) was spin-coated on the hole injection layer under a nitrogen atmosphere and heat-treated on a hot plate of 230° C. for 1 hour to form a hole transport layer having a thickness of about 30 nm.

Next, a host, which is a mixture of 1,3-bis(N-carbazolyl) benzene (hereinafter, referred to as "mCP") and 4,4'-bis (carbazole-9-yl)biphenyl (hereinafter, referred to as "CBP") at a weight ratio of and a dopant, which is tris(2-(3-p-xylyl) phenyl)pyridine iridium (III) (hereinafter, referred to as "TEG"), were co-deposited in a vacuum deposition apparatus to form an emission layer having a thickness of 30 nm (the amount of the dopant is 10 weight %, based on the amount of the host).

Thereafter, the substrate having the emission layer thereon was mounted on a vacuum deposition apparatus, and Liq and KLET-03 were co-deposited on the emission layer to form an electron transport layer having a thickness of 50 nm.

An electron injection material (LiF) was deposited on the electron transport layer to form an electron injection layer having a thickness of 1 nm.

Subsequently, aluminum was deposited on the electron injection layer to form a cathode having a thickness of 100 nm, thereby completing the manufacture of an organic light-emitting device (1-1).

Device Example 2: Manufacture of Organic Light-Emitting Device (1-2)

An organic light-emitting device (1-2) was manufactured in the same manner as in Device Example 1, except that Hole-transporting material (1-2) synthesized in Example 2 was used instead of Hole-transporting material (1-1) in the formation of a hole transport layer.

Device Example 3: Manufacture of Organic Light-Emitting Device (1-3)

An organic light-emitting device (1-3) was manufactured in the same manner as in Device Example 1, except that Hole-transporting material (1-3) synthesized in Example 3 was used instead of Hole-transporting material (1-1) in the formation of a hole transport layer.

Device Example 4: Manufacture of Organic Light-Emitting Device (1-4)

An organic light-emitting device (1-4) was manufactured in the same manner as in Device Example 1, except that Hole-transporting material (1-4) synthesized in Example 4 was used instead of Hole-transporting material (1-1) in the formation of a hole transport layer.

Device Comparative Example 1: Manufacture of Comparative Organic Light-Emitting Device (1-1)

A comparative organic light-emitting device (1-1) was manufactured in the same manner as in Device Example 1, except that Comparative Hole-transporting material (1-1) synthesized in Comparative Example 1 was used instead of Hole-transporting material (1-1) in the formation of a hole transport layer.

Evaluation Example 1: Evaluation of Organic Light-Emitting Device

The efficiency and lifespan of organic light-emitting devices of Device Example 1 and Device Comparative Example 1 were evaluated, based on the following method. The evaluation results are shown in Table 1. In Table 1, the efficiency is a relative value, provided that the efficiency of the organic light-emitting device manufactured in Device Comparative Example 1 is hereby set as 100. In Table 1, the lifespan is a relative value, provided that the lifespan of the organic light-emitting device manufactured in Device Comparative Example 1 is hereby set as 100.

(1) Lifespan

When applying a voltage to an organic light-emitting device using a direct current constant-voltage power supply (for example, a source meter, available from KEYENCE Co.), at a certain voltage, a current starts flowing, causing the organic light-emitting device to emit light. The emission was detected by using a spectral luminance meter (for example, SR-3 available from Topcon Co.). The applied current to the organic light-emitting device was gradually increased, and as the luminance reached 1,000 candelas per square meter ($cd/m^2$), the applied current was set to be constant and then maintained. The luminance value measured by the spectral luminance meter fluctuated, and thus, the time required for the initial luminance of the organic light-emitting device to reduce by 80% was used as the device lifespan.

(2) Efficiency

When applying a voltage to an organic light-emitting device using a direct current constant-voltage power supply (for example, a source meter, available from KEYENCE Co.), at a certain voltage, a current starts flowing, causing the organic light-emitting device to emit light. The emission was detected by using a spectral luminance meter (for example, SR-3 available from Topcon Co.). The applied current to the organic light-emitting device was gradually increased, and as the luminance reached 1,000 cd/m$^2$, the applied voltage was set to be constant. The voltage and current values were recorded. The voltage value indicates a driving voltage. Accordingly, the current density and luminance of the organic light-emitting device were obtained, and the current efficiency were calculated using the current density and luminance.

TABLE 1

|  | Efficiency (relative value) | Lifespan (relative value) |
| --- | --- | --- |
| Device Example 1 | 124 | 1600 |
| Device Example 2 | 130 | 3700 |
| Device Example 3 | 122 | 8000 |
| Device Example 4 | 133 | 10000 |
| Device Comparative Example 1 | 100 | 100 |

Referring to the result of Table 1, it was found that the organic light-emitting devices manufactured in Device Examples 1 to 4 had excellent lifespan, as compared with the organic light-emitting device manufactured in Device Comparative Example 1. This may result from that the hole-transporting materials according to an embodiment used in the hole transport layer may have high charge resistance.

Device Example 5: Manufacture of Organic Light-Emitting Device (1-5)

Based on the following method, an organic light-emitting device represented by FIG. 1 was manufactured.

Poly(3,4-ethylenedioxythiophene/poly(4-styrenesulfonate) (PEDOT/PSS) (available from Sigma-Aldrich) was spin-coated on an ITO glass substrate having a stripe-type ITO (thickness of 150 nanometers (nm)) thereon to form a hole injection layer having a thickness of 30 nm after drying.

Then, Hole-transporting material (1-2) (1 weight %, in a xylene solution) was spin-coated on the hole injection layer under a nitrogen atmosphere and heat-treated on a hot plate of 230° C. for 1 hour to form a hole transport layer having a thickness of about 30 nm.

A THF solution (1 weight % solution) including mCP, CBP, and TEG at a weight ratio of 7:3:1 was prepared, and the THF solution was spin-coated on the hole transport layer, followed by heating at a temperature of 100° C. for 30 minutes, to form an emission layer having a thickness of 30 nm (thickness after drying).

Thereafter, the substrate having the emission layer thereon was mounted on a vacuum deposition apparatus. Liq and KLET-03 were co-deposited on the emission layer to form an electron transport layer having a thickness of 50 nm.

An electron injection material (LiF) was deposited on the electron transport layer to form an electron injection layer having a thickness of 1 nm.

Subsequently, aluminum was deposited on the electron injection layer to form a cathode having a thickness of 100 nm, thereby completing the manufacture of an organic light-emitting device (1-5).

Device Comparative Example 2: Manufacture of Comparative Organic Light-Emitting Device (1-2)

A comparative organic light-emitting device (1-2) was manufactured in the same manner as in Device Example 5, except that Comparative Hole-transporting material (1-1) synthesized in Comparative Example 1 was used instead of Hole-transporting material (1-2) in the formation of a hole transport layer.

Evaluation Example 2: Evaluation of Organic Light-Emitting Device

The efficiency and lifespan of organic light-emitting devices of Device Example 5 and Device Comparative Example 2 were evaluated, based on the method described herein with regard to Evaluation Example 1. The evaluation results are shown in Table 2. In Table 2, the efficiency is a relative value, provided that the efficiency of the organic light-emitting device manufactured in Device Comparative Example 2 is hereby set as 100. In Table 2, the lifespan is a relative value, provided that the lifespan of the organic light-emitting device manufactured in Device Comparative Example 2 is hereby set as 100.

Figure 3B:
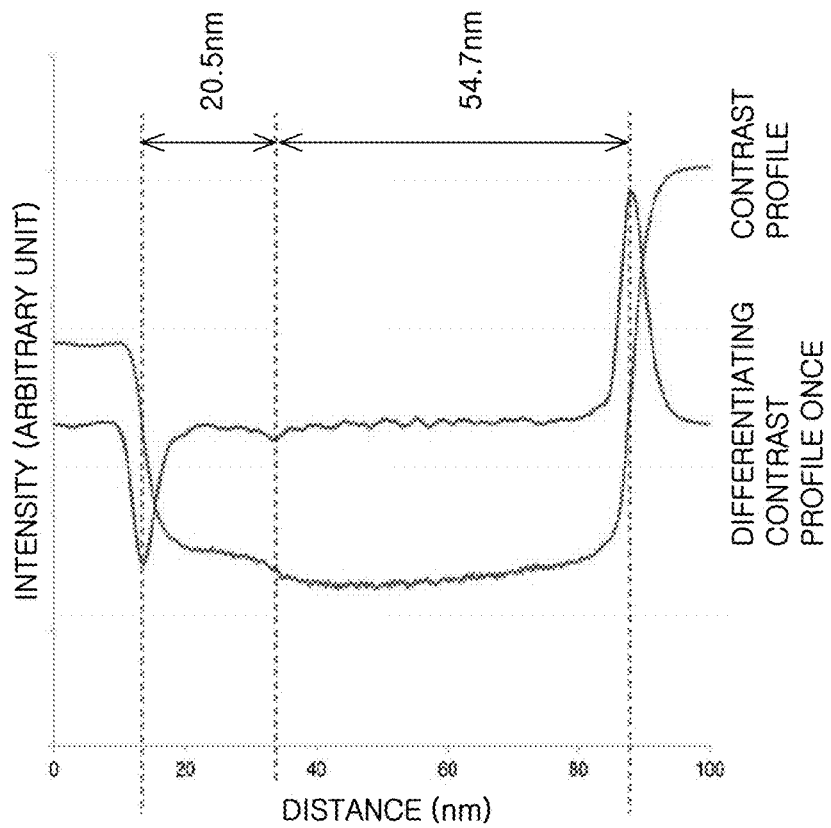
FIG. 3B is a graph of intensity (arbitrary units) versus distance (nanometers, nm) illustrating a graph of a contrast of the image of FIG. 3A with respect to a distance (a thickness of layer).
Figure 3A:
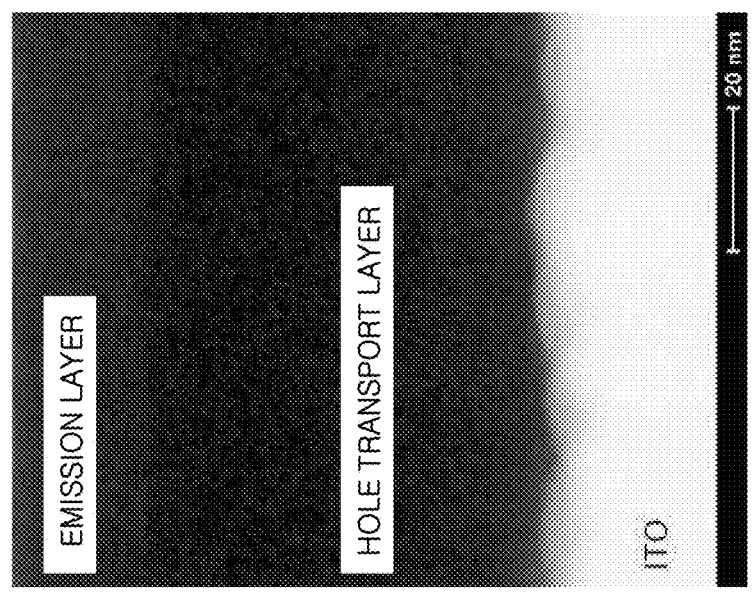
FIG. 3A is a TEM cross-sectional image of a comparative organic light-emitting device (1-2) manufactured according to Device Comparative Example 2.

Transmission electron microscopy (TEM) images of the organic light-emitting devices manufactured in Device Example 5 and Device Comparative Example 2 are each shown in FIGS. 2A and 3A, respectively. FIGS. 2B and 3B are graphs of contrast of an image observed in FIGS. 2A and 3A in a distance (the thickness of a layer). The point where the contrast drastically changes in FIGS. 2B and 3B (the point where the absolute value of the differential value of the contrast graph is high) may be the interface of each layer.

TABLE 2

|  | Efficiency (relative value) | Lifespan (relative value) | Stacking condition |
| --- | --- | --- | --- |
| Device Example 5 | 130 | 2300 | Moderate |
| Device Comparative Example 2 | 100 | 100 | Poor |

Referring to the results of Table 2, it was found that the organic light-emitting device manufactured in Device Example 5 had improved efficiency and lifespan, as compared with the organic light-emitting device manufactured in Device Comparative Example 2.

Furthermore, from the results of FIGS. 2A, 2B, 3A, and 3B, it was found that the stacking condition of the organic light-emitting device manufactured in Device Example 5 were moderate, as compared with the organic light-emitting device manufactured in Device Comparative Example 2. In detail, it was found that the organic light-emitting device manufactured in Device Comparative Example 2 (the thickness of the emission layer was 20.0 nm and the thickness of the hole transport layer was 54.7 nm) had a thicker hole transport layer and a thinner emission layer than the organic light-emitting device manufactured in Device Example 5 (the thickness of the emission layer was 26.5 nm and the thickness of the hole transport layer was 26.7 nm).

Device Example 6: Manufacture of Organic Light-Emitting Device (2-1)

An organic light-emitting device (2-1) was manufactured in the same manner as in Device Example 1, except that Hole-transporting material (2-2) synthesized in Example 6 was used instead of Hole-transporting material (1-1) in the formation of a hole transport layer.

Evaluation Example 3: Evaluation of Organic Light-Emitting Device

The driving voltage and efficiency of organic light-emitting devices of Device Example 6 and Device Comparative Example 1 were evaluated, based on the method described herein with regard to Evaluation Example 1. The evaluation results are shown in Table 3. In Table 3, the driving voltage is a relative value, provided that the driving voltage of the organic light-emitting device manufactured in Device Comparative Example 1 is hereby set as 100. In Table 3, the efficiency is a relative value, provided that the efficiency of the organic light-emitting device manufactured in Device Comparative Example 1 is hereby set as 100.

The higher the current efficiency is, the higher the emission energy conversion efficiency with regard to current is. In addition, from the viewpoint of generation of heat and reducing power consumption, a small driving voltage and a high current efficiency is desirable.

TABLE 3

| | Driving voltage (relative value) | Current efficiency (relative value) |
|---|---|---|
| Device Example 6 | 85 | 122 |
| Device Comparative Example 1 | 100 | 100 |

Referring to the results of Table 3, it was found that the organic light-emitting device manufactured in Device Example 6 had a small driving voltage and improved efficiency, as compared with the organic light-emitting device manufactured in Device Comparative Example 1. This may result from that the hole-transporting materials according to an embodiment used in the hole transport layer may have improved charge transport performance.

An organic light-emitting device including a charge-transporting material according to an embodiment may have a lower driving voltage, higher current efficiency, and higher durability.

It should be understood that exemplary embodiments described herein should be considered in a descriptive sense only and not for purposes of limitation. Descriptions of features or aspects within each exemplary embodiment should typically be considered as available for other similar features or aspects in other exemplary embodiments.

While one or more exemplary embodiments have been described with reference to the figures, it will be understood by those of ordinary skill in the art that various changes in form and details may be made therein without departing from the spirit and scope of the present inventive concept as defined by the following claims.

What is claimed is:
1. A charge-transporting material comprising:
a copolymer of Structural Unit (1) represented by Formula 1 and Structural Unit (2) represented by Formula 4,
wherein a molar ratio of the Structural Unit (1) to the Structural Unit (2) is in a range of about 99:1 to about 80:20; and
wherein the charge-transporting material has a weight average molecular weight of about 5,000 Daltons to 500,000 Daltons:

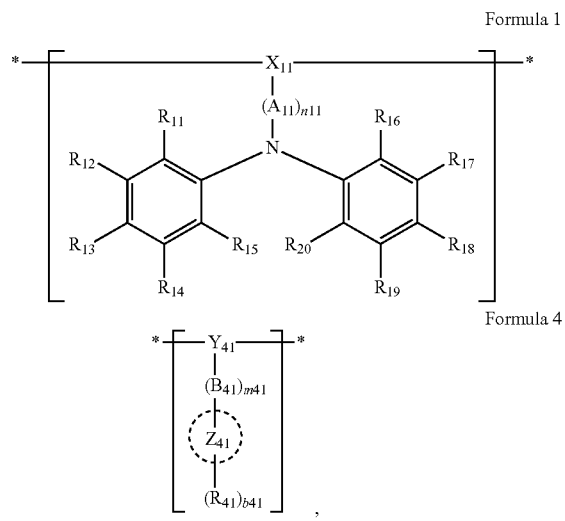

wherein, in Formulae 1 and 4,
$X_{11}$, and $Y_{41}$ are each independently a linking group comprised in a main chain of the charge-transporting material;
$A_{11}$, $B_{41}$ are each independently selected from a single bond; a carbazolylene group, a fluorenylene group, an arylene group, and a divalent heterocyclic group; and
a carbazolylene group, a fluorenylene group, an arylene group, and a divalent heterocyclic group, each substituted with at least one selected from a halogen atom, a cyano group, an alkyl group, an aryl group, an amino group, an alkoxy group, a carbazolyl group, a fluorenyl group, a heterocyclic group, and a silyl group;
n11, and m41 are each independently selected from 1 and 2;
$Z_{41}$ is selected from a carbazolyl group, a fluorenyl group, an aryl group, and a heterocyclic group;
$R_{11}$, $R_{12}$, $R_{14}$ to $R_{17}$, $R_{19}$, and $R_{20}$ are each independently selected from a hydrogen atom, a halogen atom, a cyano group, an alkyl group, an aryl group, an amino group, an alkoxy group, a carbazolyl group, a fluorenyl group, a heterocyclic group, and a silyl group;
i) $R_{13}$ and $R_{18}$ are each independently selected from a hydrogen atom, an aryl group, a tert-butyl group, a carbazolyl group, a fluorenyl group, a heterocyclic group, and an amino group represented by —N($Q_{13}$)($Q_{14}$)-, provided that at least one of $R_{13}$ and $R_{18}$ is selected from an aryl group, a tert-butyl group, a carbazolyl group, a fluorenyl group, a heterocyclic group, and an amino group represented by —N($Q_{13}$)($Q_{14}$)-, $Q_{14}$ is bound to $R_{12}$, $R_{14}$, $R_{17}$, or $R_{19}$ to form a ring; or
ii) $R_{13}$ and $R_{18}$ are each independently selected from a hydrogen atom, an aryl group, a tert-butyl group, a carbazolyl group, a fluorenyl group, a heterocyclic group, and an amino group represented by —N($Q_{15}$)($Q_{16}$), provided that at least one of $R_{13}$ and $R_{18}$ is selected from an aryl group, a tert-butyl group, a carbazolyl group, a fluorenyl group, a heterocyclic group, and an amino group represented by —N($Q_{15}$)($Q_{16}$), and $R_{15}$ and $R_{20}$ are bound to each other to form a carbazole ring including $R_{11}$ to $R_{20}$;

$R_{41}$ is selected from a hydrogen atom, a halogen atom, a cyano group, an alkyl group, an aryl group, an amino group, an alkoxy group, a carbazolyl group, a fluorenyl group, a heterocyclic group, and a silyl group; and an aryl group, substituted with at least one selected from cross-linking group, a halogen atom, a cyano group, an alkyl group, an aryl group, an amino group, an alkoxy group, a carbazolyl group, a fluorenyl group, a heterocyclic group, and a silyl group, provided that at least one of $R_{41}$ is selected from an aryl group substituted with a cross-linking group;

b41 is selected from 1, 2, and 3;

$Q_{13}$, $Q_{15}$, and $Q_{16}$ are each independently selected from an aryl group and a heterocyclic group; and an aryl group and a heterocyclic group, each substituted with at least one selected from a halogen atom, a cyano group, an alkyl group, an aryl group, an amino group, an alkoxy group, a carbazolyl group, a fluorenyl group, a heterocyclic group, and a silyl group; and $Q_{14}$ is selected from an arylene group and a divalent heterocyclic group; and an arylene group and a divalent heterocyclic group, each substituted with at least one selected from a halogen atom, a cyano group, an alkyl group, an aryl group, an amino group, an alkoxy group, a carbazolyl group, a fluorenyl group, a heterocyclic group, and a silyl group \* indicates a binding site to an atom comprised in the main chain of the charge-transporting material.

2. The charge-transporting material of claim 1, wherein $X_{11}$, and $Y_{41}$ are each independently a group represented by one of Formulae 6-1 to 6-10:

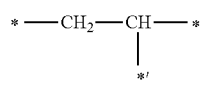

6-1

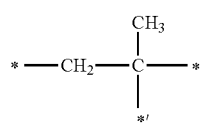

6-2

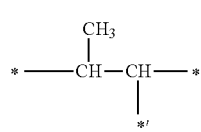

6-3

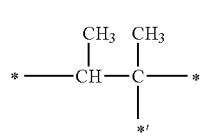

6-4

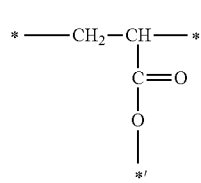

6-5

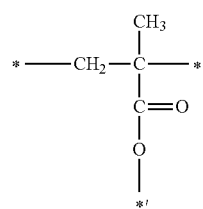

6-6

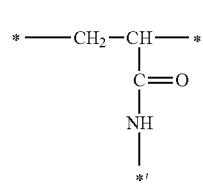

6-7

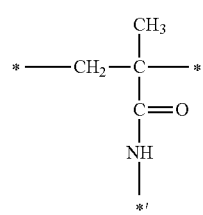

6-8

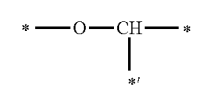

6-9

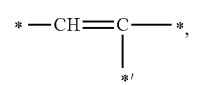

6-10 wherein, in Formulae 6-1 to 6-10,

\* indicates a binding site to an atom comprised in the main chain of the charge-transporting material; and \*' indicates a binding site to $A_{11}$, or $B_{41}$.

3. The charge-transporting material of claim 1, wherein $(A_{11})_{n11}$ and $(B_{41})_{m41}$ are each independently a group represented by one of Formulae 9-1 to 9-6

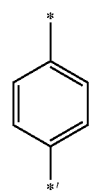

9-1

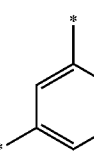

9-2

-continued 9-3
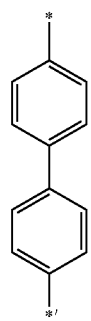

9-4
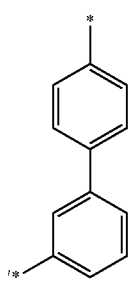

9-5
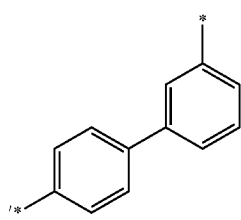

9-6
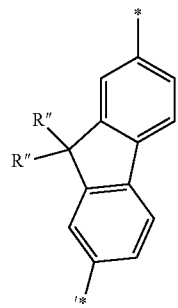

9-7
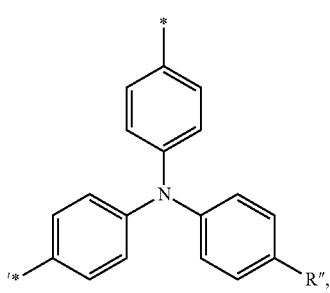

wherein, in Formulae 9-1 to 9-7,

R″ is an alkyl group; and

* and *′ each indicate a binding site to a neighboring atom.

4. The charge-transporting material of claim 1, wherein $Z_{41}$ is a fluorenyl group.

5. The charge-transporting material of claim 1, wherein $R_{11}$, $R_{12}$, $R_{14}$ to $R_{17}$, $R_{19}$, and $R_{20}$ are each independently selected from a hydrogen atom, alkyl group, an aryl group, and a heterocyclic group.

6. The charge-transporting material of claim 1, wherein $R_{41}$ is selected from a hydrogen atom and a phenyl group substituted with a cross-linking group, provided that at least one of $R_{41}$ is selected from a phenyl group substituted with a cross-linking group.

7. The charge-transporting material of claim 1, wherein at least one of $R_{41}$ is a group represented by one of Formulae 7-1 to 7-7, 7-9 and 7-10:

7-1
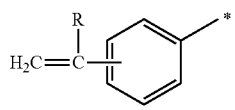

7-2
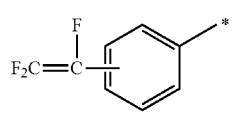

7-3
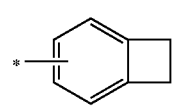

7-4
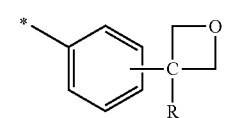

7-5
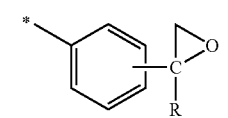

7-6
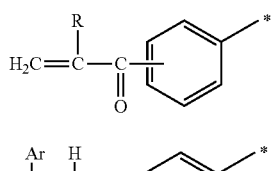

7-7
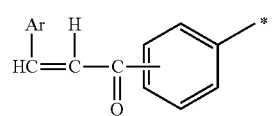

7-8
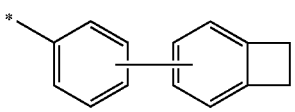

7-9
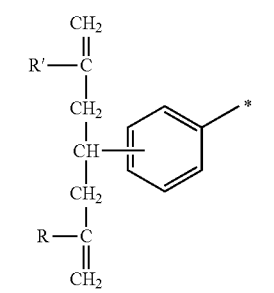

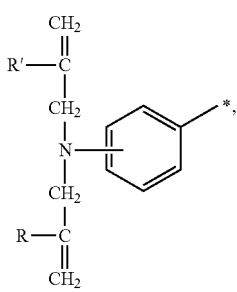

7-10 wherein, in Formulae 7-1 to 7-10,

R and R' are each independently selected from a hydrogen atom and an alkyl group;

Ar is selected from an aryl group and a heterocyclic group; and an aryl group and a heterocyclic group, each substituted with at least one selected from a halogen atom, a cyano group, an alkyl group, an aryl group, an amino group, an alkoxy group, a carbazolyl group, a fluorenyl group, a heterocyclic group, and a silyl group; and

* indicates a binding site to a neighboring atom.

8. The charge-transporting material of claim 1, wherein at least one of $R_{41}$ are each a group represented by Formula 8-3:

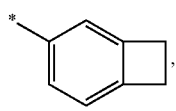

8-3 wherein, in Formula 8-3,

* indicates a binding site to a neighboring atom.

9. The charge-transporting material of claim 1, wherein the Structural Unit (2) is represented by Formula 4 is a structural unit represented by one of Formulae 4-1 and 4-2:

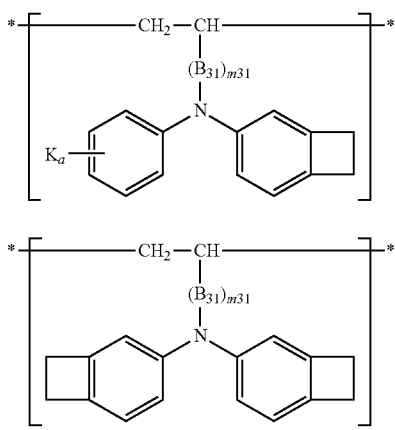

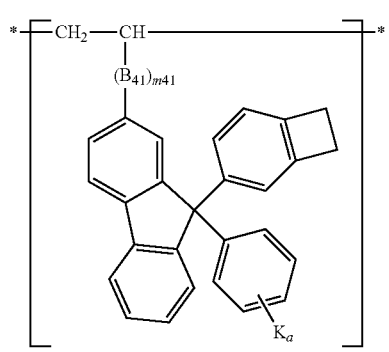

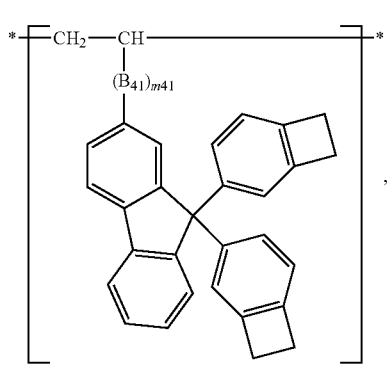

wherein, in Formulae 4-1, and 4-2, $B_{41}$ and m41 are the same as in Formula 4; and $K_a$ is selected from a hydrogen atom, a cross-linking group, a halogen atom, a cyano group, an alkyl group, an aryl group, an amino group, an alkoxy group, a carbazolyl group, a fluorenyl group, a heterocyclic group, and a silyl group

* indicates a binding site to an atom comprised in the main chain of the charge-transporting material.

10. The charge-transporting material of claim 1, wherein the Structural Unit (1) represented by Formula 1 is selected from Structures A101 to A121;

the Structural Unit (2) represented by one of Formula 4 is selected from Structures B107 and B1186:

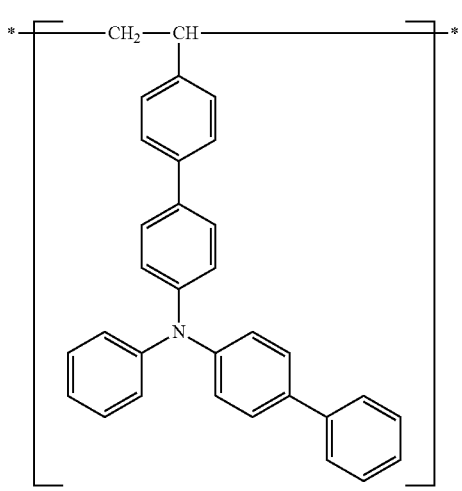

A101

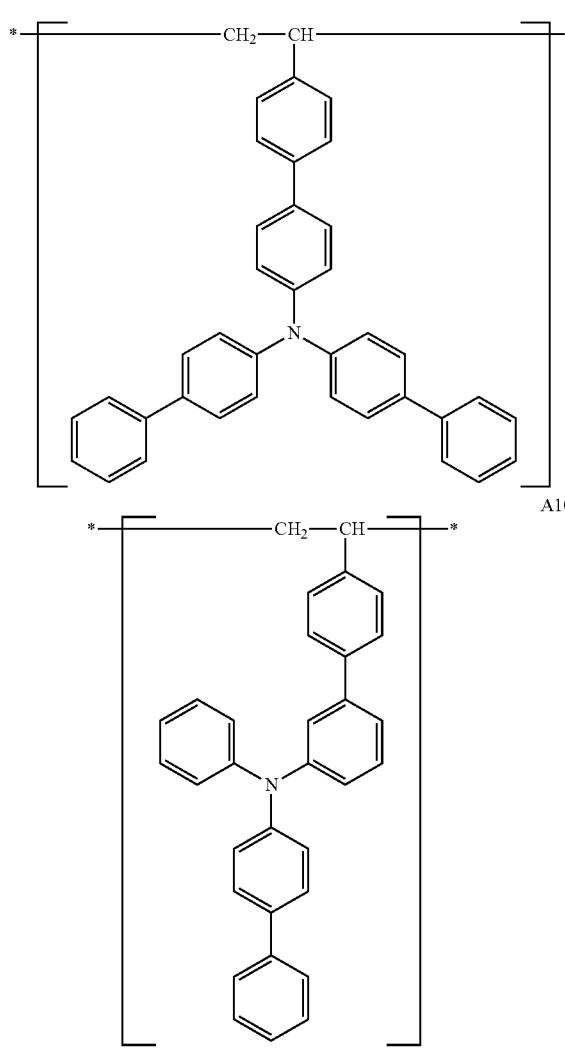
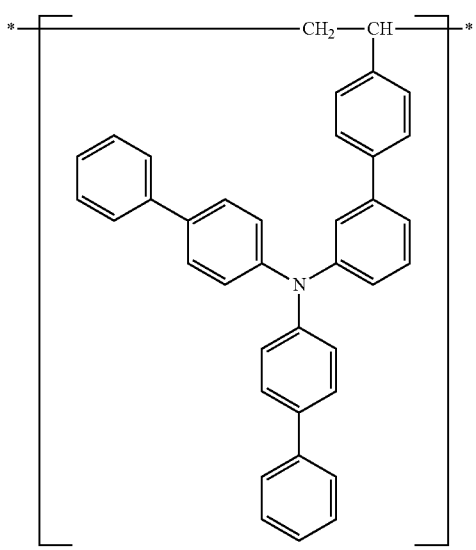
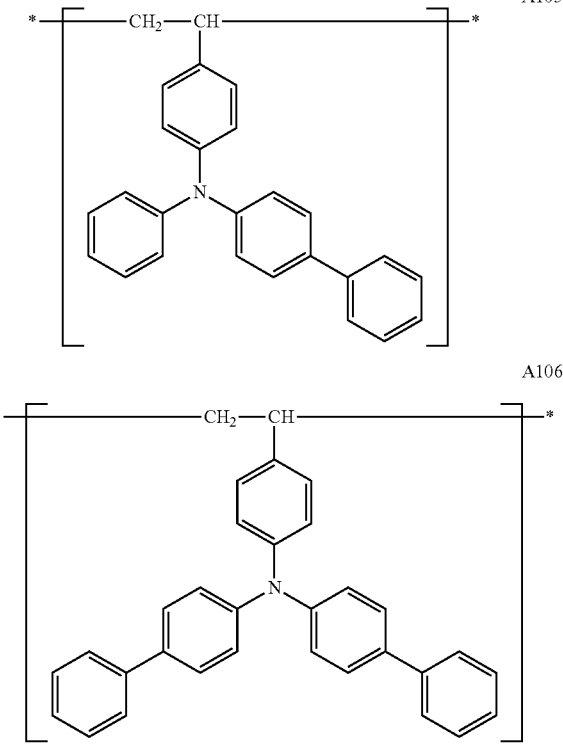
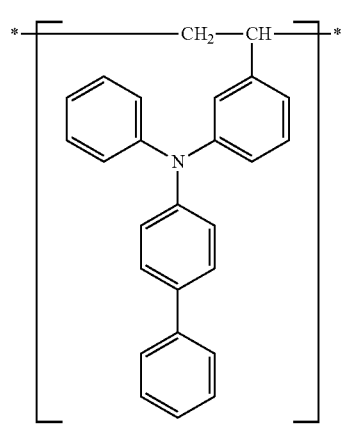
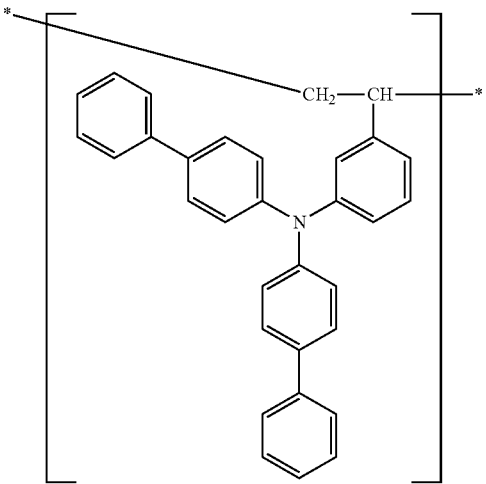

-continued
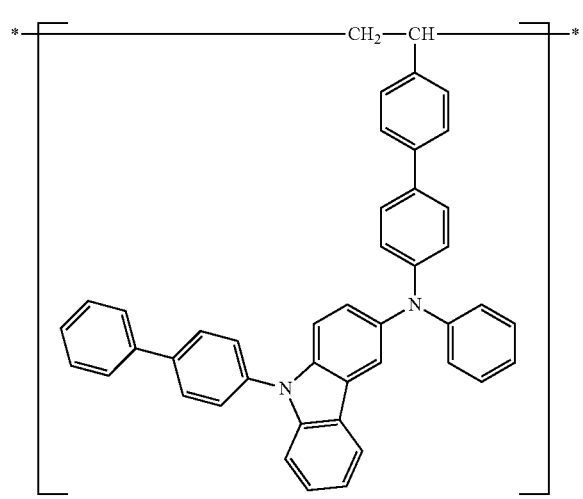
A109
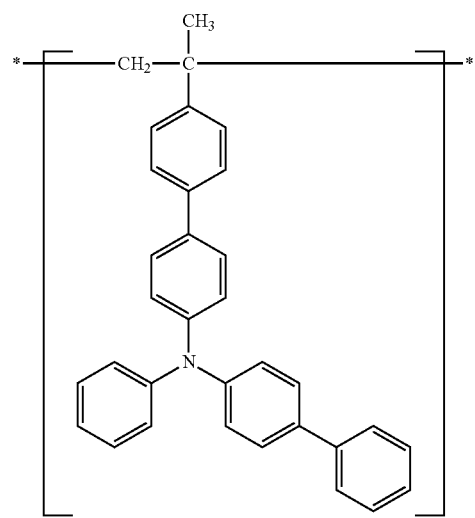
A110
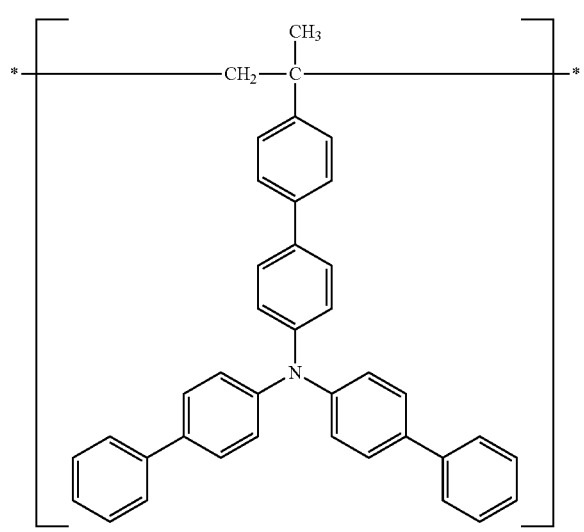
A111
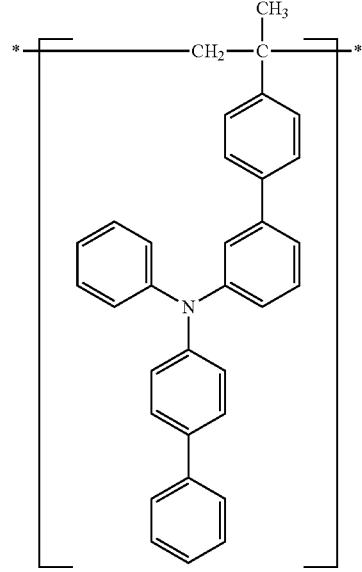
A112
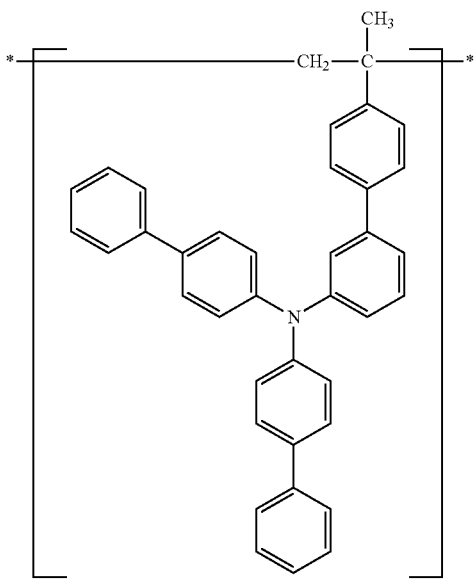
A113
A114

A115 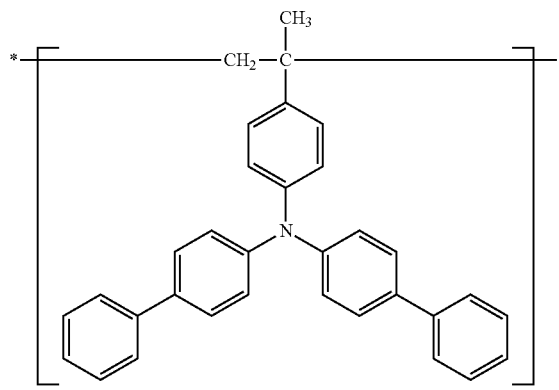
A118 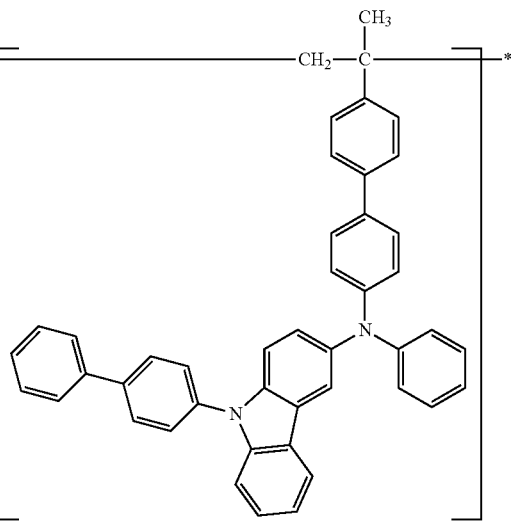
A116 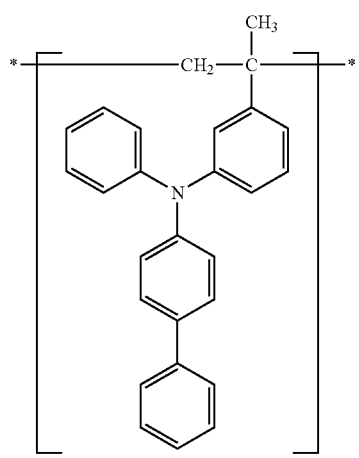
A119 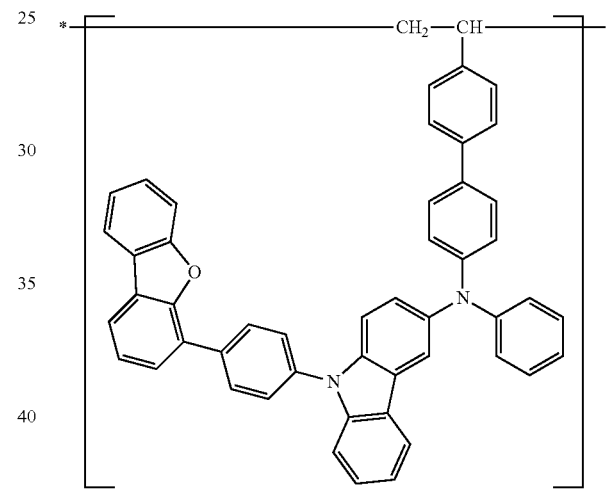
A117 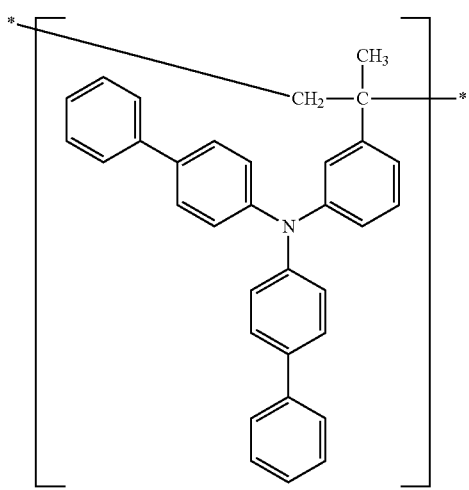
A120 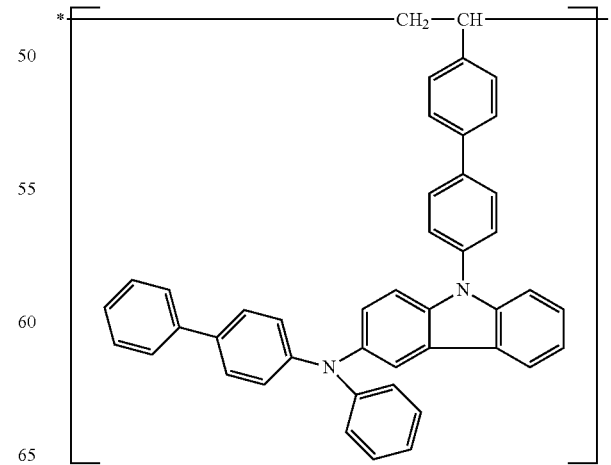

A121
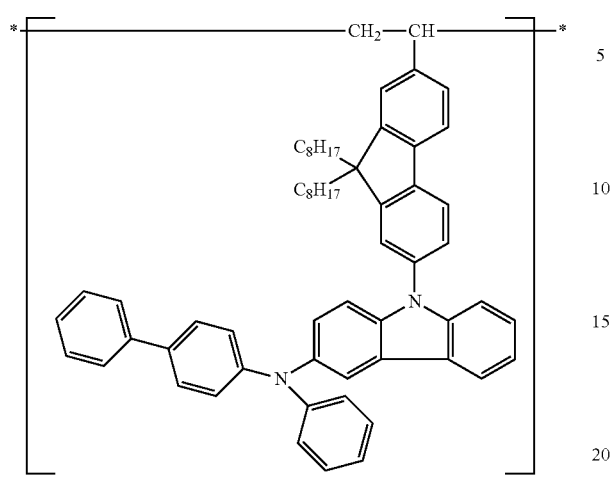
A201
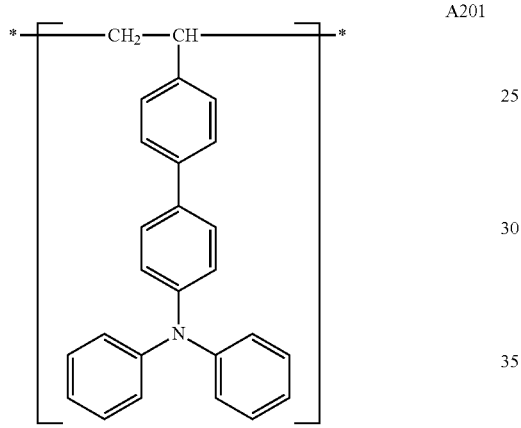
A202
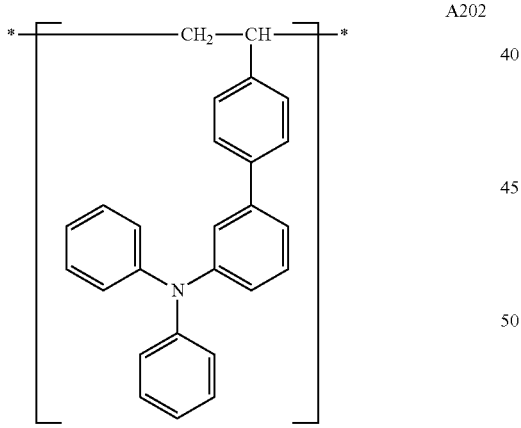
A203
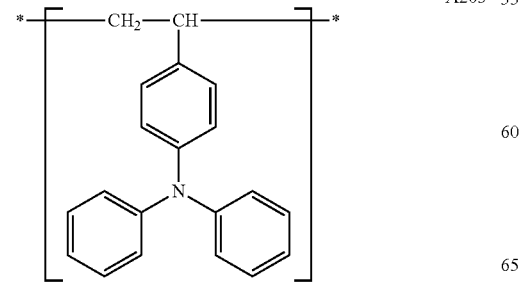
A204
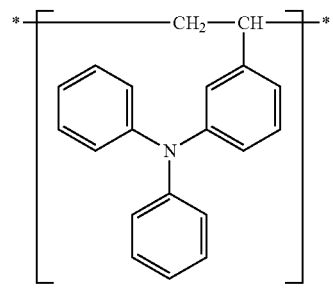
A205
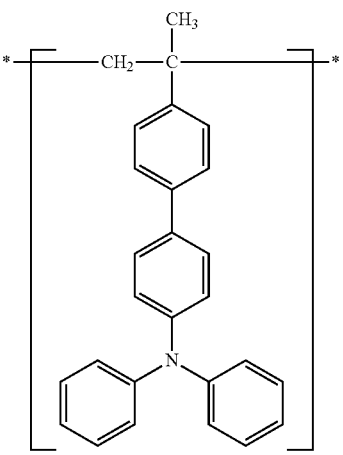
A206
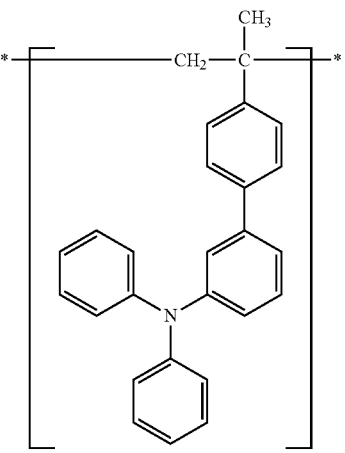
A207
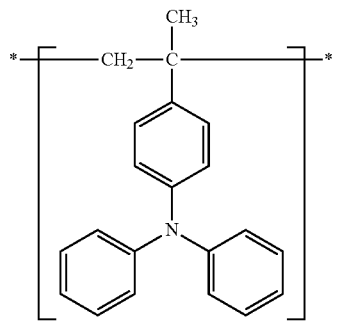

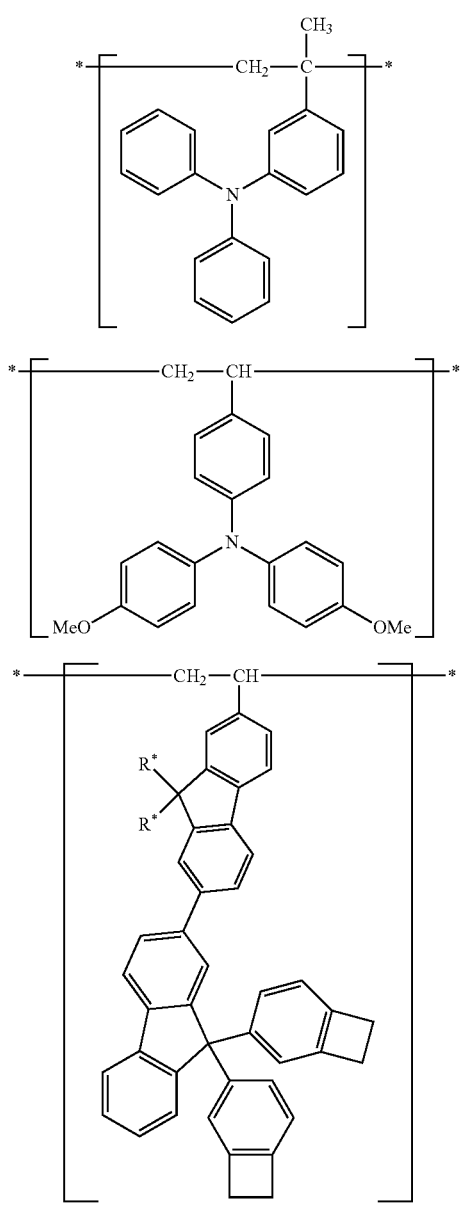

A208

A209

B107

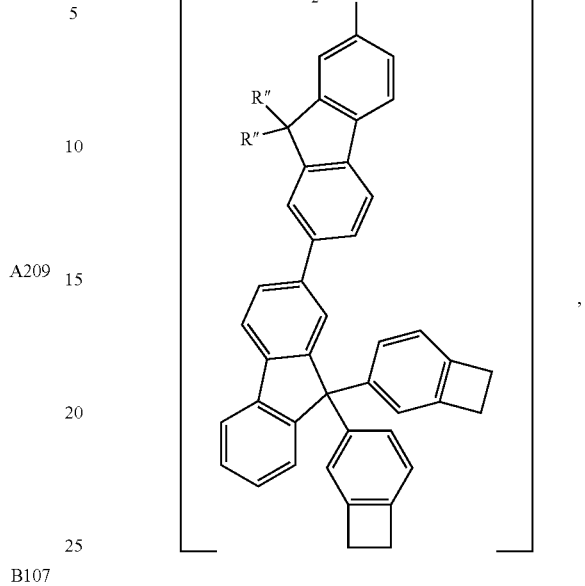

B116 wherein, in Structures B107 and B116,

R″ is an alkyl group; and

* indicates a binding site to an atom comprised in the main chain of the charge-transporting material.

11. An organic light-emitting device comprising:
a first electrode;
a second electrode; and
an organic layer disposed between the first electrode and the second electrode,
wherein the organic layer comprises the charge-transporting material of claim 1.

12. The organic light-emitting device of claim 11, wherein
the organic layer comprises at least one layer selected from a hole injection layer and a hole transport layer; and
the at least one selected from the hole injection layer and the hole transport layer comprises the charge transporting material.

* * * * *